United States Patent
Torii

(10) Patent No.: US 8,233,321 B2
(45) Date of Patent: Jul. 31, 2012

(54) SEMICONDUCTOR MEMORY DEVICE AND METHOD FOR DRIVING SEMICONDUCTOR MEMORY DEVICE

(75) Inventor: Satoshi Torii, Shinjuku-ku (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/197,264

(22) Filed: Aug. 3, 2011

(65) Prior Publication Data

US 2011/0286257 A1    Nov. 24, 2011

Related U.S. Application Data

(62) Division of application No. 12/434,789, filed on May 4, 2009, now Pat. No. 8,072,806.

(30) Foreign Application Priority Data

Jun. 30, 2008    (JP) .................................. 2008-170594

(51) Int. Cl.
- *G11C 11/34*    (2006.01)
- *G11C 16/04*    (2006.01)
- *G11C 5/06*    (2006.01)

(52) U.S. Cl. ................ 365/185.05; 365/63; 365/185.16; 365/185.17

(58) Field of Classification Search ............. 365/185.05, 365/185.16, 185.17
See application file for complete search history.

(56) References Cited

U.S. PATENT DOCUMENTS

| | | | |
|---|---|---|---|
| 5,850,091 | A | 12/1998 | Li et al. |
| 6,144,584 | A | 11/2000 | Kunori et al. |
| 6,480,422 | B1 | 11/2002 | Wong |
| 2007/0140009 | A1 | 6/2007 | Ito |

FOREIGN PATENT DOCUMENTS

| | | |
|---|---|---|
| JP | 62-060266 A | 3/1987 |
| JP | 05-198190 A | 8/1993 |
| JP | 09-213094 A | 8/1997 |
| JP | 11-330426 A | 11/1999 |

*Primary Examiner* — Ly D Pham
(74) *Attorney, Agent, or Firm* — Westerman, Hattori, Daniels & Adrian, LLP

(57) ABSTRACT

A semiconductor memory device includes a plurality of memory cell transistors arranged in a matrix; a plurality of word lines commonly coupling the control gates of the plural memory cell transistors present in a identical first direction; a plurality of source lines commonly coupling the sources of the plural memory cell transistors present in the identical first direction; a plurality of bit lines commonly coupling the drains of the plural memory cell transistors present in a identical second direction intersecting the first direction; a first transistor having a drain coupled to the source line; a second transistor having a drain coupled to a source of the first transistor, a gate coupled to the word line and a source grounded; and a control line commonly coupling the gates of the plural first transistors.

16 Claims, 46 Drawing Sheets

FIG. 9

| | WORD LINE | BIT LINE | CONTROL LINE | GND LINE | FIRST P-WELL | SECOND P-WELL |
|---|---|---|---|---|---|---|
| READ | 3V (0V) | 0.5V (0V) | CONSTANTLY 5V | 0V | 0V | 0V |
| WRITE | 9V (0V) | 5V (0V) | 5V | 0V | 0V | 0V |
| ERASE | -9V | FLOATING | 0V | 0V | 9V | 0V |

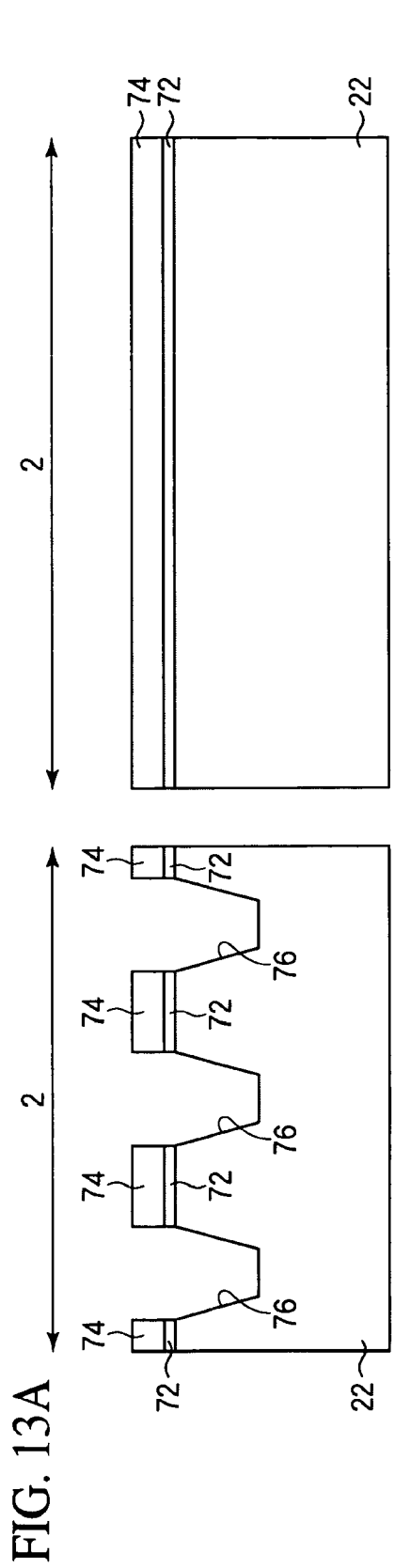
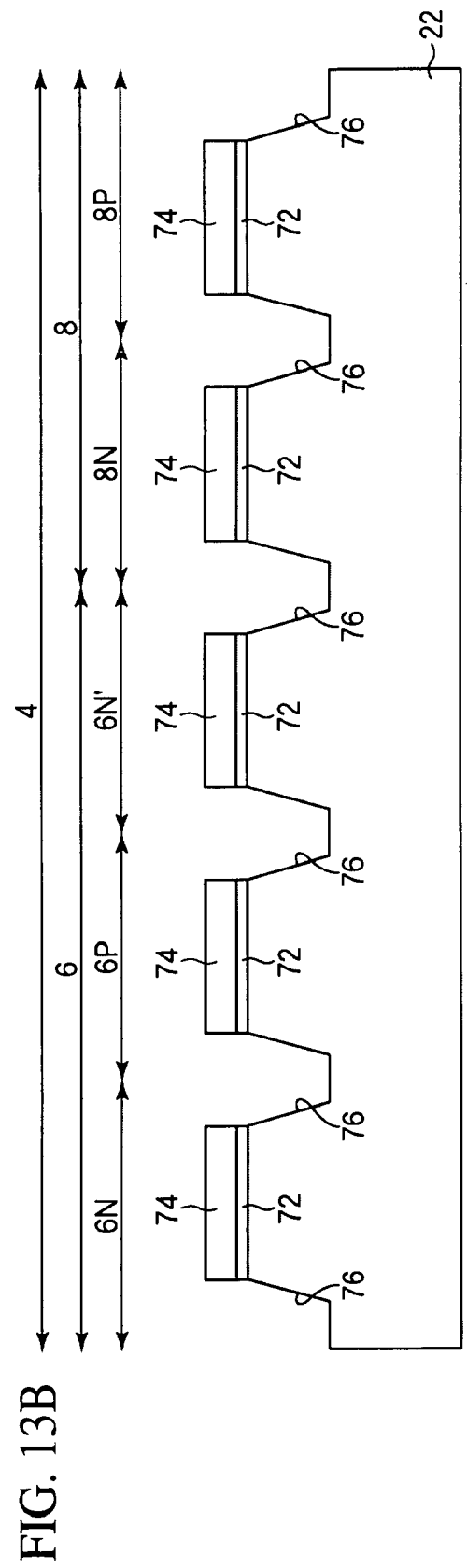
FIG. 13A
FIG. 13B

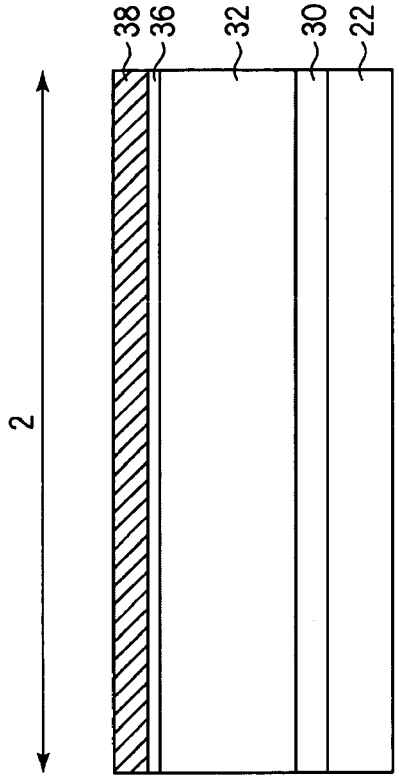
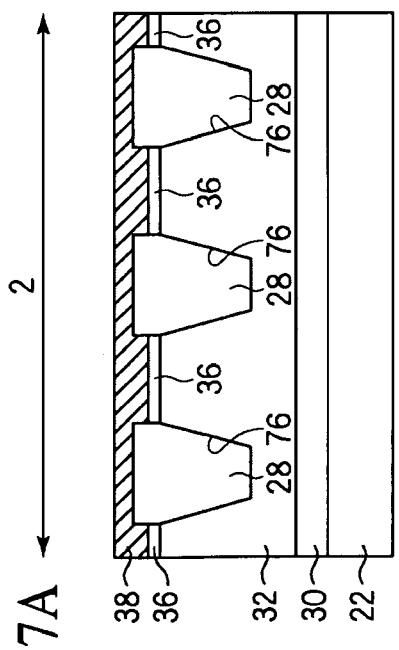
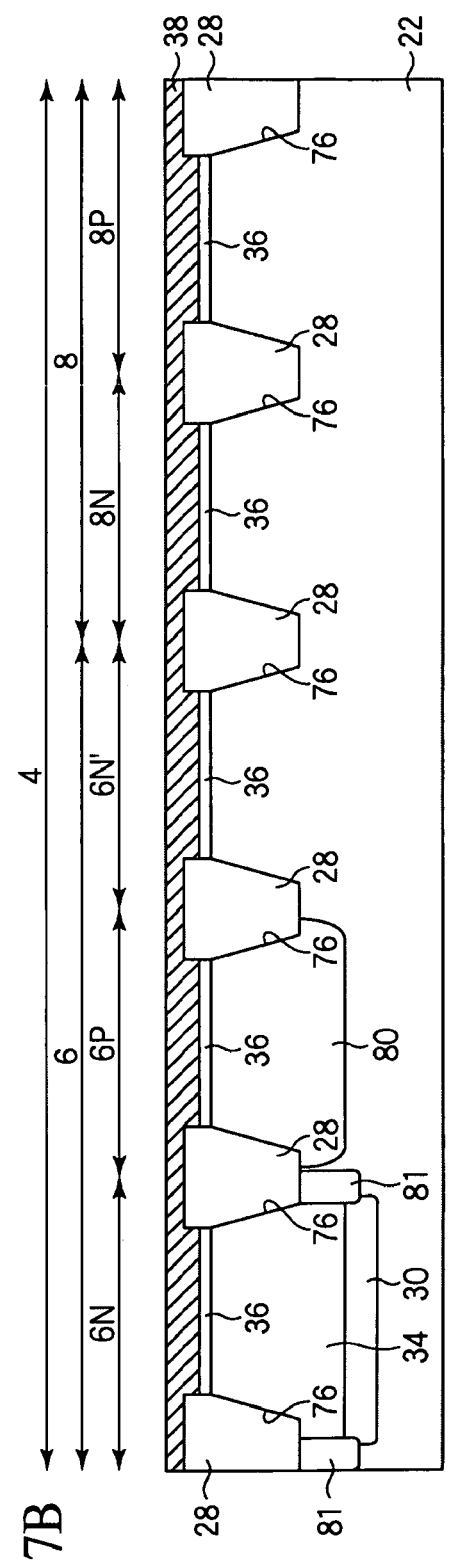
FIG. 17A
FIG. 17B

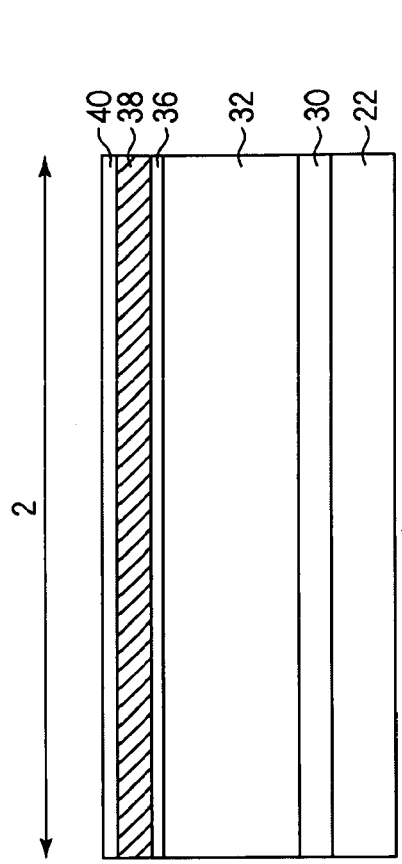
FIG. 18A
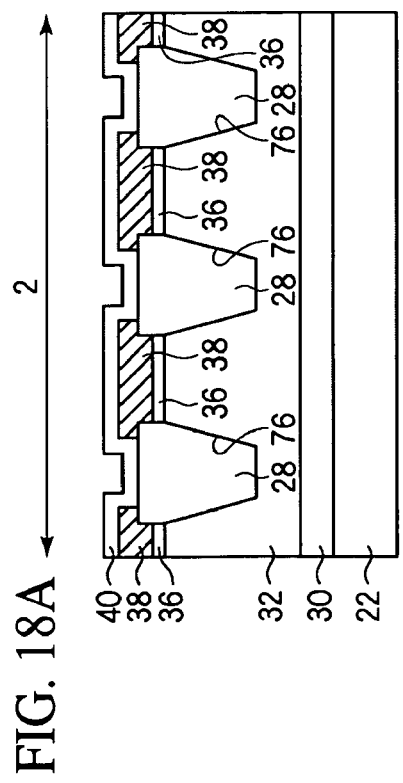
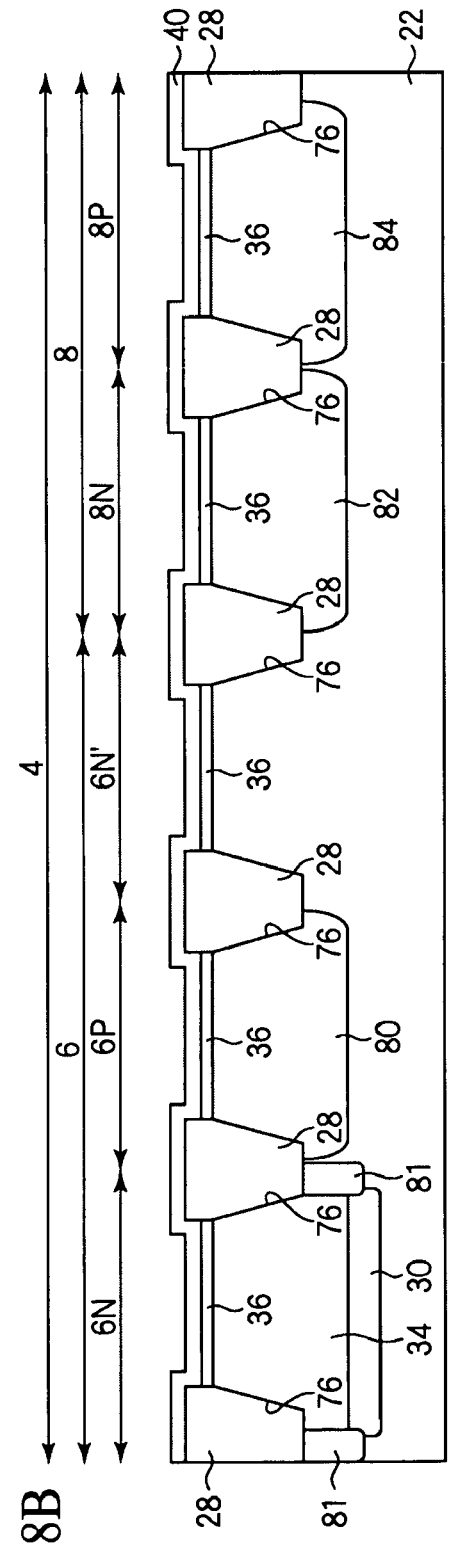
FIG. 18B

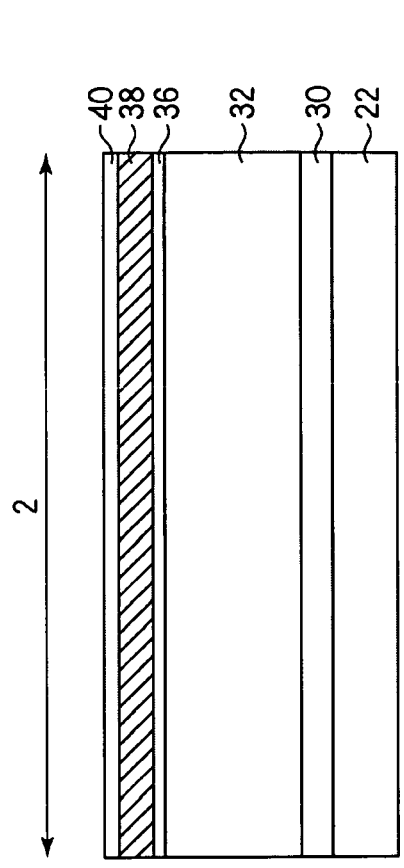
FIG. 19A
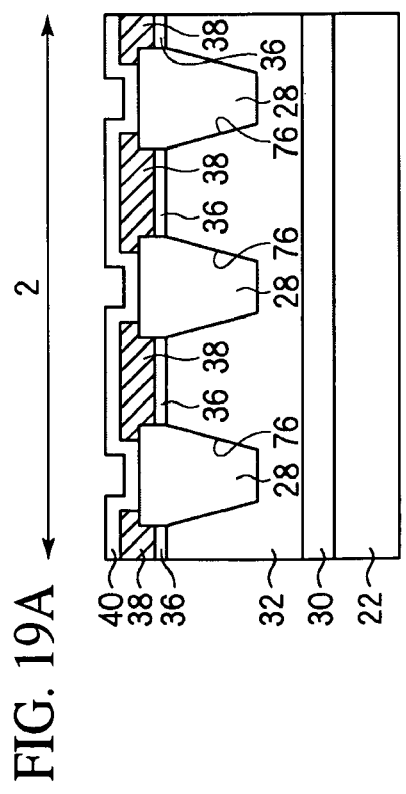
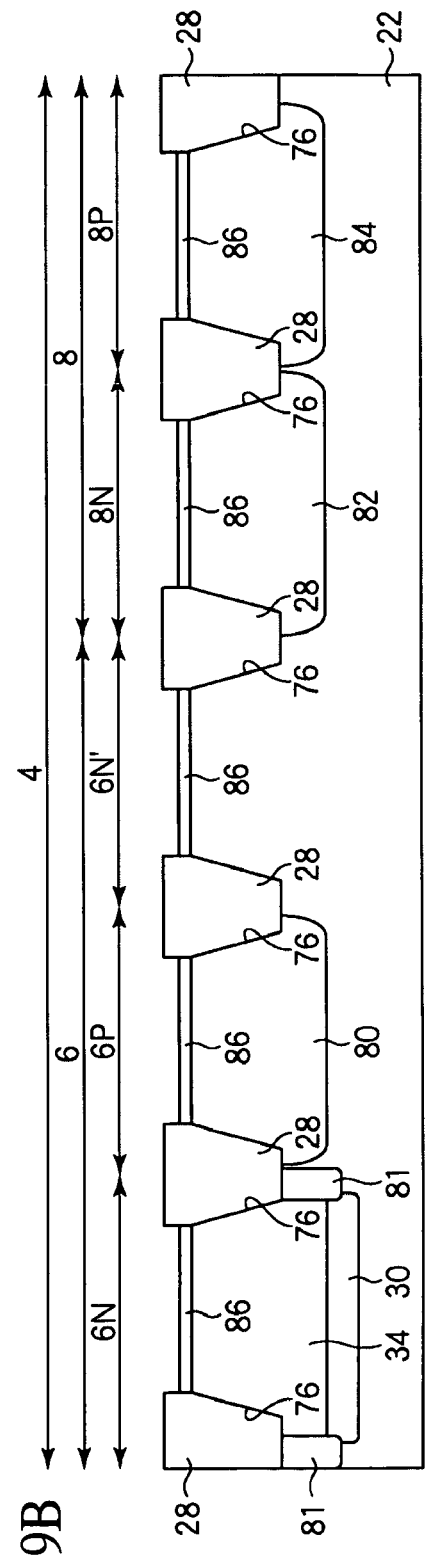
FIG. 19B

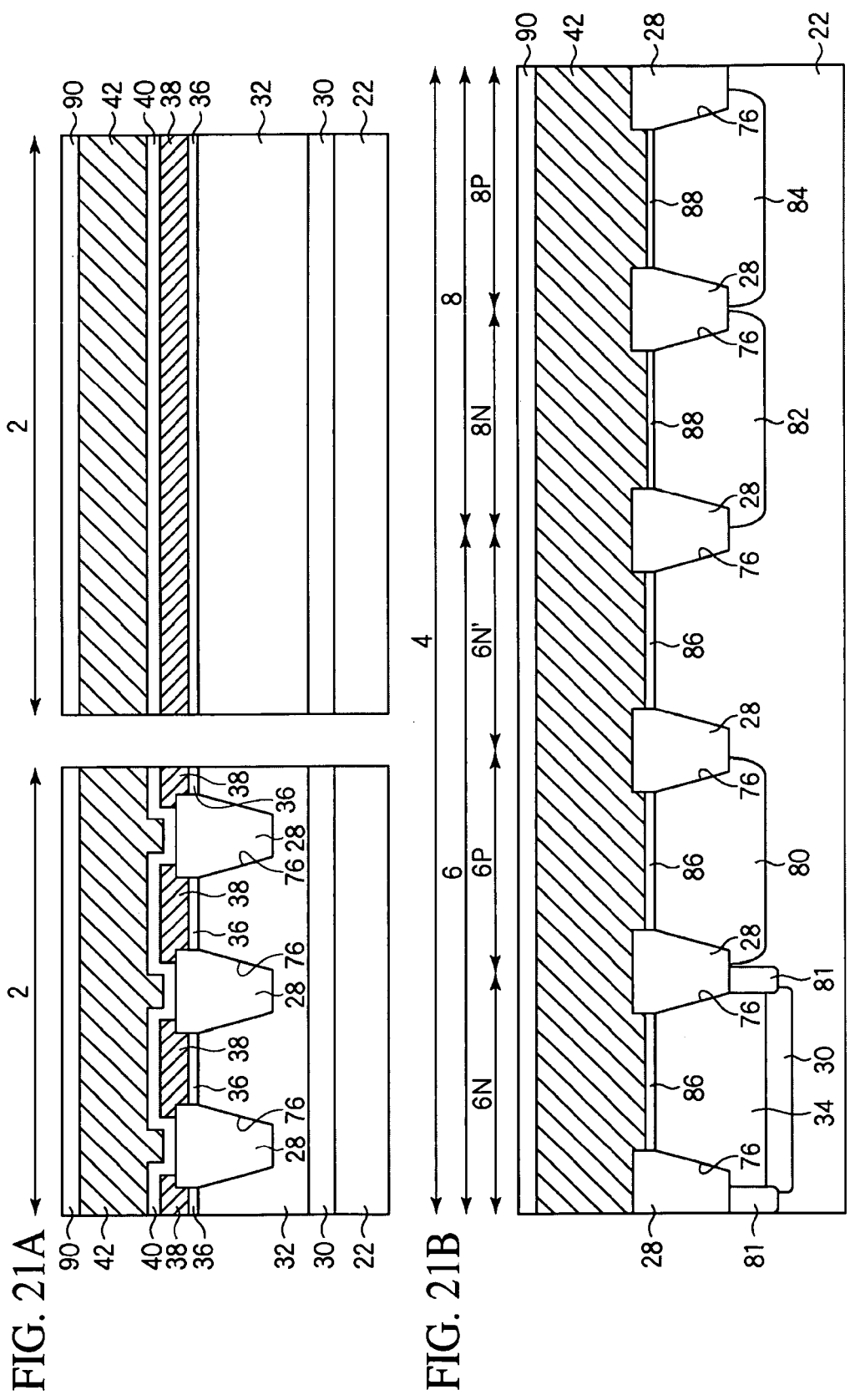

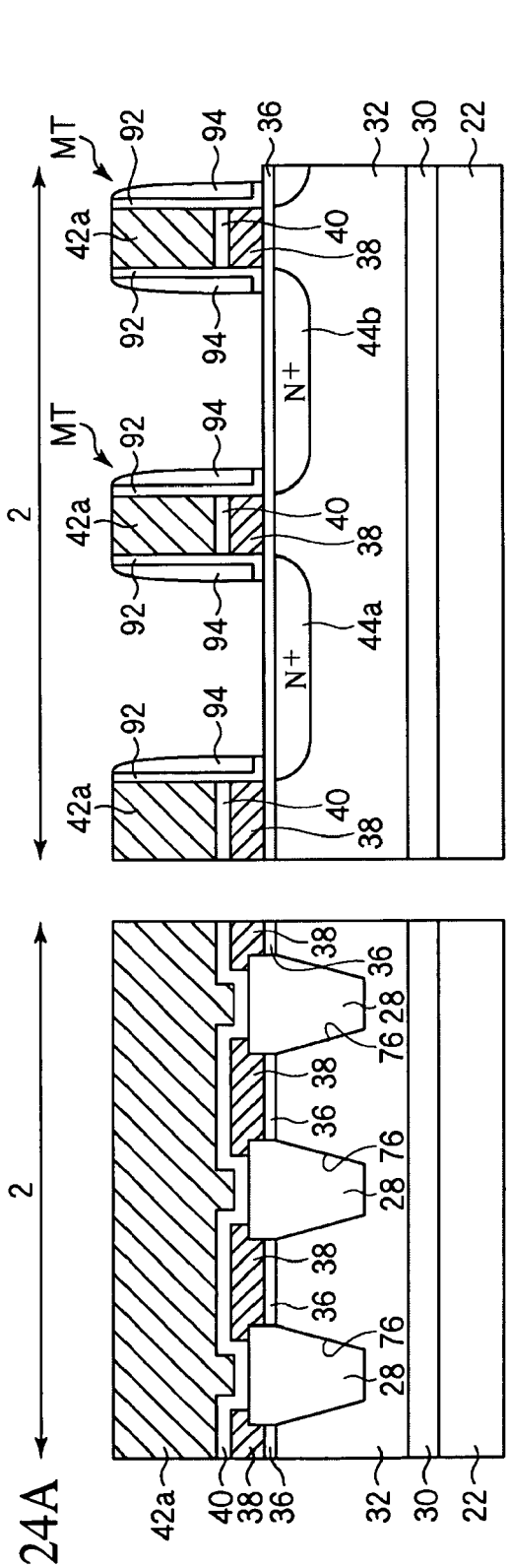
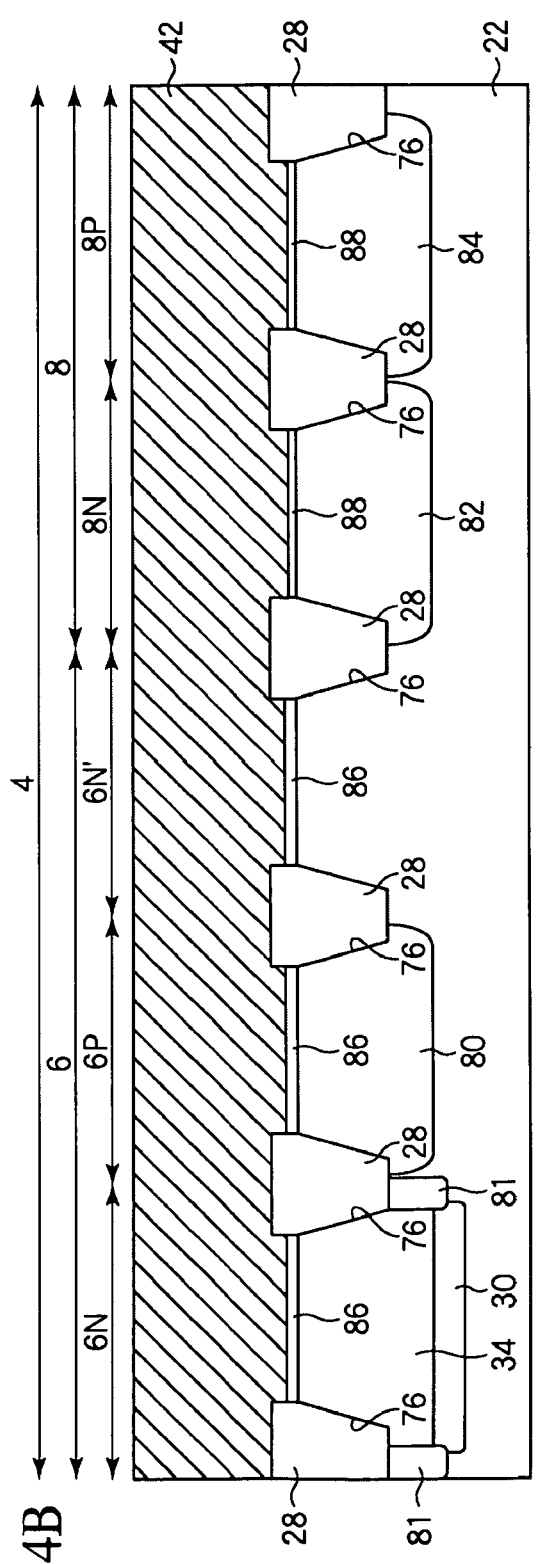
FIG. 24A
FIG. 24B

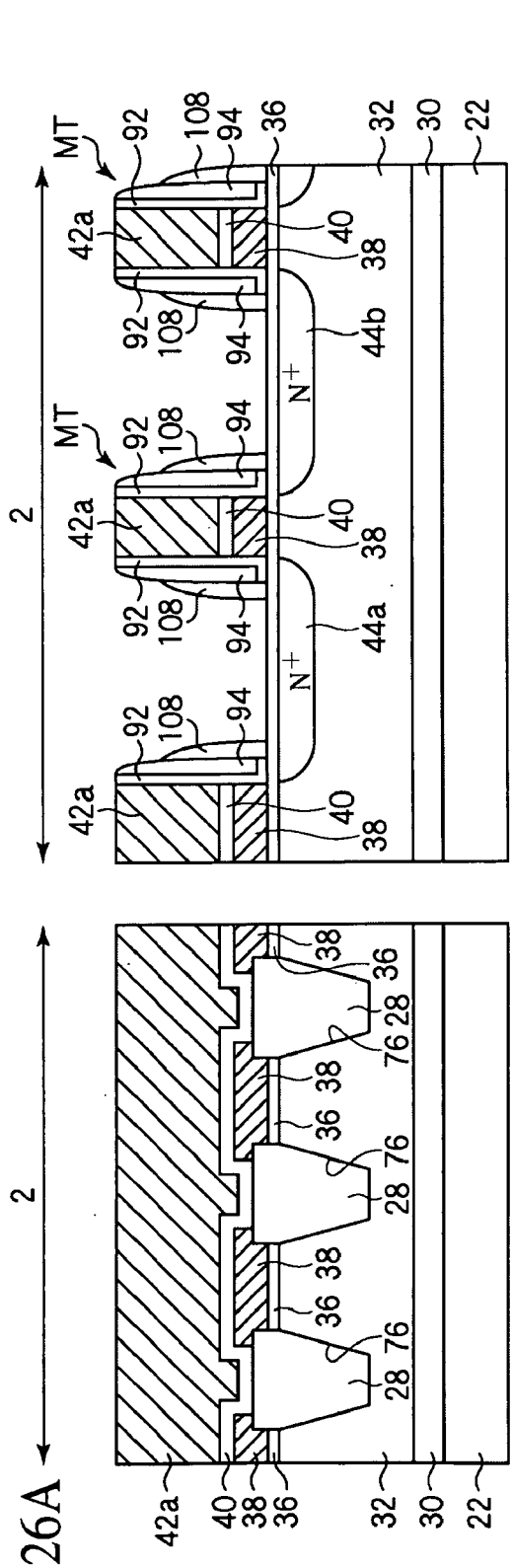
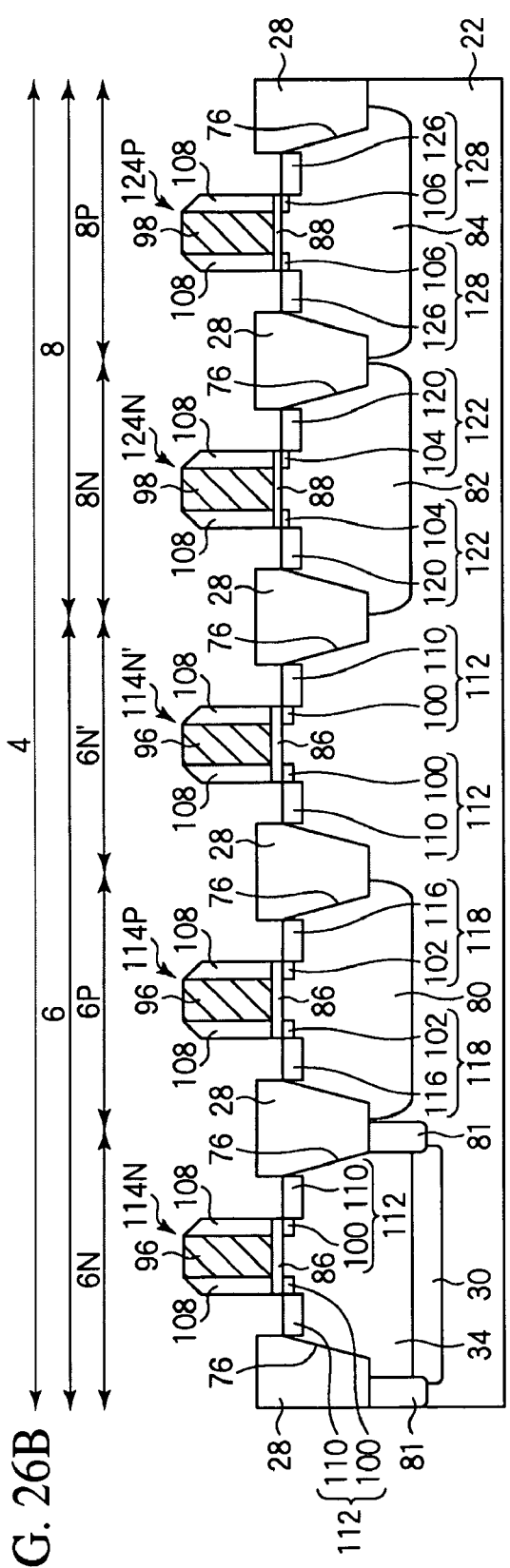
FIG. 26A
FIG. 26B

FIG. 34

|  | WORD LINE | BIT LINE | CONTROL LINE | GND LINE | FIRST P-WELL | SECOND P-WELL |
|---|---|---|---|---|---|---|
| READ | 3V (0V) | CONSTANTLY 0.5V | CONSTANTLY 5V | 0V | 0V | 0V |
| WRITE | 9V (0V) | 5V (0V) | 5V | 0V | 0V | 0V |
| ERASE | −9V | FLOATING | 0V | 0V | 9V | 0V |

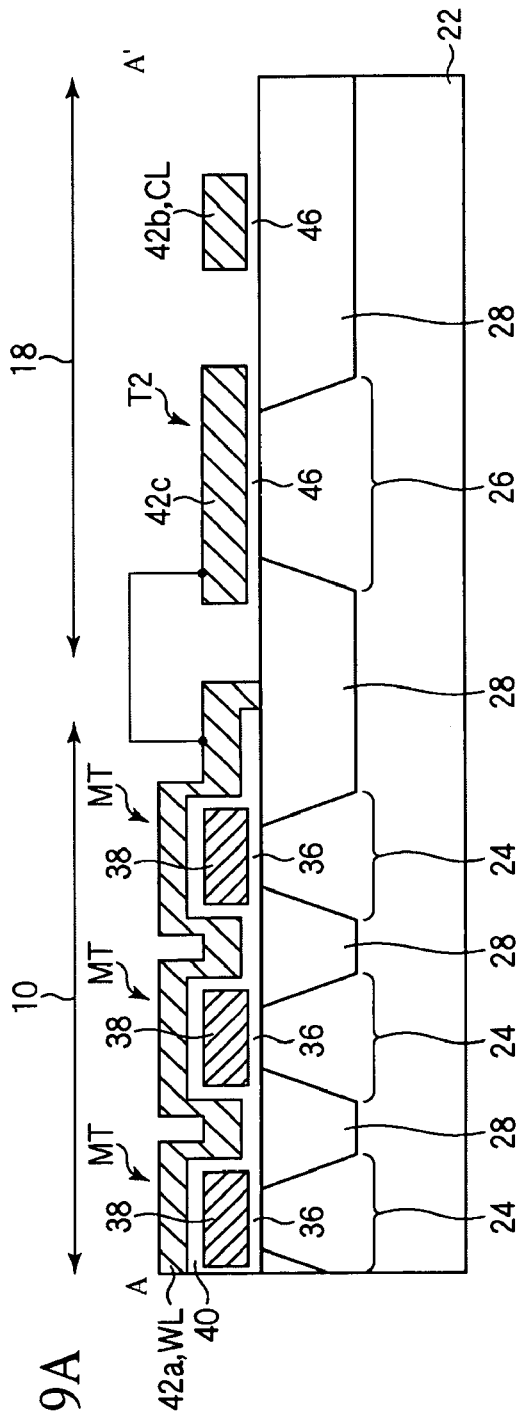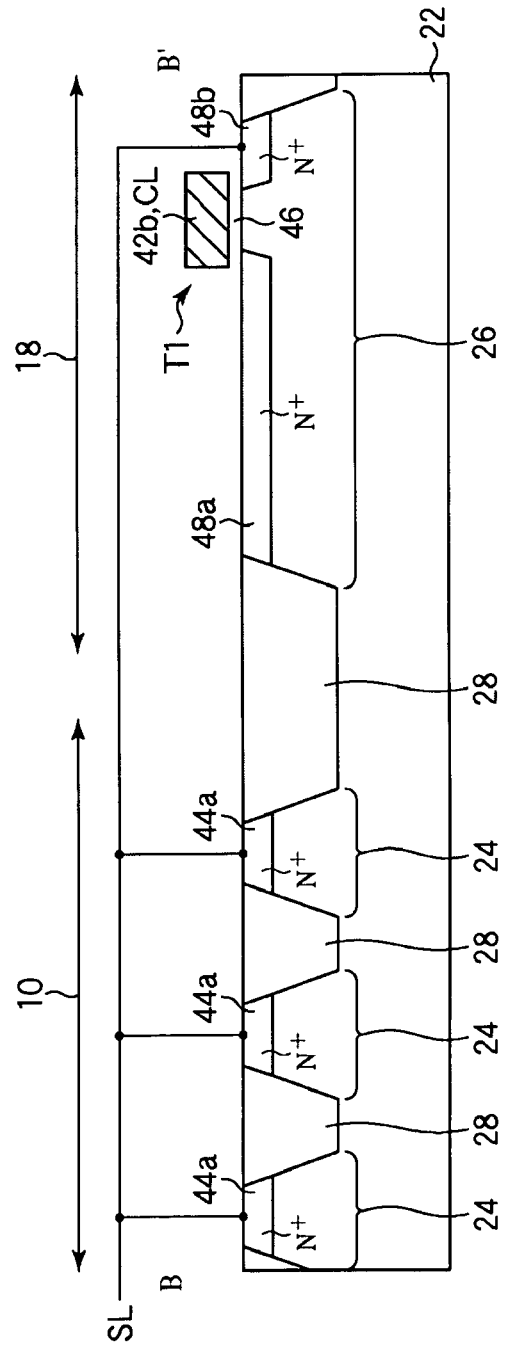
FIG. 39A
FIG. 39B

FIG. 40

| | WORD LINE | BIT LINE | CONTROL LINE | GND LINE | SOURCE LINE | WELL |
|---|---|---|---|---|---|---|
| READ | 3V (0V) | 0.5V (0V) | CONSTANTLY 5V | 0V | 0V | 0V |
| WRITE | 9V (0V) | 5V (0V) | 5V | 0V | 0V | 0V |
| ERASE | −9V | FLOATING | 0V | 0V | 6V | 0V |

FIG. 44

|  | WORD LINE | BIT LINE | CONTROL LINE | GND LINE | SOURCE LINE | WELL |
|---|---|---|---|---|---|---|
| READ | 3V (0V) | CONSTANTLY 0.5V | CONSTANTLY 5V | 0V | 0V | 0V |
| WRITE | 9V (0V) | 5V (0V) | 5V | 0V | 0V | 0V |
| ERASE | -9V | FLOATING | 0V | 0V | 6V | 0V |

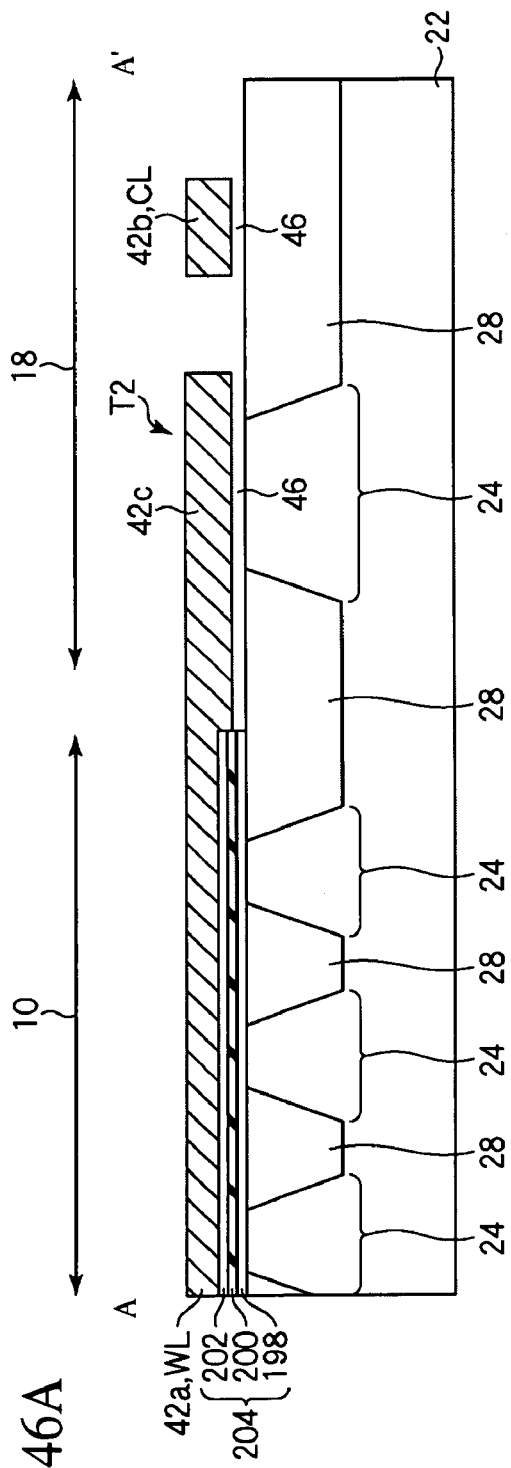
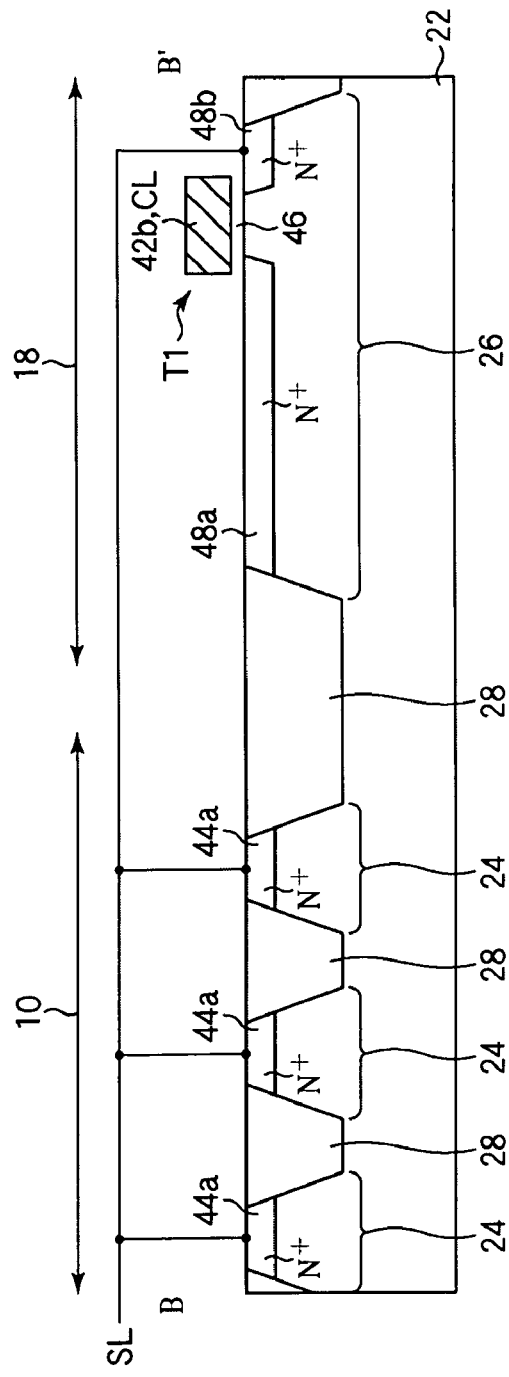
FIG. 46A
FIG. 46B

SEMICONDUCTOR MEMORY DEVICE AND METHOD FOR DRIVING SEMICONDUCTOR MEMORY DEVICE

CROSS-REFERENCE TO RELATED APPLICATION

This application is a divisional application of U.S. application Ser. No. 12/434,789, filed May 4, 2009, based upon and claims the benefit of priority of the prior Japanese Patent Application No. 2008-170594, filed on Jun. 30, 2008, the entire contents of which are incorporated herein by reference.

FIELD

The embodiments discussed herein are related to a semiconductor memory device and a method for driving a semiconductor memory device.

BACKGROUND

As a rewritable nonvolatile semiconductor memory device is known the flash memory, which stores charges in charge storage layers, such as the floating gates, etc. of the memory cell transistors to thereby store information. In the flash memory, information is written by injecting charges into the floating gates, etc., and information is erased by ejecting charges stored in the floating gates, etc. In the N-type memory cell transistors, when negative charges (electrons) are injected, their threshold voltage Vt becomes high, and when stored electrons are ejected, their threshold voltage Vt becomes low. Binary information is stored by the written state of the memory cell transistors, in which the threshold voltage Vt is high and the erased state thereof in which the threshold voltage Vt is low.

As flash memories are known NOR type, NAND type, etc. depending on their internal basic circuit structures. In the NOR flash memory, a plurality of memory cell transistors MT, which are present in the identical column are connected to a common bit line BL.

SUMMARY

According to aspects of an embodiment, a semiconductor memory device including: a plurality of memory cell transistors arranged in a matrix; a plurality of word lines commonly coupling the control gates of the plural memory cell transistors present in the identical one direction; a plurality of source lines commonly coupling the sources of the plural memory cell transistors present in the identical one direction; a plurality of bit lines commonly coupling the drains of the plural memory cell transistors present in the identical other direction intersecting the direction; a first transistor having a drain coupled to the source line; a second transistor having a drain coupled to a source of the first transistor, a gate coupled to the word line and a source grounded; and a control line commonly coupling the gates of the plural first transistors.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIG. 9 is a view depicting voltages of the respective parts in the method for driving the semiconductor memory device according to the first embodiment;

FIGS. 13A to 33 are sectional views of the semiconductor memory device according to the first embodiment in the steps of the method for manufacturing the semiconductor memory device, which illustrate the method;

FIG. 34 is a view depicting voltages of the respective parts to be applied in the method for driving the semiconductor memory device according to a second embodiment;

FIGS. 39A and 39B are sectional views of the memory cell array and the column leak prevention circuit of the semiconductor memory device according to the fourth embodiment;

FIG. 40 is a view depicting voltages of the respective parts in the method for driving the semiconductor memory device according to the fourth embodiment;

FIG. 44 is a view depicting voltages of the respective parts in the method for driving the semiconductor memory device according to a fifth embodiment;

FIGS. 46A and 46B are sectional views of the memory cell array and the column leak prevention circuit of the semiconductor memory device according to the sixth embodiment.

DESCRIPTION OF EMBODIMENTS

In such NOR flash memory, when memory cell transistors having a threshold voltage Vt of a negative value or a value near 0 V are present, leak current flows in the bit lines, which makes it difficult to correctly read the stored information. In this specification, the leak current flowing in the bit lines due to the memory cell transistors having a threshold voltage Vt of a negative value or a value near 0 value is called column leak.

As a technique of preventing the column leak, the technique of providing transistors for the column leak prevention on the source lines SL and controlling the transistors by the word lines WL has been so far proposed. In the proposed technique, when stored information is read, the transistors for the column leak current prevention connected to non-selected word lines are turned off-state to thereby prevent the column leak.

However, the proposed technique requires transistors of high gate breakdown voltage to be used as the transistors for preventing the column leak.

Preferred embodiments will be explained with reference to accompanying drawings.

[a] First Embodiment

The semiconductor memory device according to the first embodiment and the method for driving the semiconductor memory device, and the method for manufacturing the semiconductor memory device will be explained with reference to FIGS. 1 to 33.

(Semiconductor memory device)

Figure 1:
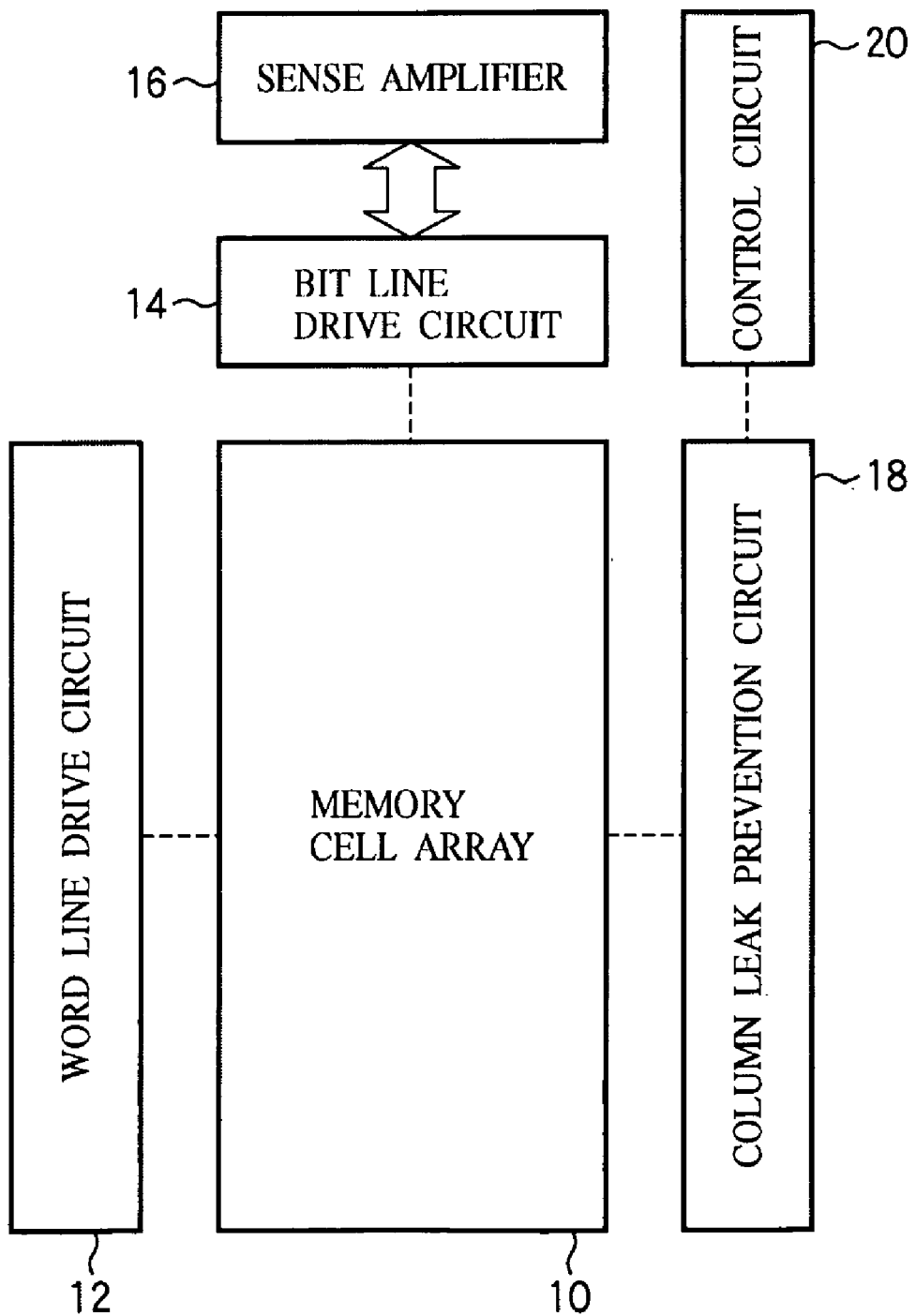
FIG. 1 is a diagrammatic view illustrating the circuit structure of the semiconductor memory device according to a first embodiment.
Figure 2:
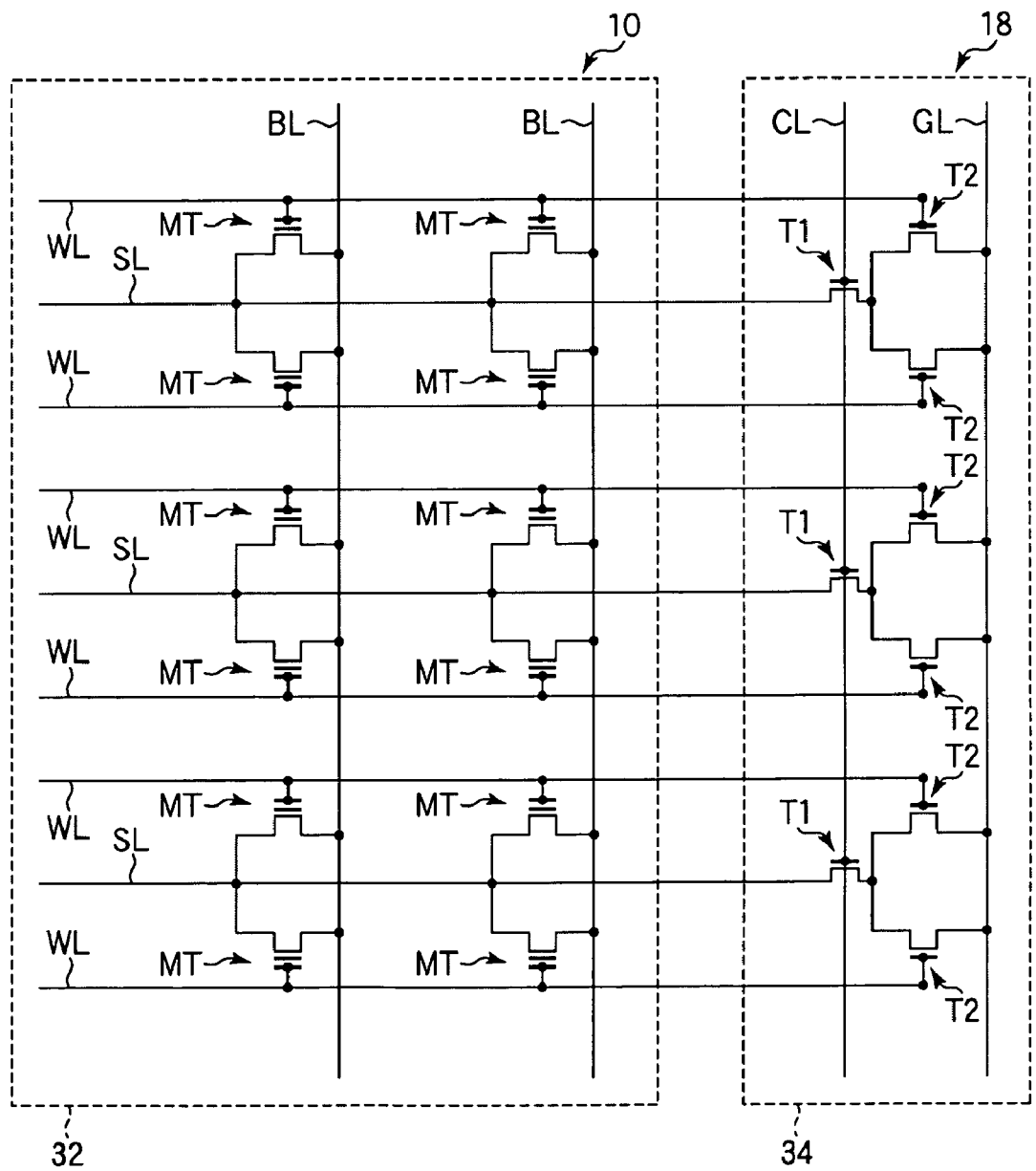
FIG. 2 is a circuit diagram of the memory array and column leak prevention circuit of the semiconductor memory device according to the first embodiment.
Figure 3:
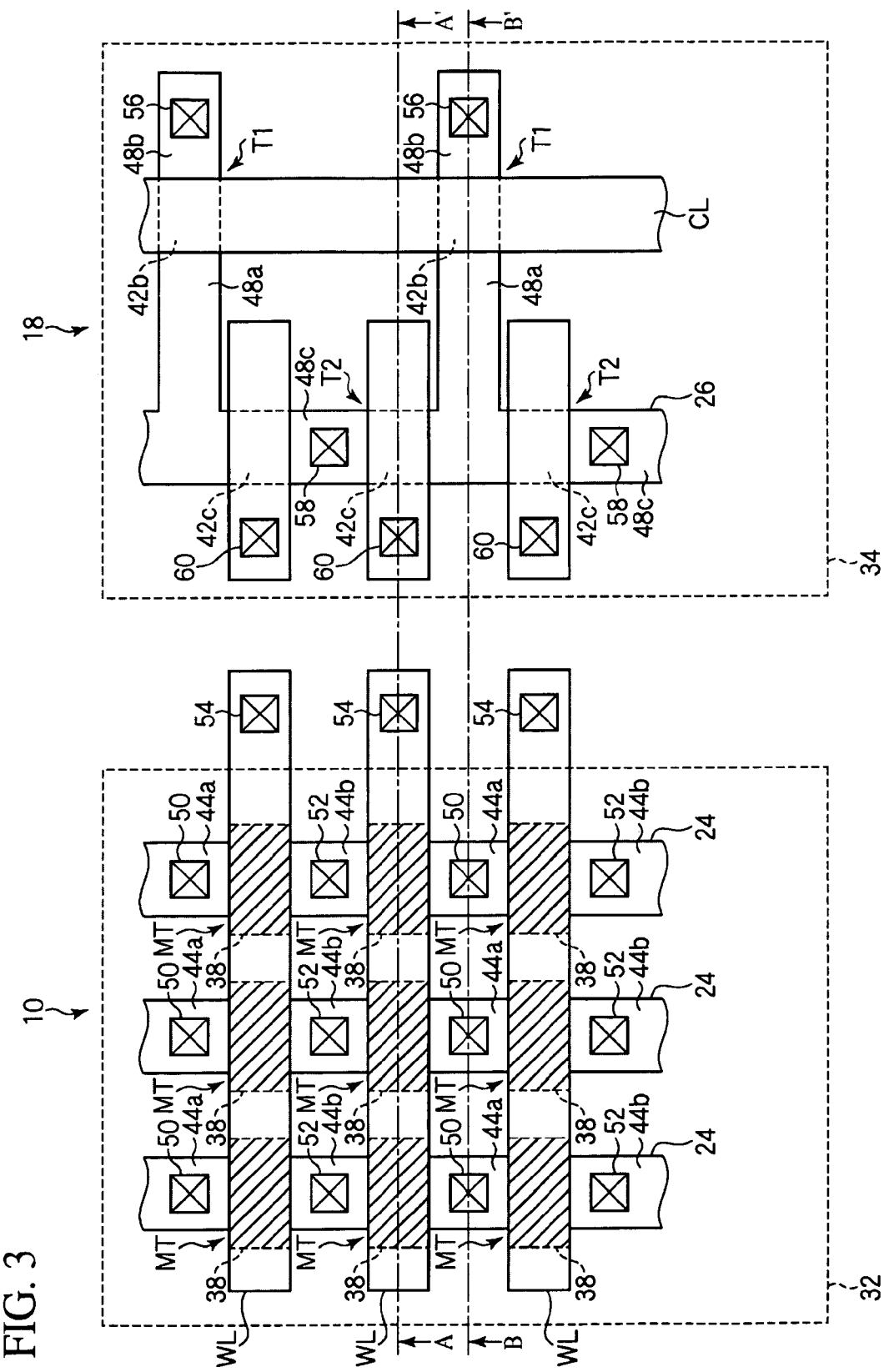
FIGS. 3 to 5 are plan views of the memory cell array and the column leak prevention circuit of the semiconductor memory device according to the first embodiment.
Figure 4:
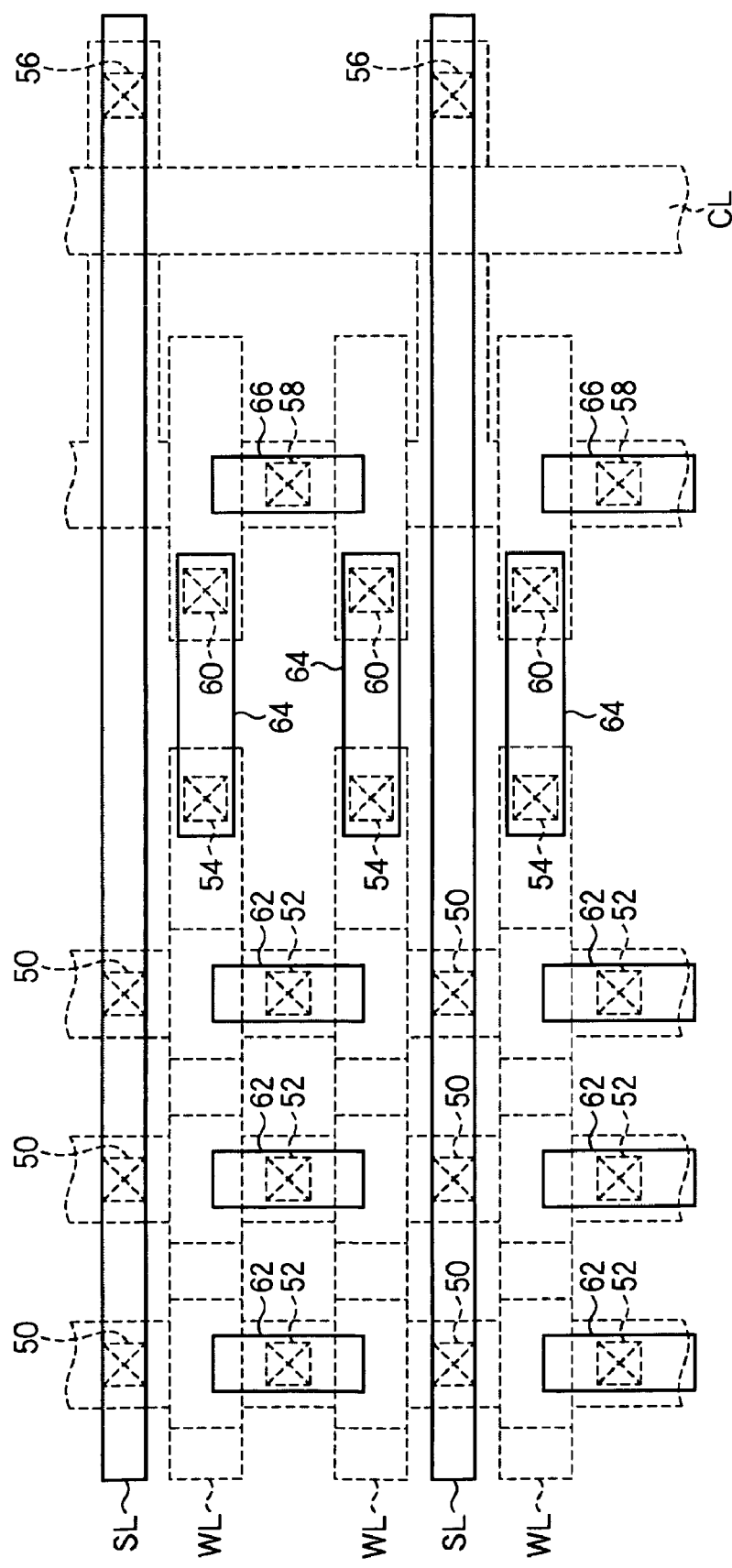
Figure 5:
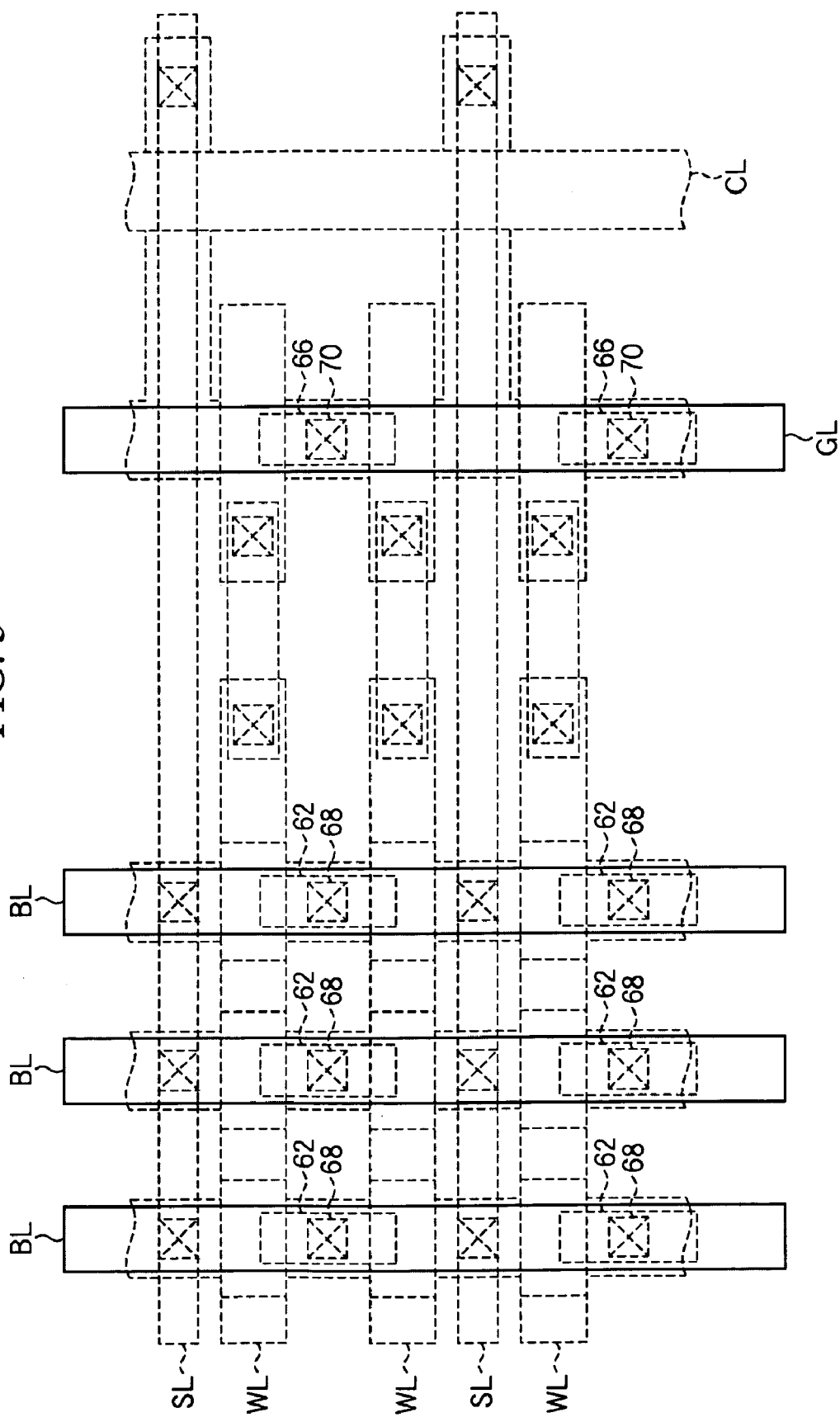
Figure 6A:
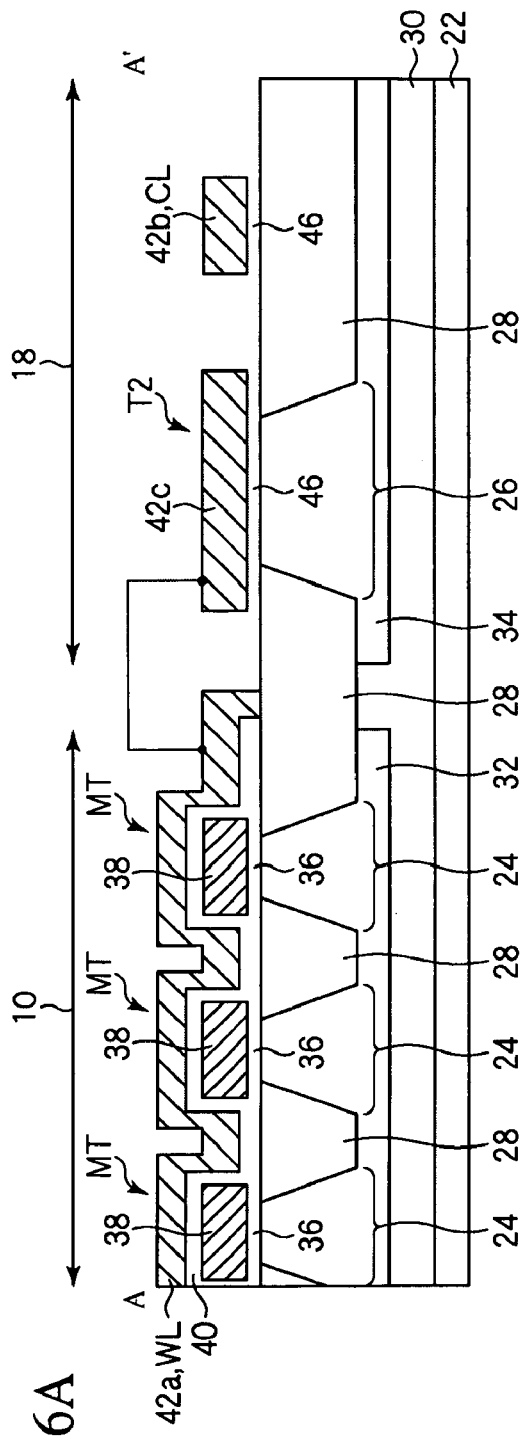
FIGS. 6A and 6B are sectional views of the memory cell array and the column leak prevention circuit of the semiconductor memory device according to the first embodiment.
Figure 6B:
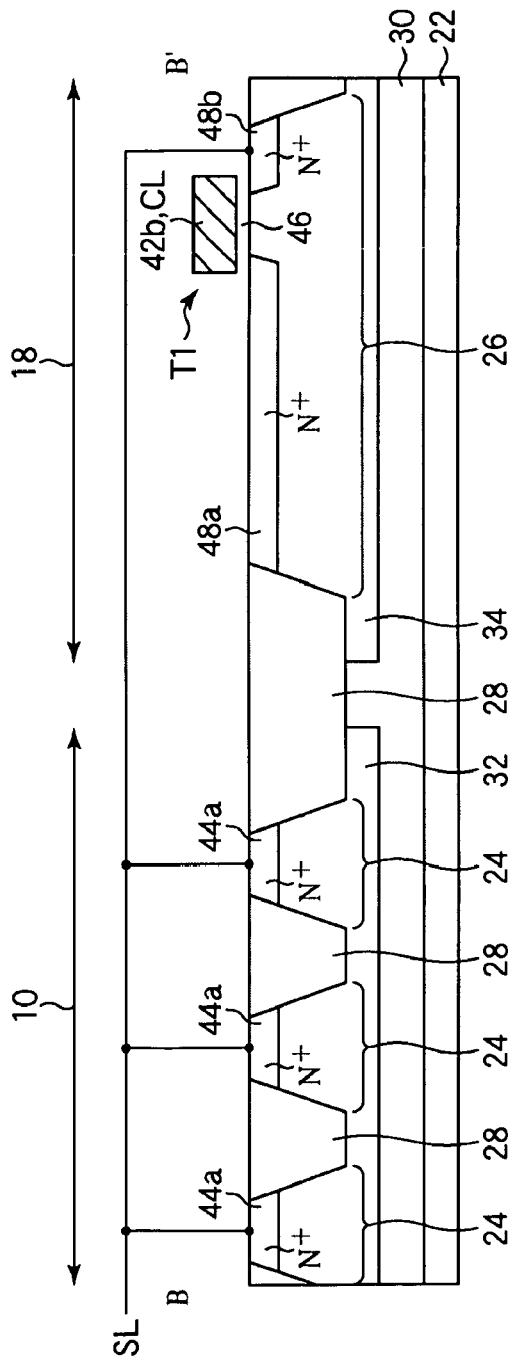
Figure 7:
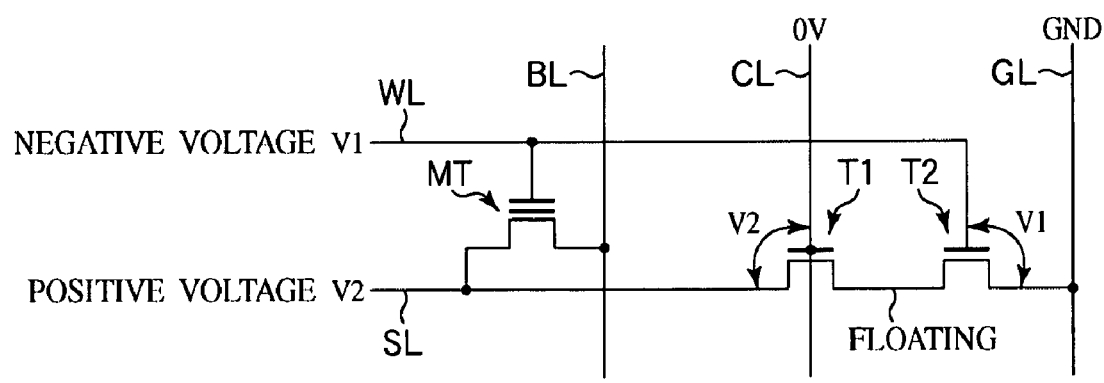
FIG. 7 is a view explaining voltages to be applied to the first transistors and the second transistors in the erase operation of the semiconductor memory device according to the first embodiment.
Figure 8:
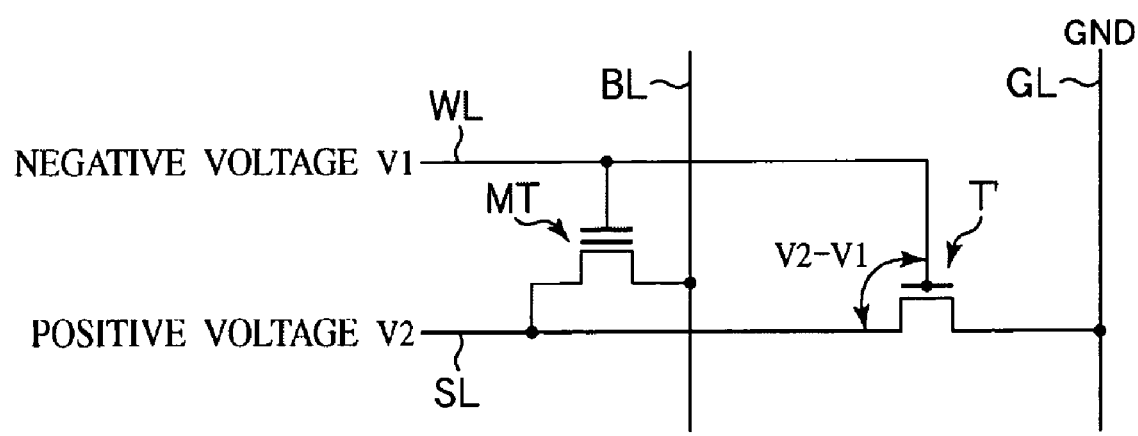
FIG. 8 is a view explaining voltages to be applied to the transistors for the leak prevention in the erase operation of the proposed semiconductor memory device.

First, the semiconductor memory device according to the present embodiment will be explained with reference to FIGS. 1 to 8. FIG. 1 is a diagrammatic view of the semiconductor memory device according to the present embodiment, which illustrates the circuit structure. FIG. 2 is a circuit diagram of the memory cell array and the column leak prevention circuit of the semiconductor memory device according to the present embodiment. FIGS. 3 to 5 are plan views of the memory cell array and the column leak prevention circuit of the semiconductor memory device according to the present embodiment. FIGS. 6A and 6B are sectional views of the memory cell array and the column leak prevention circuit of the semiconductor memory device according to the present embodiment. FIG. 7 is a view explaining the voltages to be applied to a first transistors and a second transistor in the erase operation of the semiconductor memory device according to the present embodiment. FIG. 8 is a view explaining the voltage to be applied to the column leak prevention transistor in the erase operation of the proposed semiconductor memory device.

First, the circuit structure of the semiconductor memory device according to the present embodiment will be explained with reference to FIGS. 1 and 2.

The semiconductor memory device according to the present embodiment is an NOR type flash memory and includes a memory cell array 10 of a plurality of memory cell transistors MT arranged in a matrix. In the periphery of the memory cell array 10, a word line drive circuit 12 for applying voltages to the word lines WL, and a bit line drive circuit 14 for applying voltage to the bit lines BL are provided. A sense amplifier 16 for detecting currents flowing in the bit lines BL is connected to the bit line drive circuit 14. In the periphery of the memory cell array 10, a column leak prevention circuit 18 for preventing the column leak is disposed opposed to the word line drive circuit 12. A control circuit 20 for applying, via a control line CL, voltages to first transistors T1 formed in the column leak prevention circuit 18 is connected to the column leak prevention circuit 18.

As illustrated in FIG. 2, in the memory cell array 10, a plurality of memory cell transistors MT are arranged row-wise and column-wise in a matrix. The memory cell transistors MT are N-type transistors each including a gate electrode of the stacked structure having a floating gate and a control gate. The memory cell transistors MT are formed in the first P-type wells 32 formed in N-type wells formed in a P-type semiconductor substrate. The first P-type wells 32 are connected to an outside circuit (not illustrated) to thereby apply prescribed voltages corresponding to operations.

Row-wise word lines WL are extended, respectively associated with the respective rows of the memory cell array 10. The control gates of a plurality of memory cell transistors MT present in each row are commonly connected by the associated word line WL. The word lines WL are connected to the word line drive circuit 12, so that a prescribed voltage can be applied to an arbitrary word line WL by the word line drive circuit 12.

Row-wise source lines SL are provided, respectively associated with a couple of adjacent ones of the rows of the memory cell array 10. The sources of a plurality of the memory cell transistors MT present in each couple of the adjacent rows are commonly connected by the associated source line SL. Thus, a couple of the adjacent rows of the memory cell array 10 have one source line SL in common.

Column-wise bit lines BL are provided respectively associated with the respective columns of the memory cell array 10. The drains of a plurality of memory cell transistors MT present in each column are commonly connected by an associated bit line BL. The bit lines BL are connected to the bit line drive circuit 14, so that a prescribed voltage can be applied to an arbitrary bit line BL by the bit line drive circuit 14.

As illustrated in FIG. 2, in the column leak prevention circuit 18, the first transistor T1 is provided associated with each source line SL, and the second transistor T2 is provided associated with each word line WL. The first transistors T1 and the second transistors T2 are N-type transistors having a gate breakdown voltage which is the erase voltage or below, which is to be described below. The first transistors T1 and the second transistors T2 are formed in the second P-type well 34 formed in the N-type well formed in the P-type semiconductor substrate and electrically isolated from the first P-type well 32. 0 V is applied to the second P-type well 34.

The drain of each first transistor T1 is connected to the associated source line SL. The source of each first transistor T1 is connected to the drains of two second transistors T2 associated with each couple of the adjacent word lines WL having in common each source line SL connected to each first transistor T1. The gate of each second transistor T2 is connected to the associated word line WL.

In the column leak prevention circuit 18, a control line CL is provided in the identical direction as the column direction of the memory cell array 10. The gates of a plurality of the first transistors T1 are commonly connected by the control line CL. The control line CL is connected to the control circuit 20, so that a prescribed voltage can be applied to the gates of the first transistors T1 via the control line CL. The control circuit 20 applies the prescribed voltage to the gates of the first transistors T1 via the control line CL to thereby control the first transistors T1.

In the column leak prevention circuit 18, a ground line (GND line) GL is provided extended in the identical direction as the column direction of the memory cell array 10. The sources of the plural second transistors T2 are commonly connected by the ground line GL to be grounded.

As described above, the semiconductor memory device according to the present embodiment comprises the column leak prevention circuit 18 including the first transistors T1 connected serially with respect to the source lines SL, and the second transistors T2.

Next, the structures of the memory cell array and the column leak prevention circuit of the semiconductor memory device according to the present embodiment will be explained with reference to FIGS. 3 to 6B. FIG. 3 illustrates the layouts of the memory cell transistors MT, and the first transistors T1 and the second transistors T2. FIG. 4 illustrates the layout of the first interconnection layer including the source lines SL. FIG. 5 illustrates the layout of thee second interconnection layer including the bit lines BL and the ground line GL. FIG. 6A is the sectional view along the line A-A' in FIG. 3, and FIG. 6B is the sectional view along the line B-B' in FIG. 3. In FIGS. 6A and 6B, the first interconnection layer, the second interconnection layer and the conductor plugs are omitted to illustrate the electric connections simplified.

In the P-type semiconductor substrate 22, device isolation regions 28 for defining device regions 24, 26 are formed. The device isolation regions 28 are formed by, e.g., STI (Shallow Trench Isolation).

In the semiconductor substrate 22 with the device regions 24, 36 defined, an N-type well 30 is formed. In the N-type well 30, the first P-type well 32 is formed in the region for the memory cell array 10 formed in, and the second P-type well 34 for the column leak prevention circuit 18 formed in is formed. The first P-type well 32 and the second P-type well 34 are electrically isolated from each other.

On the semiconductor substrate 22 with the first P-type well 32 formed in, floating gates 38 as the charge storing layer are formed with a tunnel insulation film 36 formed therebetween. On the floating gates 38, control gates 42a are formed with an insulation film 40 formed therebetween. The control gates 42a of a plurality of the memory cell transistors MT present in the identical row are commonly connected. That is, on the floating gates 38, word lines WL commonly connecting the control gates 42a are formed with an insulation film 40 formed therebetween.

In the semiconductor substrate 22 on both sides of each floating gate 38, N-type impurity diffused layers 44a, 44b are formed. The impurity diffused layer 44a is the source diffused layer of the memory cell transistors MT. The impurity diffused layer 44b is the drain diffused layer of the memory cell transistors MT.

Thus, on the semiconductor substrate 22 in the first P-type well 32, the N-type memory cell transistors MT each including the floating gate 38, control gate 42a and the source/drain diffused layers 44a-44b are formed. The memory cell transistors MT are formed in the triple well of the first P-type well 32 formed in the N-type well 30 formed in the P-type semiconductor substrate 22.

On the semiconductor substrate 22 with the second P-type well 34 formed in, the gate electrodes 42b of the first transistors T1 are formed with a gate insulation film 46 formed therebetween. The gate electrodes 42b of the first transistors T1 are commonly connected. That is, on the semiconductor substrate 22, the control line CL commonly connecting the gate electrodes 42b of the first transistors T1 is formed with a gate insulation film 46 formed therebetween.

In the semiconductor substrate 22 on both sides of the gate electrodes 42b, N-type impurity diffused layers 48a, 48b are formed. The impurity diffused layers 48a are the source diffused layers of the first transistors T1. The impurity diffused layers 48b are the drain diffused layers of the first transistors T1.

Thus, on the semiconductor substrate 22 with the second P-type well 34 formed in, the N-type first transistors T1 each including the gate electrode 42b, and the source/drain diffused layers 48a, 48b are formed. As the first transistors T1, transistors having a gate breakdown voltage which is an erase voltage or below which is a voltage difference between a positive voltage to be applied to the first P-type well 32 and a negative voltage to be applied to the word line WL in the erase operation are used. The film thickness of the gate insulation film 46 of the first transistors T1 is the identical as the film thickness of the gate insulation film of the high breakdown voltage transistors used in, e.g., the word line drive circuit 12 and the bit line drive circuit 14.

On the semiconductor substrate 22 with the second P-type well 34 formed in, the gate electrodes 42c of the second transistors T2 are formed with the gate insulation film 46 formed therebetween.

In the semiconductor substrate 22 on both sides of the gate electrodes 42c, the N-type impurity diffused layers 48c, 48a are formed. The impurity diffused layers 48c are the source diffused layers of the second transistors T2. The impurity diffused layers 48a are the drain diffused layers of the second transistors T2. The drain diffused layers 48a of the second transistors T2 are one and the identical as the source diffused layer 48a of the first transistors T1.

On the semiconductor substrate 22 with the second P-type well 34 formed in, the N-type second transistors T2 each including the gate electrode 42c and the source/drain diffused layers 48a, 48a are formed. As the second transistors T2, transistors having a gate breakdown voltage which is the erase voltage or below which is a voltage difference between a positive voltage to be applied to the first P-type well 32 and a negative voltage to be applied to the word lines WL in the erase operation are used. The film thickness of the gate insulation film 46 of the second transistors T2 is the identical as the film thickness of the gate insulation film of the high breakdown voltage transistors used in, e.g., the word line drive circuit 12 and the bit line drive circuit 14.

The first transistors T1 and the second transistors T2 are formed in the triple well of the second P-type well 34 formed in the N-type well 30 formed in the P-type semiconductor substrate 22.

On the semiconductor substrate 22 with the memory cell transistors MT, and the first transistors T1 and the second transistors T2 formed on, an inter-layer insulation film (not illustrated) is formed. In the inter-layer insulation film, conductor plugs 50, 52, 54, 56, 68, 60 are buried in. The conductor plugs 50 are connected to the source diffused layers 44a of the memory cell transistors MT. The conductor plugs 52 are connected to the drain diffused layers 44b of the memory cell transistors MT. The conductor plugs 54 are connected to the word lines WL. The conductor plugs 56 are connected to the drain diffused layers 48b of the first transistors T1. The conductor plugs 58 are connected to the source diffused layers 48c of the second transistors T2. The conductor plugs 60 are connected to the gate electrodes 42c of the second transistors T2.

On the inter-layer insulation film with the conductor plugs 50, 52, 54, 56, 58, 60 buried in, the first interconnection layer (the source lines SL and interconnections 62, 64, 66) are formed.

The source lines SL are connected to the conductor plugs 50 connected to the source diffused layers 44a of the memory cell transistors MT and to the conductor plugs connected to the drain diffused layers 48b of the first transistors T1. Thus, each source line SL commonly connects the source/drain diffused layers 44a of a plurality of memory cell transistors MT present in the identical row. The source lines SL are connected to the drain diffused layers 48b of the first transistors T1.

The interconnections 62 are connected to the conductor plugs 52 connected to the drain diffused layers 44b of the memory cell transistors MT.

The interconnections 64 are connected to the conductor plugs 54 connected to the word lines and to the conductor plugs 60 connected to the gate electrodes 42c of the second transistors T2. Thus, each word line WL and the gate electrode 42c of the second transistor T2 are interconnected by each interconnection 64.

The interconnections 66 are connected to the conductor plugs 58 connected to the source diffused layers 48c of the second transistors T2.

On the first interconnection layer, an inter-layer insulation film (Not illustrated) is formed. In this inter-layer insulation film, conductor plugs 68, 70 are buried. The conductor plugs 68 are connected to the interconnections 62 connected t the drain diffused layers 44b of the memory cell transistors MT via the conductor plugs 52. The conductor plugs 70 are connected to the interconnections 66 connected to the source diffused layers 48c of the second transistors T2 via the conductor plugs 58.

On the inter-layer insulation film with the conductor plugs 68, 70 buried in, the second interconnection layer (the bit lines BL and the ground line GL) are formed.

The bit lines BL are connected to the conductor plugs 68 connected to the drain diffused layers 44b of the memory cell transistors MT via the interconnections and the conductor plugs 52. Thus, each bit line commonly connects the drain diffused layers 44b of a plurality of memory cell transistors MT present in the identical column.

The ground line GL is connected to the conductor plugs 70 connected to the source diffused layers 48c of the second transistors T2 via the interconnections 66 and the conductor plugs 58. Thus, the source diffused layers of a plurality of the second transistor T2 are commonly connected by the ground line GL to be grounded.

Thus, the memory cell array 10 and the column leak prevention circuit 18 of the semiconductor memory device according to the present embodiment are constituted.

In the semiconductor memory device according to the present embodiment, as will be described alter, in the read operation and the write operation, a prescribed voltage is applied to the gates of the first transistors T1 via the control line CL by the control circuit 20. Thus, the first transistors T1 connected to all the source lines SL are turned on. On the other hand, the gates of the second transistors T2 are connected to the word lines WL. Accordingly, the second transistor T2 connected to the word line WL connected to a selected memory cell transistor MT is turned on-state, and the other second transistors T2 are turned off-state. Thus, the source line SL alone connected to the selected memory cell transistor MT is brought into electric connection with the ground line GL, and the other source lines SL are disconnected from the ground line GL. Thus, the flow of current from the bit lines BL to the source lines SL associated with the non-selected memory cell transistors MT can be prevented, and the column leak can be prevented.

In the semiconductor memory device according to the present embodiment, as will be described later, in the erase operation, the first transistors T1 connected to all the source lines SL are turned off-state by the control circuit 20. To the drains of the first transistors T1, the voltage of the source lines SL is applied. In the present embodiment, as will be described later, a positive voltage is applied here to the first P-type well 32 to thereby make the channel erase of erasing information of the memory cell transistors MT. Accordingly, the voltage of the source lines SL becomes a positive voltage substantially equal to the positive voltage applied to the first P-type well 32, and this positive voltage is applied to the drains of the first transistors T1. On the other hand, the negative voltage of the word lines WL is applied to the gates of the second transistors T2. Thus, in the present embodiment, when the erase operation is made, the positive voltage of the source lines SL and the negative voltage of the word lines WL are separately applied respectively to the drains of the first transistors T1 in the off-state and to the gates of the second transistors T2.

FIG. 7 illustrates the voltages to be applied to the first transistors T1 and the second transistors T2 in the erase operation of the semiconductor memory device according to the present embodiment. In FIG. 7, the positions of the sources and the drains of the first transistor T1 and the second transistor T2 are opposite to the positions of the source and the drain of the memory cell transistor MT.

To the gate of the first transistor T1, 0 V is applied by the control circuit 20 via the control line CL. Thus, the first transistor T1 is turned off-state.

To erase information in the memory cell transistor MT, the voltage of the word line WL is set at a prescribed negative voltage V1. The voltage of the source line SL is set at a positive voltage V2 substantially equal to the positive voltage applied to the first P-type well 32.

At this time, the positive voltage V2 of the source line SL is applied to the drain of the first transistor T1, but the negative voltage V1 of the word line WL is not applied to the first transistor T1. The negative voltage V1 of the word line WL is applied to the gate of the second transistor T2, but the positive voltage of the source line SL is not applied to the second transistor T2.

Thus, according to the present embodiment, as the first transistors T1 and the second transistors T2 for the column leak prevention, transistors whose gate insulation film is relatively thin and whose gate breakdown voltage is relatively low can be used. Specifically, in the present embodiment, as the first transistors T1 and the second transistors T2, transistors whose gate breakdown voltage are the erase voltage or below which is the voltage difference between the positive voltage to be applied to the first P-type well 32 and the negative voltage to be applied to the word lines WL are used.

To prevent the column leak, it is proposed to provide one transistor for the column leak prevention for each source line SL. FIG. 8 illustrates the voltage to be applied to the transistor for the column leak prevention in the erase operation of the proposed semiconductor memory device.

In the proposed semiconductor memory device, as illustrated in FIG. 8, the control gates of the memory cell transistors MT and the gate of the transistors T' for the column leak prevention are connected by each word line WL. The sources of the memory cell transistors MT and one of the source/drain of the transistor T' for the column leak prevention are connected by a source line SL. The other of the source/drain of the transistor T' is connected to the ground line GL to be grounded.

In the proposed semiconductor memory device illustrated in FIG. 8, in the erase operation, a negative voltage V1 of the word lines WL is applied to the gates of the transistors T', and a positive voltage V2 of the source lines SL is applied to one of the sources/drains of the transistor T'. Accordingly, the erase voltage is applied directly also to the transistors T'.

As described above, in the proposed semiconductor memory device, a very high erase voltage is applied directly to the transistors T' for the column leak prevention. Accordingly, it is necessary to make the gate breakdown voltage of the transistors for the column leak prevention higher than the erase voltage.

According to the present embodiment, however, the fist transistors T1 and the second transistors T2 whose gate breakdown voltage is the erase voltage or below, as is not in the proposed semiconductor memory device, are used for the column leak prevention.

(Method for driving the Semiconductor memory device)

Next, a method for driving a semiconductor memory device according to the present embodiment will be explained with reference to FIGS. 9 to 12. FIG. 9 is a view illustrating the voltages of the respective parts of the semiconductor memory device in the method for driving the semiconductor memory device. In FIG. 9, the voltages in the parentheses are voltages of non-selected lines.

(Method for reading the semiconductor memory device)

Figure 10:
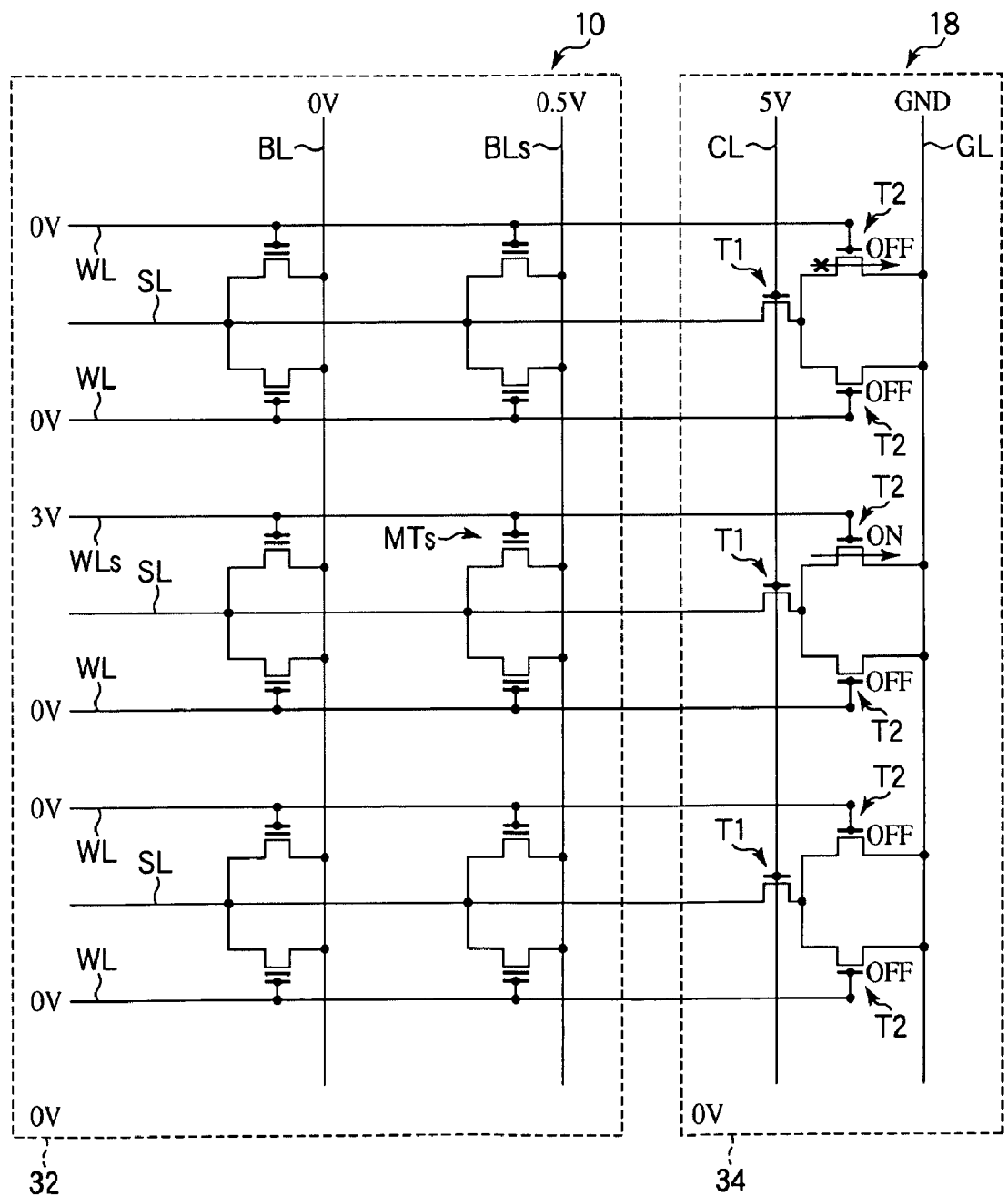
FIG. 10 is a circuit diagram illustrating the method for reading the semiconductor memory device according to the first embodiment.

First, a method for reading the semiconductor memory device according to the present embodiment will be explained with reference to FIGS. 9 and 10. FIG. 10 is a circuit diagram illustrating the method for reading the semiconductor memory device according to the present embodiment.

When information stored in the memory cell transistors MT is read, the voltages of the respective parts are set depicted as FIGS. 9 and 10.

To the control line CL, a positive voltage of, e.g., 5 V is constantly applied by the control circuit 20. The first transistors T1 are thus constantly on-state.

To the first P-type well 32 and the second P-type well 34, 0 V is respectively applied.

Next, the address of a memory cell transistor to be selected (selected memory cell transistor) MTs is decided.

The voltage of the bit lines BL and the word lines WL on standby state is 0 V. To the bit lines BL and the word lines WL on standby state, the voltages are applied as follows.

To the bit line (selected bit line) BLs the selected memory cell transistor MTs is connected to, a positive voltage of, e.g., 0.5 V is applied by the bit line drive circuit 14. On the other hand, the voltage of the bit lines BL other than the selected bit line BLs remains 0 V.

Next, the selected bit line BLs is connected to the sense amplifier 16.

Next, to the word line (selected word line) WLs the selected memory cell transistor MTs is connected to, a positive voltage of, e.g., 3 V is applied by the word line drive circuit 12. The voltage is applied to the selected word line WLs, whereby the second transitor T2 connected to the selected word line WLs is turned on-state from the off-state. On the other hand, the voltage of the word lines WL other than the selected word line WLs remains 0 V. Accordingly, the second transistors T2 connected to the word lines WL other than the selected word line WLs remain off-state.

The source line SL the selected memory cell transistors MTs is connected to is brought into electric connection with the ground line GL because the associated first transistor T1 and the second transistor T2 are both off-state. On the other hand, the source lines SL other than the source line SL the selected memory cell transistor MTs is connected to are shut off from the ground line GL because the associated second transistors T2 are off-state. Accordingly, in the present embodiment, in the erased state, in the selected memory cell transistor MTs current can flow from the selected bit line BLs to the source lines SL. In contrast to this, in the memory cell transistors MT other than the selected memory cell transistor MTs, even when its threshold voltage Vt has a value which causes the leak current, the current cannot flow from the bit lines BL to the source lines SL. Thus, according to the present embodiment, the column leak can be prevented.

Then, the current flowing in the selected bit line BLs is detected by the sense amplifier 16, and based on a value of the current detected by the sense amplifier 16, it is judged whether the selected memory cell transistor MTs is in the written state or the erased state. That is, when the current flows in the selected bit line BLs, it is judged that the selected memory cell transistor MTs is in the erased state. When the current does not flow in the selected bit line BLs, it is judged that the selected memory cell transistor MTs is in the written state. Thus, information stored in the selected memory cell transistor MTs is read. In the present embodiment, the column leak is prevented, which makes it possible to accurately read information stored in the selected memory cell transistor MTs.

(Method for writing the semiconductor memory device)

Figure 11:
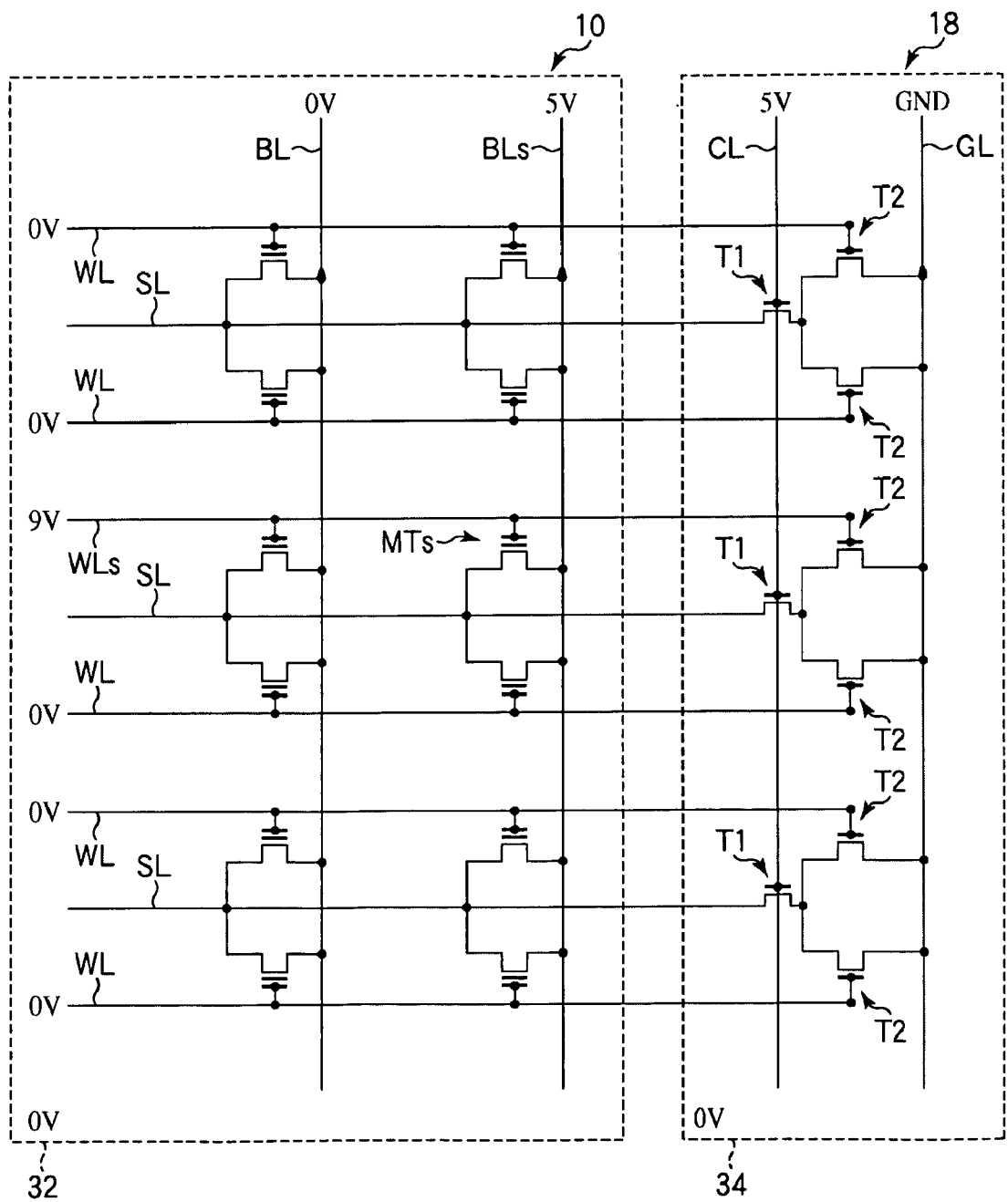
FIG. 11 is a circuit diagram illustrating the method for writing the semiconductor memory device according to the first embodiment.

Next, the method for writing the semiconductor memory device according to the present embodiment will be explained with reference to FIGS. 9 and 11. FIG. 11 is a circuit diagram illustrating the method for writing the semiconductor memory device according to the present embodiment.

When information is written in the memory cell transistors MT, the voltages of the respective parts are set depicted as FIGS. 9 and 11.

To the first P-type well 32 and the second P-type well 34, 0 V is respectively applied.

Then, the address of a selected memory cell transistor MTs is decided.

The voltages of the control line CL, the word lines WL and bit lines BL on standby state are 0 V. To the control line CL, the bit lines BL ad the word lines WL on standby state, voltages are applied as follows.

To the control line CL, a positive voltage of, e.g., 5 V is applied by the control circuit 20. Thus, the first transistors T1 are turned on from the off-state.

Then, to the selected bit line BLs, a positive voltage of, e.g., 5 V is applied by the bit line drive circuit 14. On the other hand, the bit line BL other than the selective bit line BLs remain 0 V.

Then, to the selected word line BLs, a positive voltage of, e.g., 9 V is applied by the word line drive circuit 12. The voltage is applied to the selected word line WLs, whereby the second transistor T2 connected to the selected word line WLs is turned on from the off-state. On the other hand, the voltage of the word lines WL other than the selected word line WLs remain 0 V. Thus, the second transistors T2 connected to the word lines WL other than the selected word line WLs remain off-state.

When the voltages of the respective parts are set as above, current flows between the source diffused layer 44a and the drain diffused layer 44b of the selected memory cell transistor MTs, and a part of hot electrons generated, accompanying this are injected into the floating gate 38. A negative charge (electrons) is injected into the floating gate 38, whereby the threshold voltage Vt of the selected memory cell transistor MTs becomes high. Thus, the selected memory cell transistor MTs is written.

Thus, information is written in the selected memory cell transistor MTs. In the write operation as well as the read operation described above, the source lines SL other than the source line SL connected to the selected memory cell transistor MTs are shut from the ground line GL because the associated second transistor T2 is off-state. Thus, according to the present embodiment, the column leak can be prevented in the write operation as well, and erroneous write in the memory cell transistors MT can be prevented.

(Method for erasing the semiconductor memory device)

Figure 12:
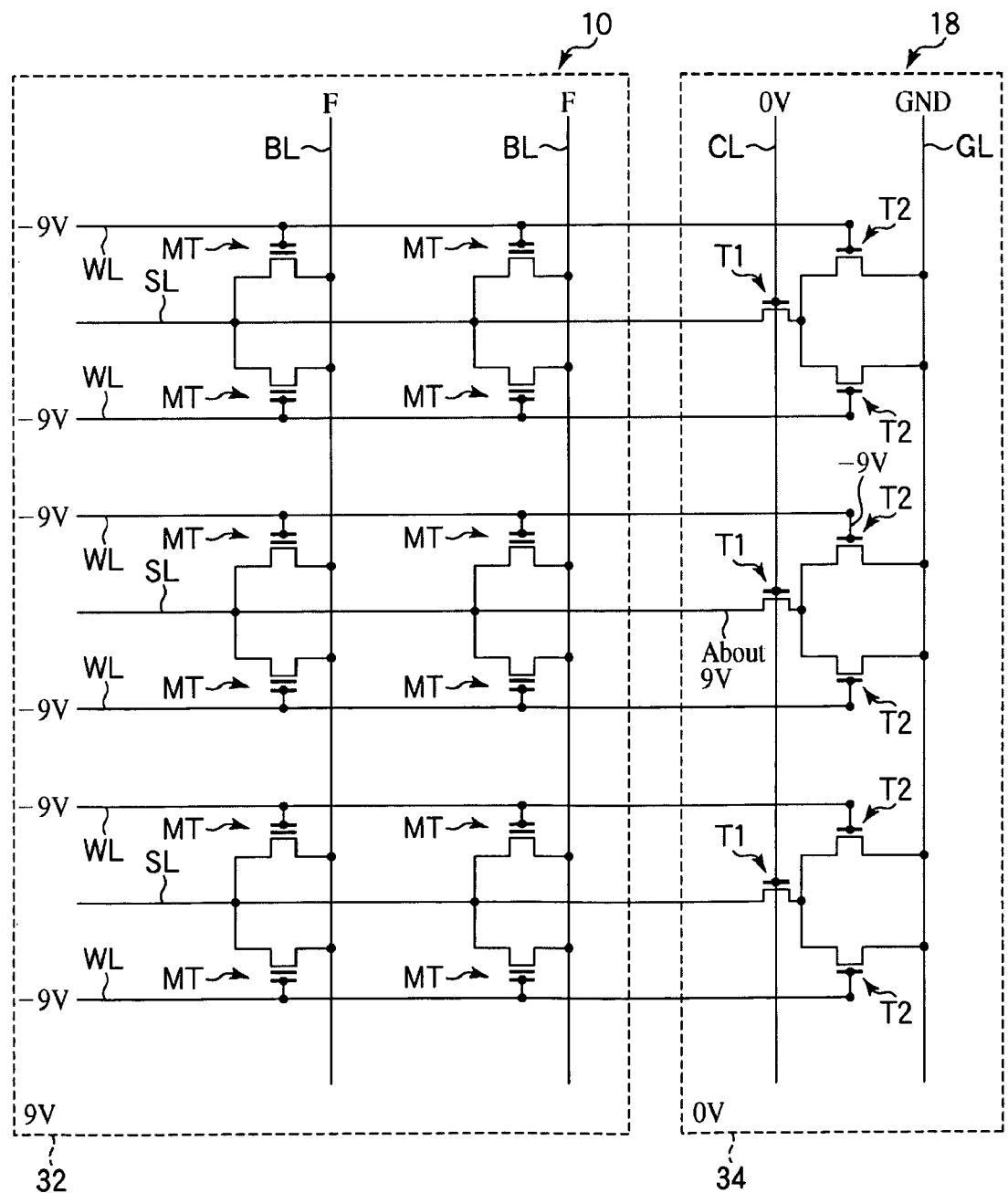
FIG. 12 is a circuit diagram illustrating the method for erasing the semiconductor memory device according to the first embodiment.

Next, the method for erasing the semiconductor memory device according to the present embodiment will be explained with reference to FIGS. 9 and 12. FIG. 12 is a circuit diagram illustrating the method for erasing the semiconductor memory device according to the present embodiment.

When information stored in the memory cell transistors MT, the voltages of the respective parts are set depicted as FIGS. 9 and 12. In the present embodiment, the channel erase for erasing information by applying a prescribed voltage to the first P-type well 32 is made. The erase of information of memory cell transistors MT is made in, e.g., the sector unit.

To the second P-type well 34, 0 V is applied.

To the control line CL, 0 V is applied by the control circuit 20. Thus, the first transistors T1 are turned off-state.

All the bit lines BL in a sector to be erased are made floating (F) by the bit line drive circuit 14.

To all the word lines WL in the sector to be erased, a negative voltage of, e.g., −9 V is applied by the word line drive circuit 12.

To the first P-type well 32, a positive voltage of, e.g., 9 V is applied.

When the voltages of the respective parts are set as above, a high voltage is applied to the tunnel insulation film 36 formed between the floating gates 38 and the first P-type well 32, and electrons stored in the floating gates 38 are drawn out into the first P-type well 32 by the tunnel phenomena. When the electrons stored in the floating gates 38 have been drawn out, the threshold voltage Vt of the memory cell transistors MT becomes low. Thus, the memory cell transistors MT in the sector to be erased are put in the erased state.

Thus, the information stored in the memory cell transistors MT in the sector to be erased is erased.

When a positive voltage of 9 V is applied here to the first P-type well 32, a forward bias is applied to the source diffused layers 44a of the memory cell transistors MT. Thus, the voltage of the source lines SL becomes about 9 V, which is substantially equal to the voltage applied to the first P-type well 32. Resultantly, a positive voltage of about 9 V is applied to the drain diffused layers 48b of the first transistors T1.

On the other hand, to the word lines WL, a negative voltage of −9 V is applied, and accordingly a negative voltage of −9 V is applied to the gate electrodes 42c of the second transistors T2.

As described above, in the present embodiment, when information of the memory cell transistors MT is erased, the positive voltage of the first P-type well 32 (the positive voltage of the source lines SL) and the negative voltage of the word lines WL are separately applied respectively to the first transistors T1 and the second transistors T2. That is, both voltages are never applied concurrently to either of the first transistors T1 and the second transistors T2. Thus, in the present embodiment, as the first transistors T1 and the second transistors T2 for preventing the column leak, transistors having a relatively thin gate insulation film and a relatively low gate breakdown voltage can be used. Specifically, in the present embodiment, as the first transistors T1 and the second transistors T2, transistors whose gate breakdown voltage is the erase voltage or below, which is a voltage difference between the positive voltage to be applied to the first P-type wells 32 and the negative voltage to be applied to the word lines WL can be used.

(Method for Manufacturing the Semiconductor memory device)

Then, the method for manufacturing the semiconductor memory device according to the present embodiment will be explained with reference to FIGS. 13A to 33. FIGS. 13A to 33 are sectional views of the semiconductor memory device according to the present embodiment in the steps of the method for manufacturing the semiconductor memory device, which illustrate the method. FIG. 13A, FIG. 14A, FIG. 15A, FIG. 16A, FIG. 17A, FIG. 18A, FIG. 19A, FIG. 20A, FIG. 21A, FIG. 22A, FIG. 23A, FIG. 24A, FIG. 25A, FIG. 26A, FIG. 27A, FIG. 28, FIG. 30 and FIG. 32 illustrate the memory cell array region 2 where the memory cell transistors MT are to be formed. The views on the left side of the drawings of FIG. 13A, FIG. 14A, FIG. 15A, FIG. 16A, FIG. 17A, FIG. 18A, FIG. 19A, FIG. 20A, FIG. 21A, FIG. 22A, FIG. 23A, FIG. 24A, FIG. 25A, FIG. 26A, FIG. 27A, FIG. 28, FIG. 30 and FIG. 32 correspond to the section along the extension of the word lines WL. The views on the right of the drawings of FIG. 13A, FIG. 14A, FIG. 15A, FIG. 16A, FIG. 17A, FIG. 18A, FIG. 19A, FIG. 20A, FIG. 21A, FIG. 22A, FIG. 23A, FIG. 24A, FIG. 25A, FIG. 26A, FIG. 27A, FIG. 28, FIG. 30 and FIG. 32 correspond to the section vertical to the extension of the word line WL. FIG. 13B, FIG. 14B, FIG. 15B, FIG. 16B, FIG. 17B, FIG. 18B, FIG. 19B, FIG. 20B, FIG. 21B, FIG. 22B, FIG. 23B, FIG. 24B, FIG. 25B, FIG. 26B, FIG. 27B, FIG. 29, FIG. 31 and FIG. 33 illustrate a peripheral circuit region 4. On the left side of the drawings of FIG. 13B, FIG. 14B, FIG. 15B, FIG. 16B, FIG. 17B, FIG. 18B, FIG. 19B, FIG. 20B, FIG. 21B, FIG. 22B, FIG. 23B, FIG. 24B, FIG. 25B, FIG. 26B, FIG. 27B, FIG. 29, FIG. 31 and FIG. 33, a region 6 where high breakdown voltage transistors are to be formed in is illustrated. The region 6 for high breakdown voltage transistors to be formed in is, sequentially from the left of the drawing, a region 6N where high breakdown voltage N-channel transistors are to be formed in, a region 6P where high breakdown voltage transistors are to be formed, and a region 6N' where high breakdown voltage N-channel transistors are to be formed in. On the right side of the drawings of FIG. 13B, FIG. 14B, FIG. 15B, FIG. 16B, FIG. 17B, FIG. 18B, FIG. 19B, FIG. 20B, FIG. 21B, FIG. 22B, FIG. 23B, FIG. 24B, FIG. 25B, FIG. 26B, FIG. 27B, FIG. 29, FIG. 31 and FIG. 33, a region 8 where low voltage resistors (logic transistors) are to be formed is illustrated. The region 8 for low voltage transistors to be formed in is, sequentially from the left of the drawing, a region 8N where low voltage N-channel transistors (N-channel logic transistors) are to be formed and a region 8P where low voltage P-channel transistors (P-channel logic transistors) are to be formed. As the first transistors T1 and the second transistors T2, for example, the high breakdown voltage N-channel transistors to be formed in the region 6N where high breakdown voltage N-channel transistors are to be formed are used.

First, as the semiconductor substrate 22, a P-type silicon substrate, for example, is prepared.

Then, on the entire surface, a 15 nm-thickness thermal oxide film 72, for example, is formed by, e.g., thermal oxidation.

Next, on the entire surface, a 130 nm-thickness silicon nitride film 74 is formed by, e.g., CVD.

Then, the silicon nitride film 74 is patterned. Thus, a hard mask 74 of silicon nitride film is formed.

Next, by dry etching with the hard mask 74 as the mask, the semiconductor substrate 22 is etched. Thus, the device isolation trenches 76 are formed in the semiconductor substrate 22 (see FIGS. 13A and 13B). The depth of the device isolation trenches 76 formed in the semiconductor substrate 22 is, e.g., 300 nm from the surface of the semiconductor substrate 22.

Figure 14A:
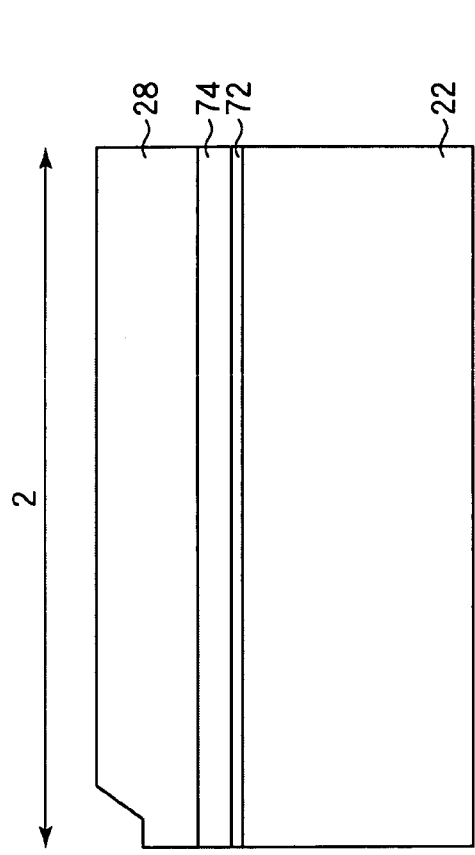
Figure 14B:
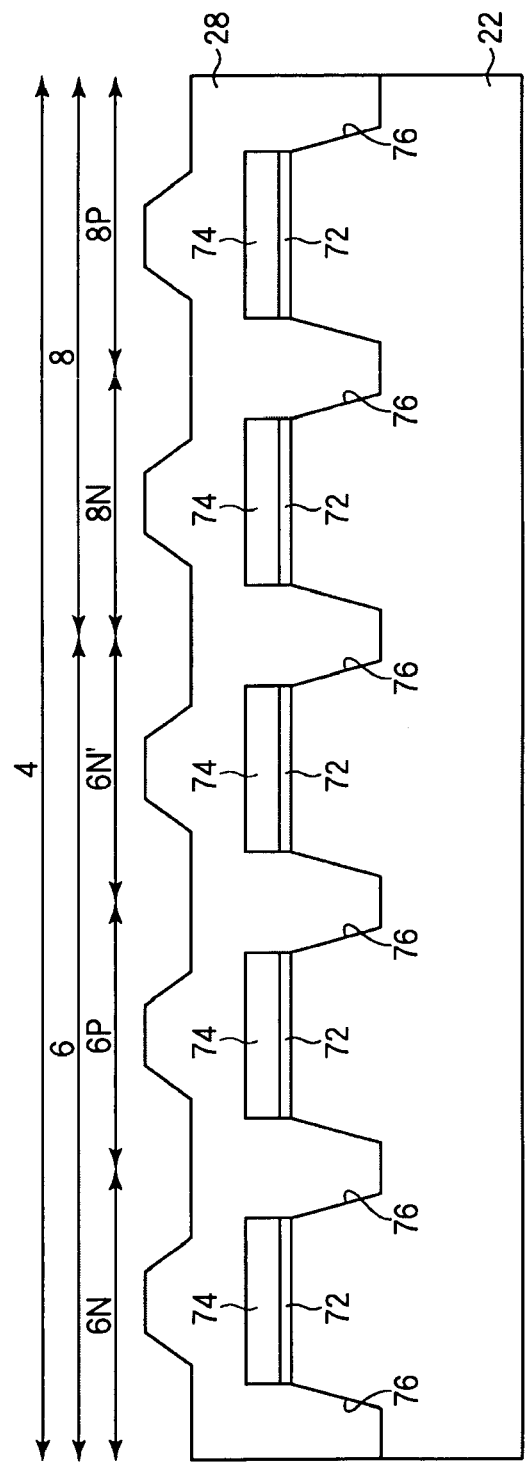
Figure 15A:
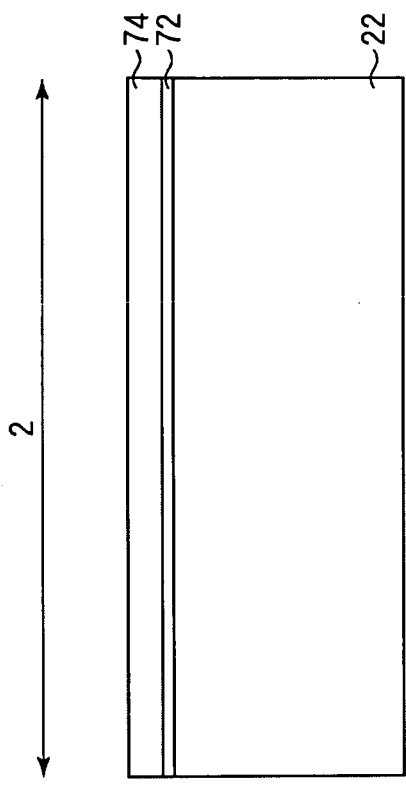
Figure 15B:
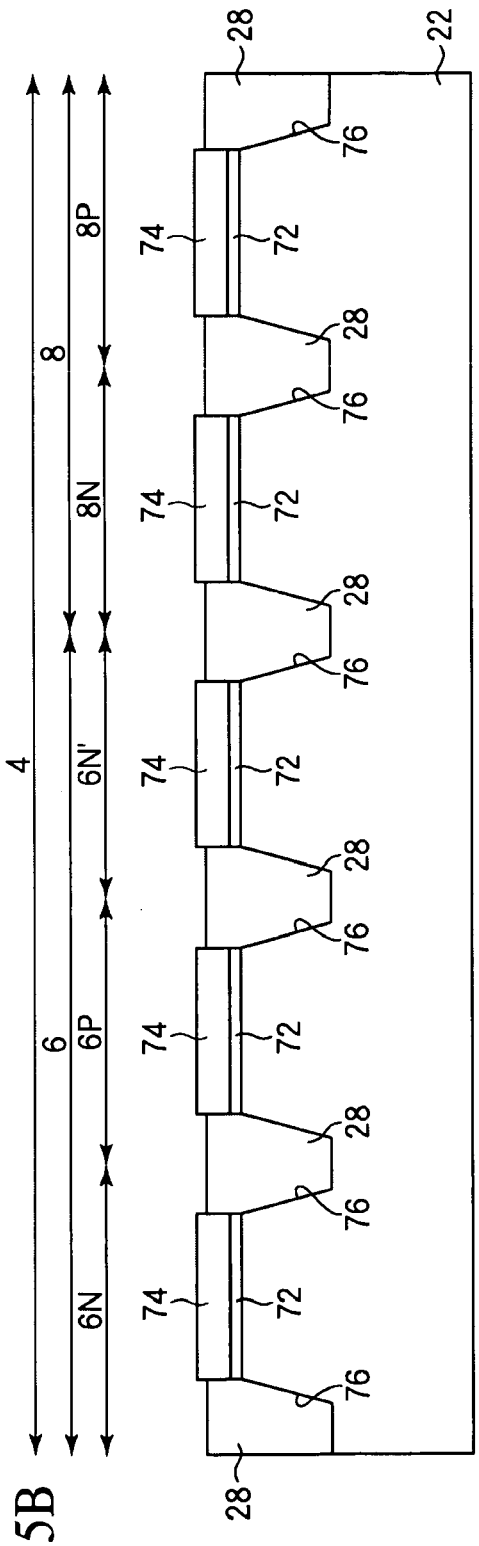

Next, on the entire surface, by, e.g., high density plasma CVD, a 700 nm-thickness silicon oxide film 28, for example, is formed (see FIGS. 14A and 14B).

Next, by CMP (Chemical Mechanical Polishing), the silicon oxide film 28 is polished until the surface of the silicon nitride film 74 is exposed. Thus, the device isolation regions 28 of silicon oxide film are formed (see FIGS. 15A and 15B).

Next, by wet etching using thermal phosphoric acid, the silicon nitride film 74 is removed.

Figure 16A:
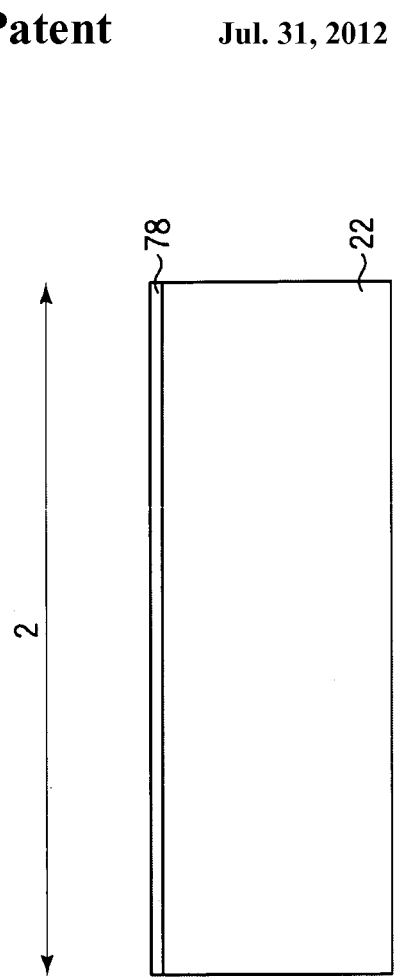
Figure 16B:
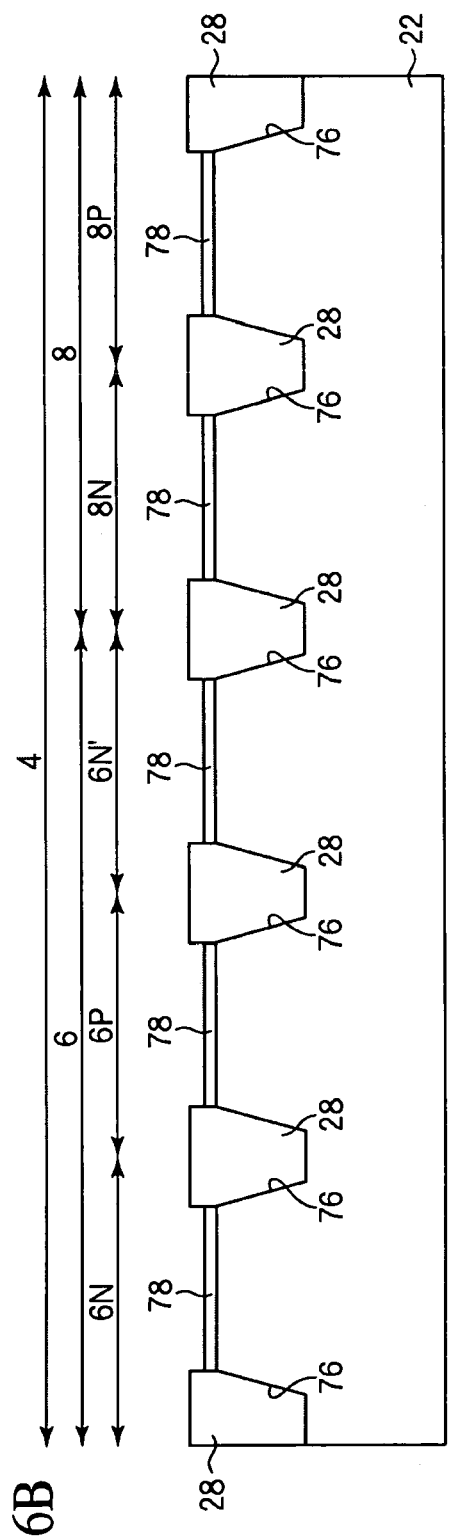
Figure 20A:
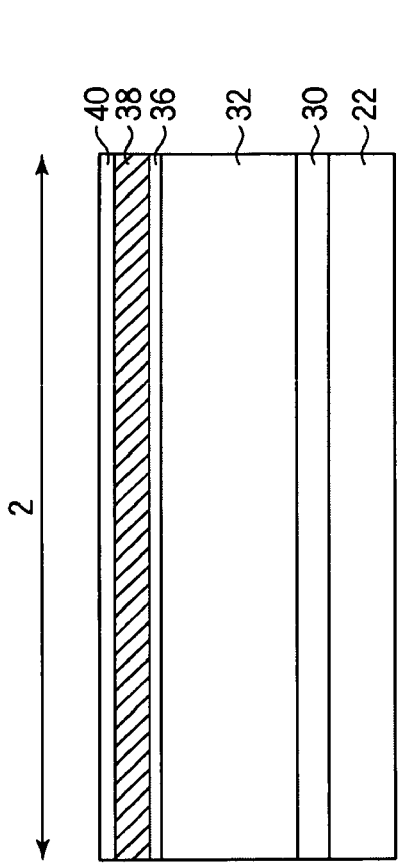
Figure 20B:
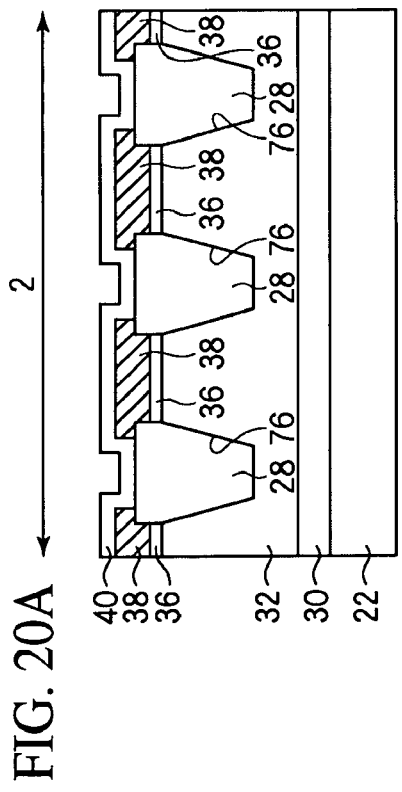
Figure 22A:
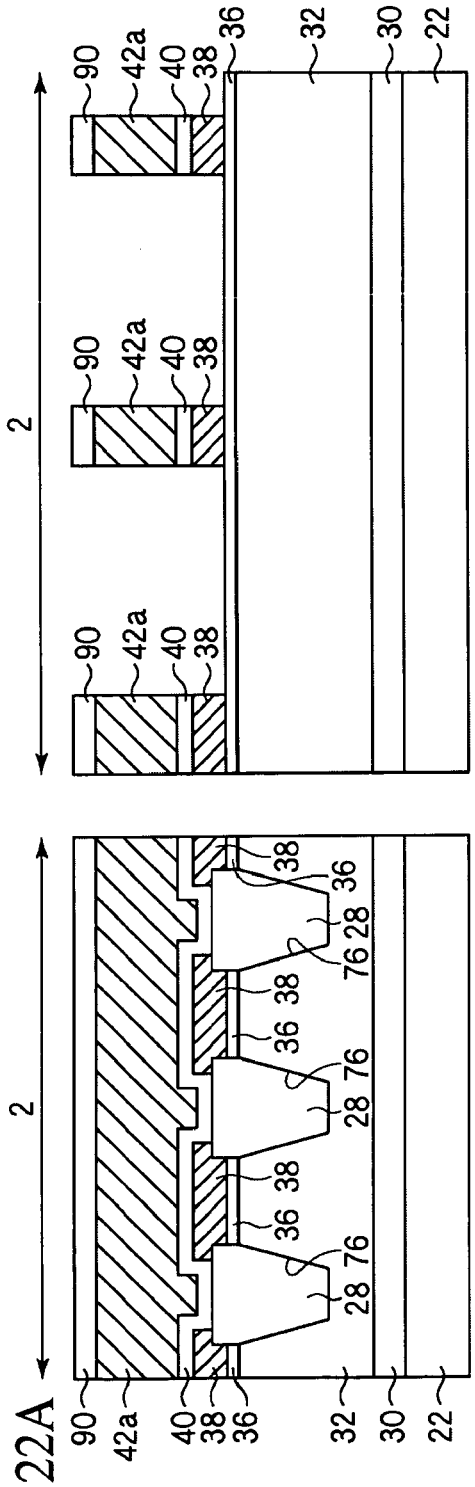
Figure 22B:
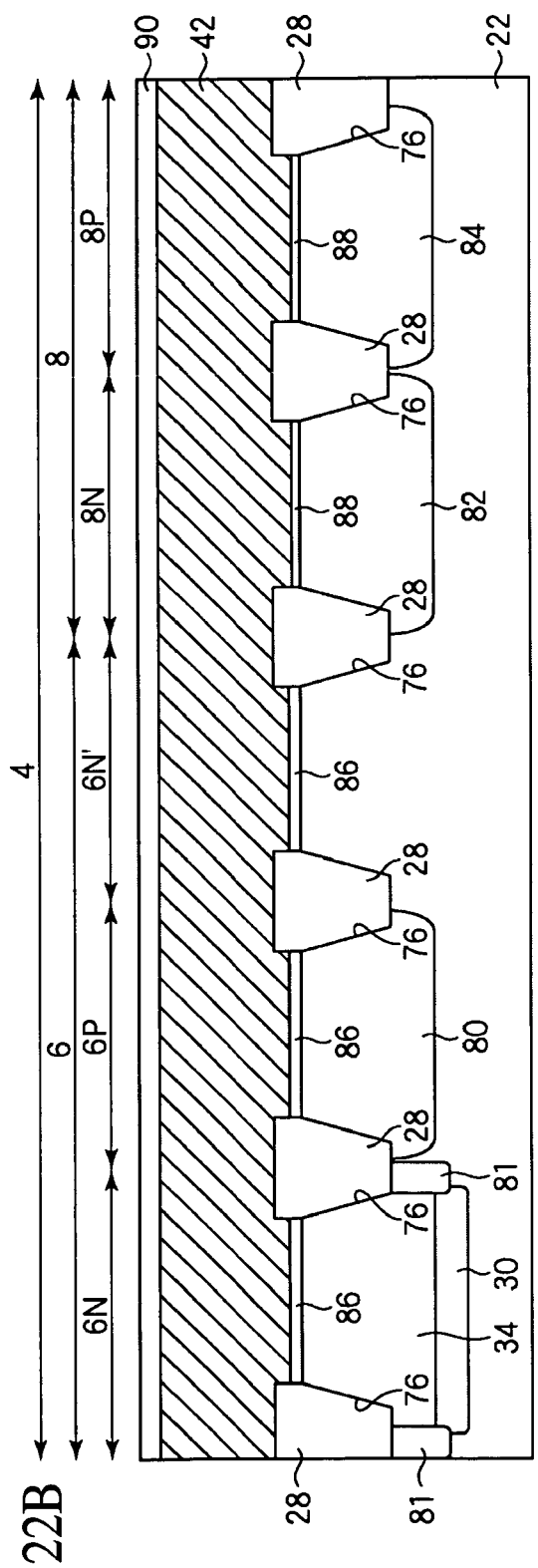
Figure 23A:
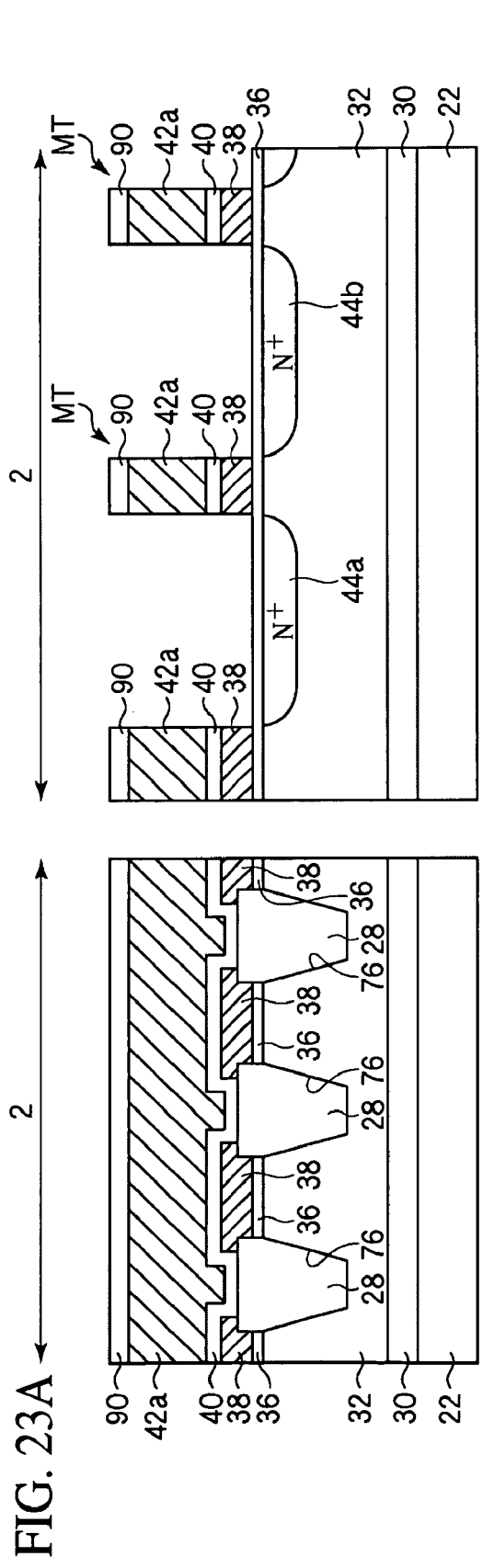
Figure 23B:
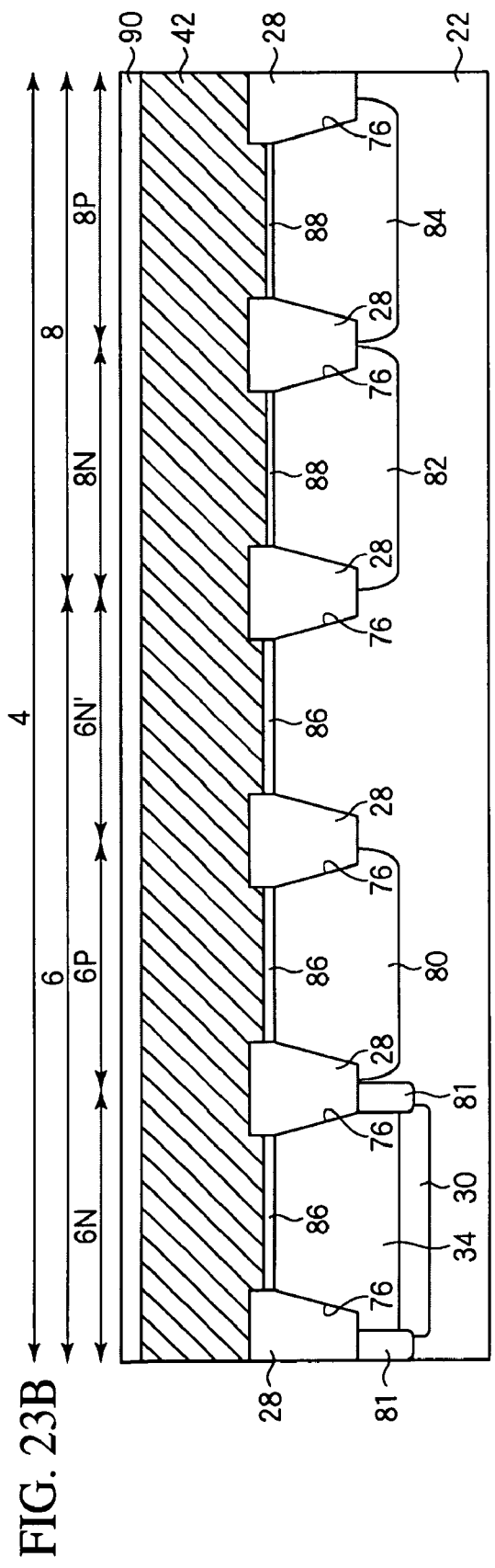
Figure 25A:
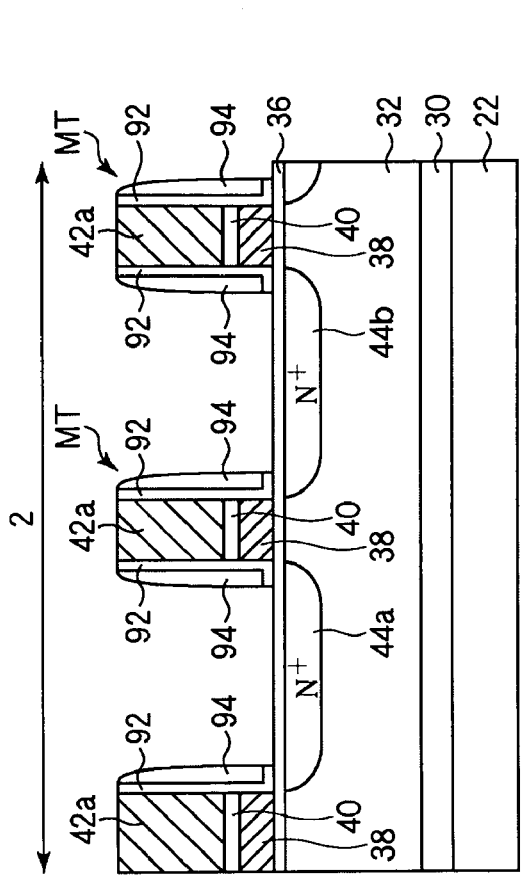
Figure 25B:
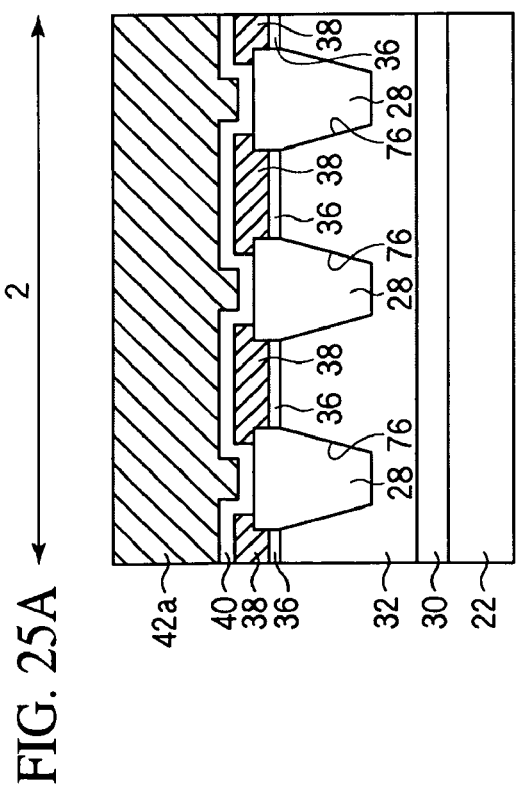

Next, by, e.g., thermal oxidation, a sacrifice oxide film 78 is formed on the surface of the semiconductor substrate 22 (see FIGS. 16A and 16B).

Then, an N-type dopant impurity is implanted into the memory cell array region 2 to form a buried N-type well 30. At this time, the N-type dopant impurity is implanted also into the region 6N, where high breakdown voltage N-channel transistors are to be formed to thereby form a buried N-type well 30.

Then, a P-type dopant impurity is implanted into the memory cell array region 2 to form the first P-type well 32. At this time, the P-type dopant impurity is implanted also into the region 6N, where high breakdown voltage N-channel transistors are to be formed to thereby form the second P-type well 34.

Then, an N-type dopant impurity is implanted into the region 6P where high breakdown voltage N-channel transistors are to be formed to thereby form an N-type well 80. At this time, the N-type well 81 is formed, surrounding the P-type wells 32, 34 to thereby form a triple well. Resultantly, the first P-type well 32 and the second P-type well 34 are electrically isolated from each other.

Next, channel doping is made into the regions 6N, 6N', where the high breakdown voltage N-channel transistors are to be formed and into the region 6P, where the high breakdown voltage P-channel transistors are to be formed.

Next, by, e.g., wet etching using fluoric acid, the sacrifice oxide film 78 present on the surface of the semiconductor substrate 22 is removed.

Next, on the entire surface, a 10 nm-thickness tunnel insulation film 36 is formed by, e.g., thermal oxidation.

Next, a 90 nm-thickness polysilicon film 38, for example, is formed on the entire surface by, e.g., CVD (see FIGS. 17A and 17B).

Next, by photolithography and dry etching, the polysilicon film 38 in the memory cell array region 2 is patterned. At this time, the polysilicon oxide film 38 present in the peripheral circuit region 4 is removed.

Next, on the entire surface, a silicon oxide film, a silicon nitride film and a silicon oxide film are sequentially laid to thereby form an insulation film (ONO film) 40 of the silicon oxide film/silicon nitride film/silicon oxide film structure. The ONO film 40 includes the bottom oxide film in, e.g., a 5 nm-film thickness, the silicon nitride film in, e.g., an 8 nm-film thickness and the top oxide film in, e.g., a 5 nm-film thickness.

Next, in the region 8N, where low voltage N-channel transistors are to be formed, a P-type dopant impurity is implanted to form the P-type well 82.

Next, in the region 8P, where low voltage P-channel transistors are to be formed, an N-type dopant impurity is implanted to form the N-type well 84 (see FIGS. 18A and 18B).

Next, channel doping is made into the region 8N, where the low voltage N-channel transistors are to be formed, and the region 8P, where the low voltage P-channel transistors are to be formed.

Next, the insulation film (NON film) 40 present in the peripheral circuit region 4 is etched off.

Next, on the entire surface of the peripheral circuit region 4, a 15 nm-thickness thermal oxide film 86, for example, is formed by, e.g., thermal oxidation (see FIGS. 19A and 19B).

Then, by, e.g., wet etching, the thermal oxide film 86 present in the region 8, where low voltage transistors are to be formed, is removed.

Then, by, e.g., thermal oxidation, on the entire surface of the peripheral circuit region 4, a 3 nm-thickness thermal oxide film 88 is formed. Thus, in the region 8, where low voltage transistors are to be formed, a gate insulation film 88 of thermal oxide film of, e.g., a 3 nm-thickness is formed. On the other hand, in the region 6, where high breakdown voltage transistors are to be formed, a gate insulation film 86 of thermal oxide film of, e.g., 16 nm-thickness is formed (see FIGS. 20A and 20B).

Then, a 180 nm-thickness silicon oxide film 42, for example, is formed on the entire surface by, e.g., CVD.

Next, a anti-reflection coating 90 is formed on the entire surface (see FIGS. 21A and 21B). As the anti-reflection coating 90, silicon nitride film, for example, is formed.

Next, by photolithography and dry etching, the anti-reflection film 90, the polysilicon film 42, the insulation film 40 and the polysilicon film 38 are patterned. Thus, in the memory cell array 2, stacked bodies respectively of the floating gates 38 of a polysilicon film and control gates 42a of a polysilicon film are formed (see FIGS. 22A and 22B).

Next, by photolithography, a photoresist film (not illustrated) covering the peripheral circuit region 4 and exposing the memory cell array region 2 is formed.

Next, with the photoresist film as the mask, an N-type dopant impurity is implanted into the semiconductor substrate 22. Thus, impurity diffused layers 44a, 44b are formed in the semiconductor substrate 22 on both sides of the floating gates 38 (see FIGS. 23A and 23B). Then, the photoresist film is removed.

Thus, memory cell transistors MT each including the floating gate 38, the control gate 42a, and the source/drain diffused layers 44a, 44b are formed.

Next, by thermal oxidation, a silicon oxide film 92 is formed on the side walls of the floating gates 38 and the side walls of the control gates 42a.

Then, on the entire surface, a 5 nm-thickness silicon nitride film 94, for example, is formed by, e.g., CVD.

Next, the silicon nitride film 94 is anisotropically etched by dry etching to form a sidewall insulation film 94 of silicon nitride film (see FIGS. 24A and 24B). At this time, the anti-reflection film 90 is etched off.

Then, by photolithography and dry etching, the polysilicon film 42 in the region 6, where high breakdown voltage transistors are to be formed, and in the region 8, where low voltage transistors are to be formed, is patterned. Thus, gate electrodes 96 of the polysilicon film 42 are formed as the gate electrodes of the high breakdown voltage transistors. As the gate electrodes of the low voltage transistors, gate electrodes 98 of the polysilicon film 42 are formed.

Next, by photolithography, a photoresist film (not illustrated) which exposes the regions 6N, 6N', where high breakdown voltage N-channel transistors are to be formed, and covers the reset region is formed.

Then, with the photoresist film as the mask, an N-type dopant impurity is implanted into the semiconductor substrate 22. Thus, an N-type lightly doped diffused layer 100 is formed in the semiconductor substrate 22 on both sides of the gate electrodes 96 of the high breakdown voltage N-channel transistors. Then, the photoresist film is removed.

Then, by photolithography, a photoresist film (not illustrated) which exposes the region 6P, where high breakdown voltage P-channel transistors are to be formed, and covers the rest region is formed.

Then, with the photoresist film as the mask, a P-type dopant impurity is implanted into the semiconductor substrate 22. Thus, a P-type lightly doped diffused layer 102 is formed in the semiconductor substrate 22 on both sides of the gate electrodes 96 of the high breakdown voltage P-channel transistors. Then, the photoresist film is removed.

Next, by photolithography, a photoresist film (not illustrated) which exposes the region 8N, where low voltage N-channel transistors are to be formed, and covers the reset region is formed.

Then, with the photoresist film as the mask, an N-type dopant impurity is implanted into the semiconductor substrate 22. Thus, an N-type lightly doped diffused layer 104 is formed in the semiconductor substrate 20 on both sides of the gate electrodes 98 of the low voltage N-channel transistors. Then, the photoresist film is removed.

Then, by photolithography, a photoresist film (not illustrated) which exposes the region 8P, where low voltage P-channel transistors are to be formed, and covers the reset region is formed.

Then, with the photoresist film as the mask, a P-type dopant impurity is implanted into the semiconductor substrate 22. Thus, a P-type lightly doped diffused layer 106 is formed in the semiconductor substrate 22 on both sides of the gate electrodes 98 of the low voltage P-channel transistors. Then, the photoresist film is removed (see FIGS. 25A and 25B).

Next, on the entire surface, a 100 nm-thickness silicon oxide film 108, for example, is formed by, e.g., CVD.

Next, by dry etching, the silicon oxide film 108 is anisotropically etched to thereby a sidewall insulation film 108 of silicon oxide film on the side walls of the stacked bodies respectively of the floating gates 38 and the control gate 42a. The sidewall insulation film 108 of silicon oxide film is also formed on the side walls of the gate electrodes 96. The sidewall insulation film 108 of silicon oxide film is also formed on the side walls of the gate electrodes 98.

Next, by photolithography, a photoresist film (not illustrated) which exposes the regions 6N, 6N', where high voltage N-channel transistors are to be formed, and covers the rest region is formed.

Then, with the photoresist film as the mask, an N-type dopant impurity is implanted into the semiconductor substrate 22. Thus, an N-type heavily doped impurity layer 110 is formed in the semiconductor substrate 22 on both sides of the gate electrodes 96 of the high breakdown voltage N-channel transistors. The N-type lightly doped diffused layer 100 and the N-type heavily doped diffused layer 110 form N-source/drain diffused layer 112 of the LDD structure. Thus, high breakdown voltage N-channel transistors 114N, 114N' respectively including the gate electrode 96 and the source/drain diffused layer 112 are formed. The high break down voltage N-channel transistor 114N formed in the second P-type well 34 is used as a first transistor T1 and a second transistor T2 of a column leak prevention circuit 18.

Next, by photolithography, a photoresist film (not illustrated) which exposes the region 6P where high breakdown voltage P-channel resistors are to be formed and covers the rest region is formed.

Next, with the photoresist film as the mask, a P-type dopant impurity is implanted into the semiconductor substrate 22. Thus, a P-type heavily doped diffused layer 116 is formed in the semiconductor substrate 22 on both sides of the gate electrodes 96 of the high breakdown voltage P-channel transistors. The P-type lightly doped diffused layer 102 and the P-type heavily doped diffused layer 116 form the P-type source/drain diffused layers 118a of the LDD structure. Thus, the high breakdown voltage P-channel transistors 114P each including the gate electrode 96 and the source/drain diffused layer 118 are formed. Then, the photoresist film is removed.

Then, by photolithography, a photoresist film (not illustrated) which exposes the region 8N, where low voltage N-channel transistors are to be formed, and covers the rest region is formed.

Next, with the photoresist film as the mask, an N-type dopant impurity is implanted into the semiconductor substrate 22. Thus, an N-type heavily doped diffused layer 120 is formed in the semiconductor substrate 22 on both sides of the gate electrodes 98 of the low voltage N-channel transistors. The N-type lightly doped diffused layer 104 and the N-type heavily doped diffused layer 120 form an N-source/drain diffused layer 122 of the LDD structure. Thus, low breakdown voltage N-channel transistors 124N each including the gate electrode 98 and the source/drain diffused layer 122 are formed. Then, the photoresist film is removed.

Next, by photolithography, a photoresist film (not illustrated) which exposes the region 8P where low breakdown voltage P-channel transistors are to be formed and the covers the rest region is formed.

Next, with the photoresist film as the mask, a P-type dopant impurity is implanted into the semiconductor substrate 22. Thus, in the semiconductor substrate 22 on both sides of the gate electrodes 98 of the low breakdown voltage P-channel transistors, a P-type heavily doped diffused layer 126 is formed. The P-type lightly doped diffused layer 106 and the P-type heavily doped diffused layer 126 form the source/drain diffused layers 128 of the LDD structure. Thus, the low breakdown voltage P-channel transistors 124P each including the gate electrode 98 and the source/drain diffused layer 128 are formed. Then, the photoresist film is removed.

Thus, in the peripheral circuit region 4, the high breakdown voltage N-channel transistors 114N, 114N', the high breakdown voltage P-channel transistors 114P, the low voltage N-channel transistors 124N and the low voltage P-channel transistors 124P are formed (see FIGS. 26A and 26B).

Then, by, e.g., sputtering, a 10 nm-thickness cobalt film, for example, is formed.

Next, thermal processing is made to react the silicon atoms in the surface of the semiconductor substrate 22 and the cobalt atoms in the cobalt film with each other. The silicon atoms in the surfaces of the control gates 42a and the gate electrodes 96, 98 and the cobalt atoms in the cobalt film are reacted with each other. Thus, a cobalt silicide film 130 is formed on the source/drain diffused layers 44a, 44b. On the control gates 42a, the cobalt silicide film 130 is formed. On the source/drain diffused layers 112, 118, 122, 128, the cobalt silicide film 130 is formed. On the gate electrodes 96, 98, the cobalt silicide film 130 is formed.

Figure 27A:
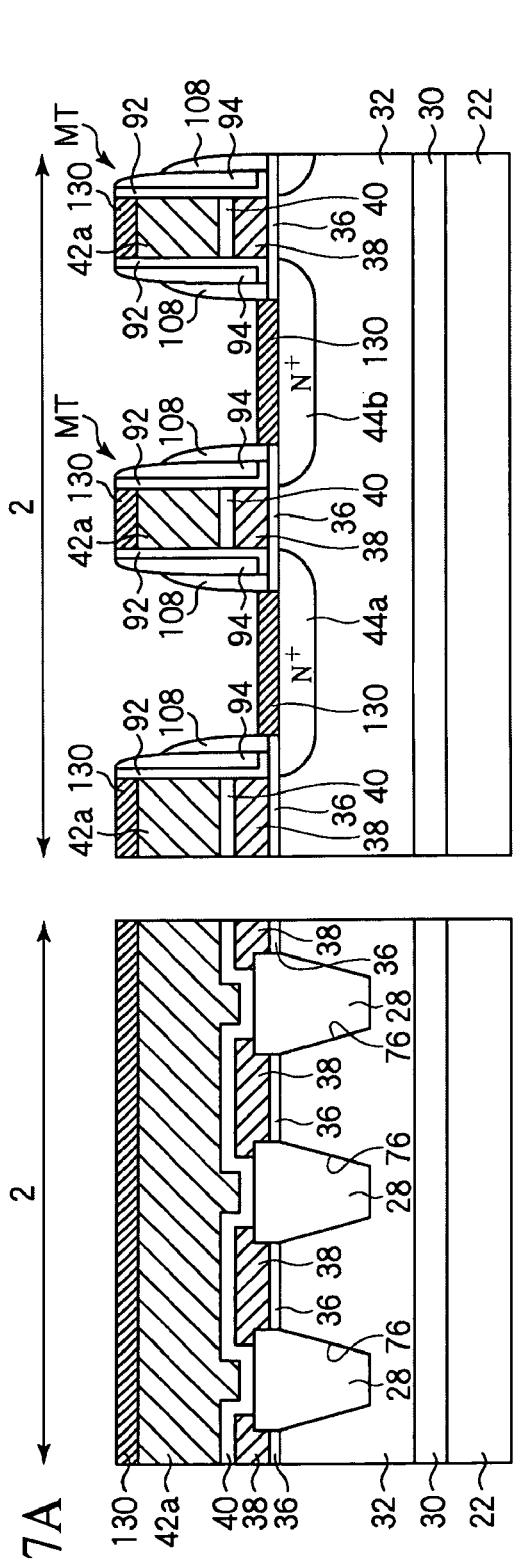
Figure 27B:
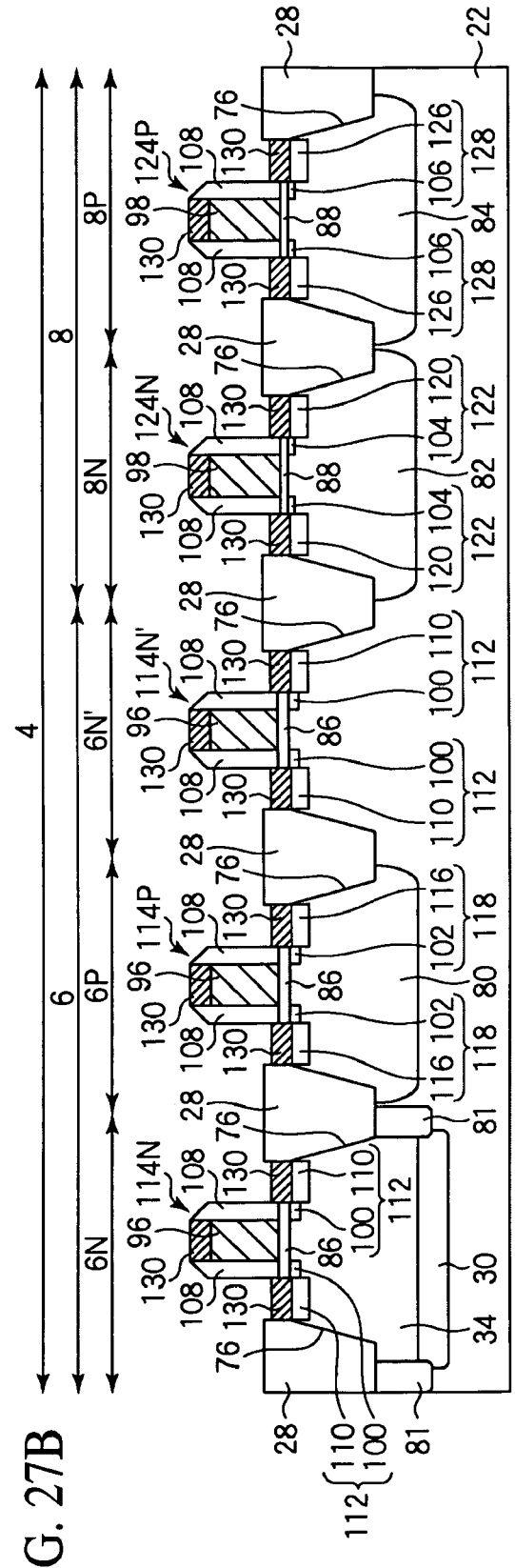

Then, that of the cobalt film, which has not reacted is etched off (FIGS. 27A and 27B).

Then, a 20 nm-thickness silicon nitride film 132, for example, is formed on the entire surface by, e.g., CVD. The silicon nitride film 132 acts as an etching stopper.

Next, a 1600 nm-thickness BPSG film 134, for example, is formed on the entire surface by, e.g., CVD. The silicon nitride film 132 and the BPSG film 134 form an inter-layer insulation film 136.

Figure 28:
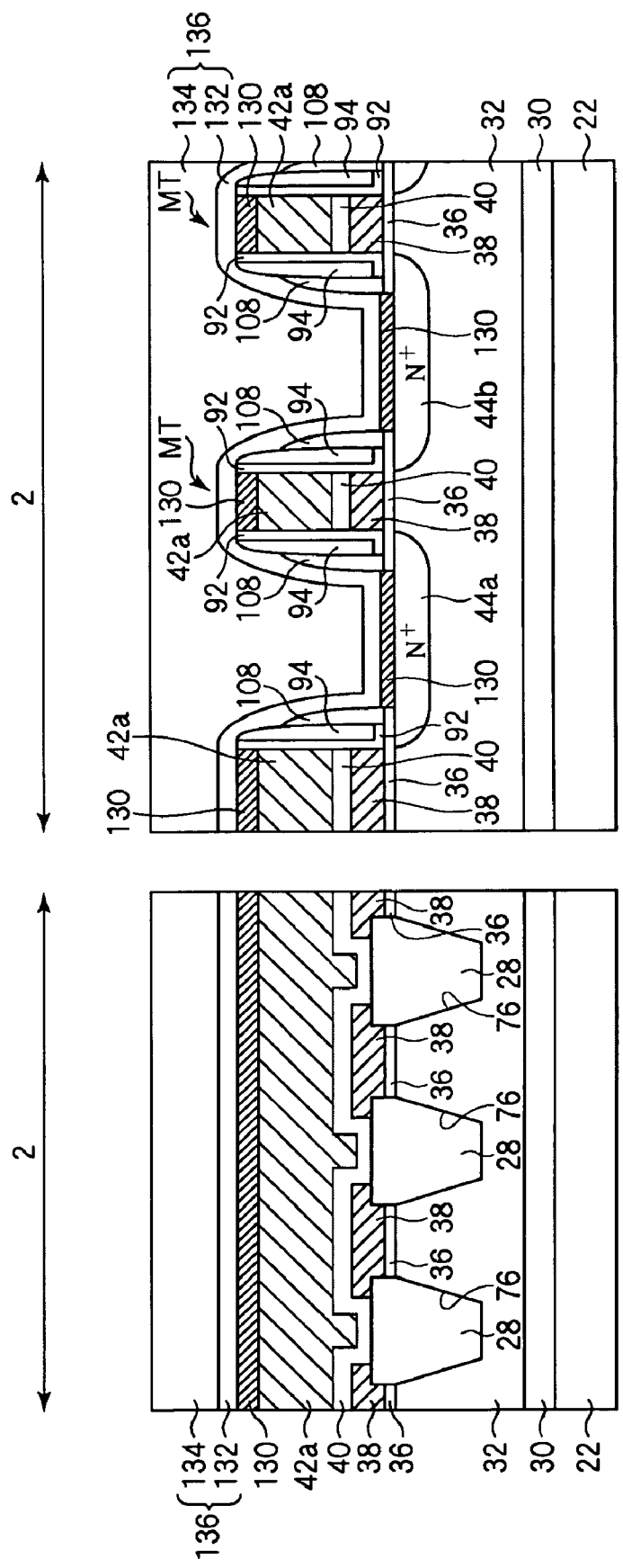
Figure 29:
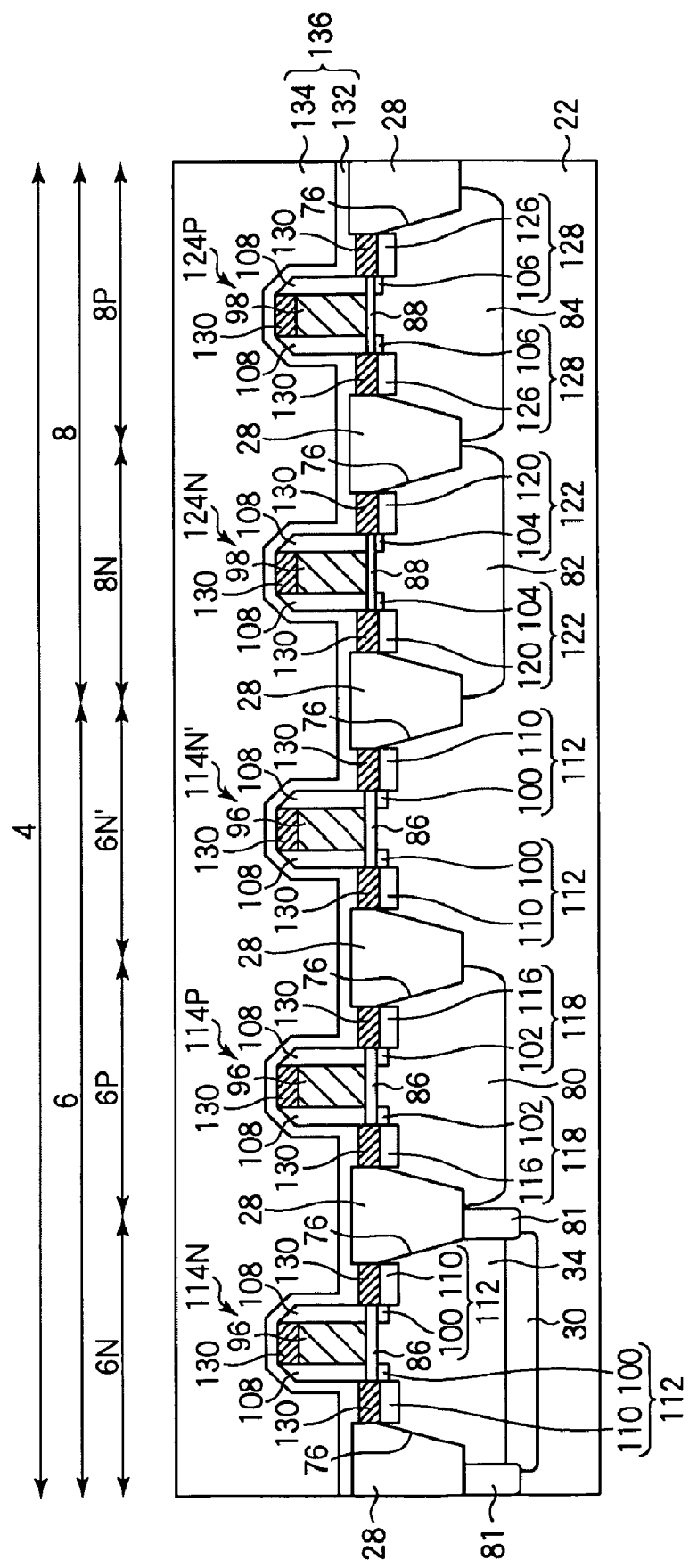
Figure 30:
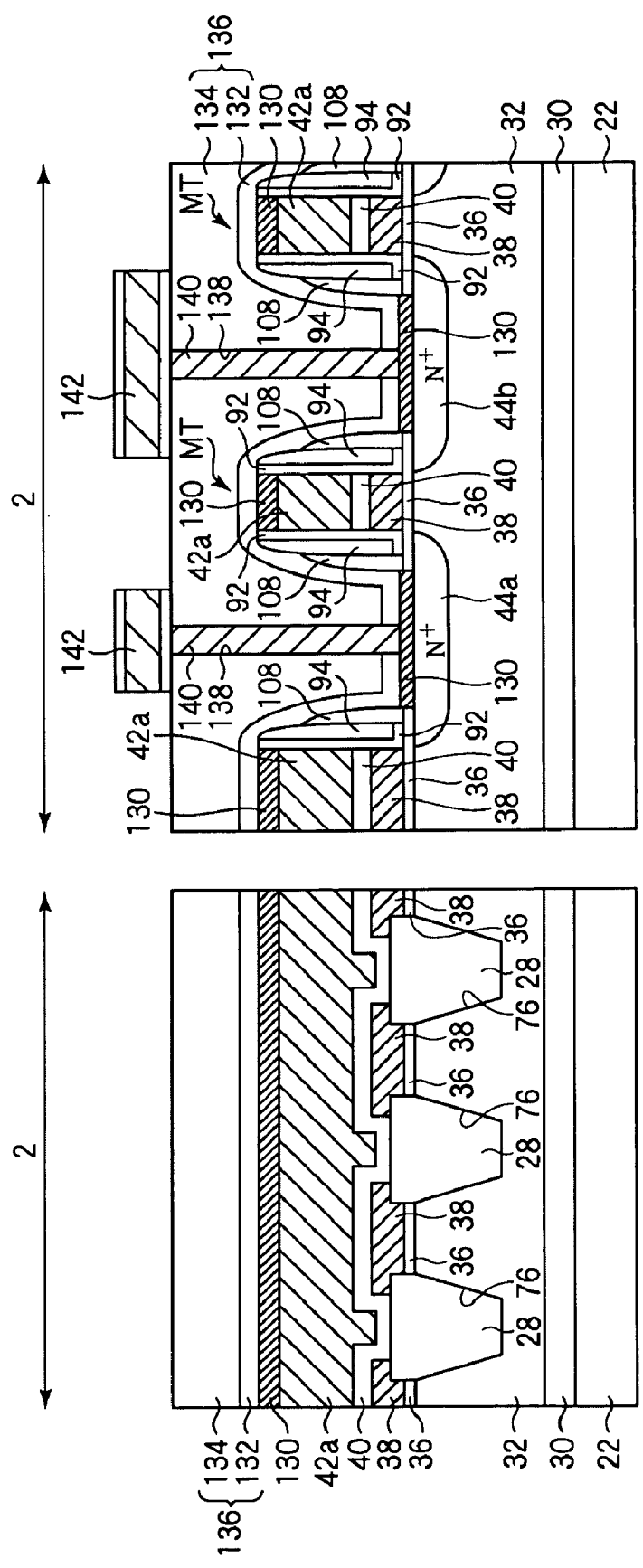
Figure 31:
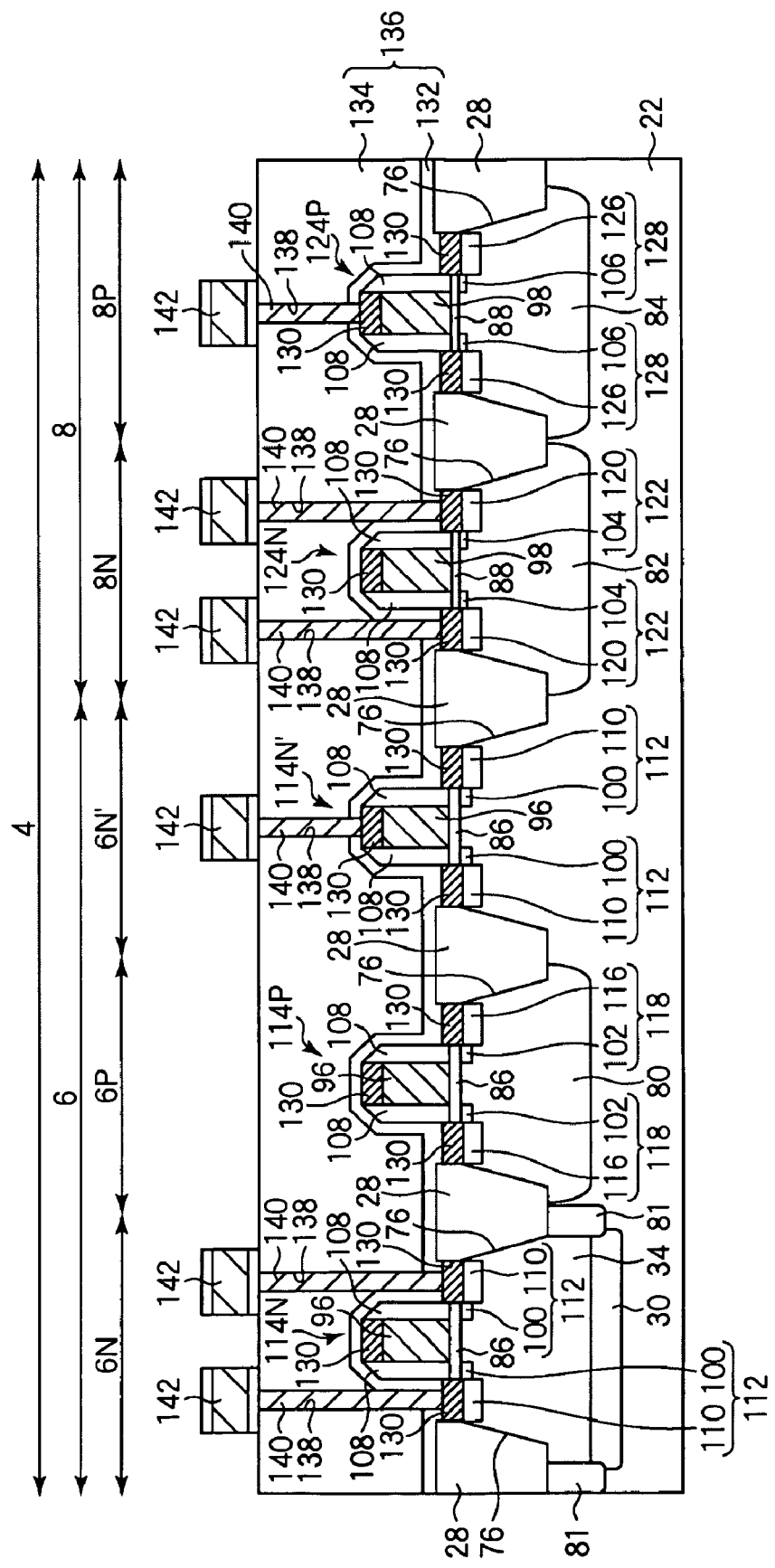

Next, the surface of the inter-layer insulation film 136 is planarized (see FIGS. 28 and 29).

Next, by photolithography and dry etching, contact holes 138 are formed in the inter-layer insulation film 136 down to the cobalt silicide film 130 on the source/rain diffused layers 44a, 44b. Contact holes 138 are formed down to the cobalt silicide film 130 on the source/drain diffused layer 112. Contact holes 138 are formed down to the cobalt silicide film 130 on the gate electrodes 96. Contact gates 138 are formed down to the cobalt silicide film 130 on the source/drain diffused layer 122. Contact holes 138 are formed down to the cobalt silicide film 130 on the gate electrodes 98.

Next, on the entire surface, a 30 nm-thickness titanium (Ti) film, for example, and a 20 nm-thickness titanium nitride (TiN) film, for example, are sequentially formed by sputtering to form a barrier film (not illustrated) of the Ti film and TiN film.

Next, on the entire surface, a 300 nm-thickness tungsten film 140, for example, is formed by, e.g., CVD.

Then, the tungsten film 140 and the barrier film are polished by CMP until the surface of the inter-layer insulation film 136 is exposed. Thus, conductor plugs 140 of tungsten are buried in the contact holes 138.

Then, a 60 nm-thickness Ti film, for example, a 30 nm-thickness TiN film, a 360 nm-thickness aluminum film, a 5 nm-thickness Ti film and a 70 nm-thickness TiN film, for example are sequentially formed by, e.g., sputtering on the inter-layer insulation film 136 with the conductor plugs 140 buried in to form a layer film 142 of these films.

Then, by photolithography and dry etching, the layer film 142 is patterned. Thus, the first metal interconnection layer (the first interconnection layer) 142 of the layer film is formed (see FIGS. 30 and 31). In the first metal interconnection layer 142, the source lines SL, etc. are formed (see FIG. 4).

Figure 32:
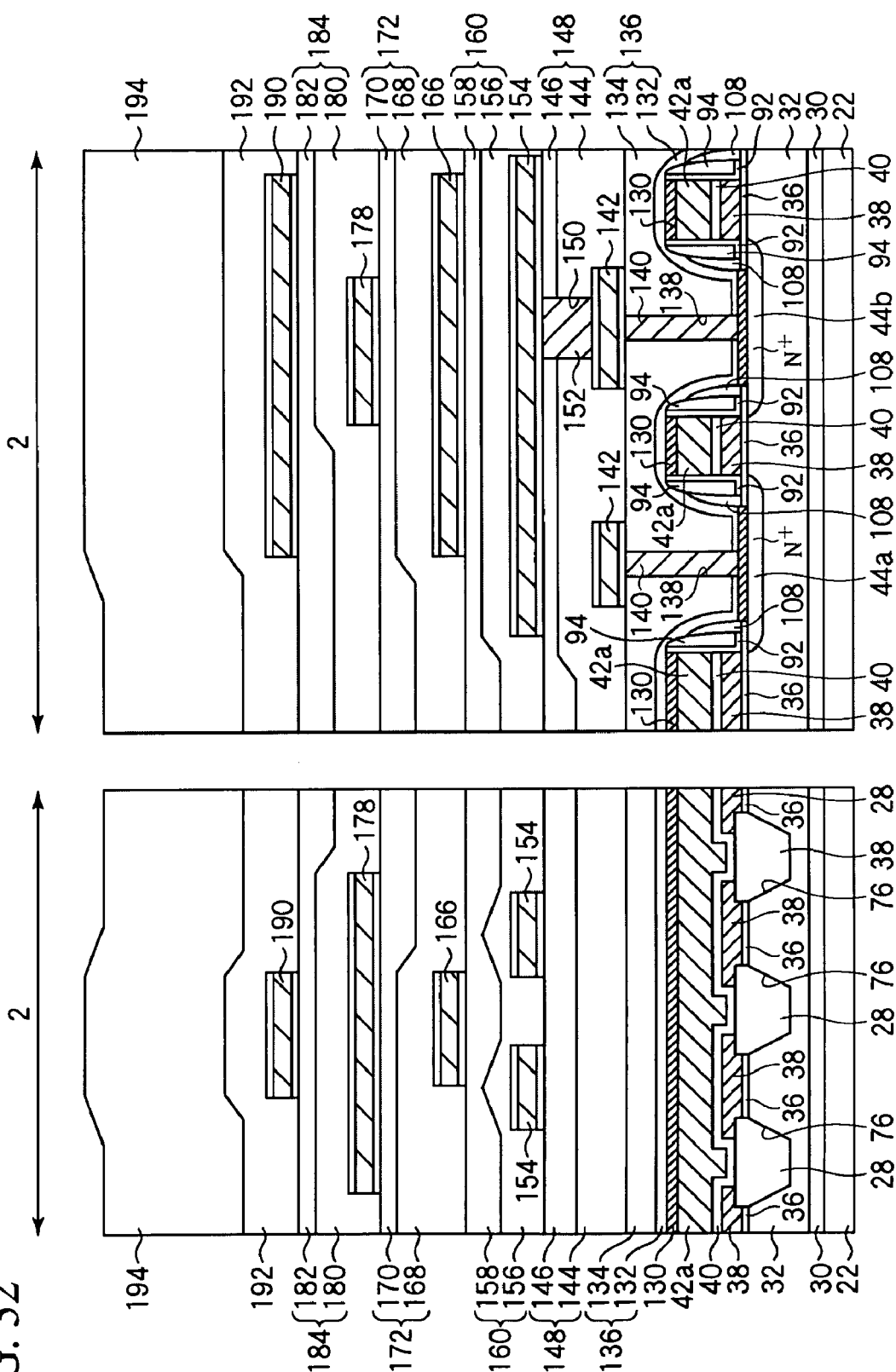
Figure 33:
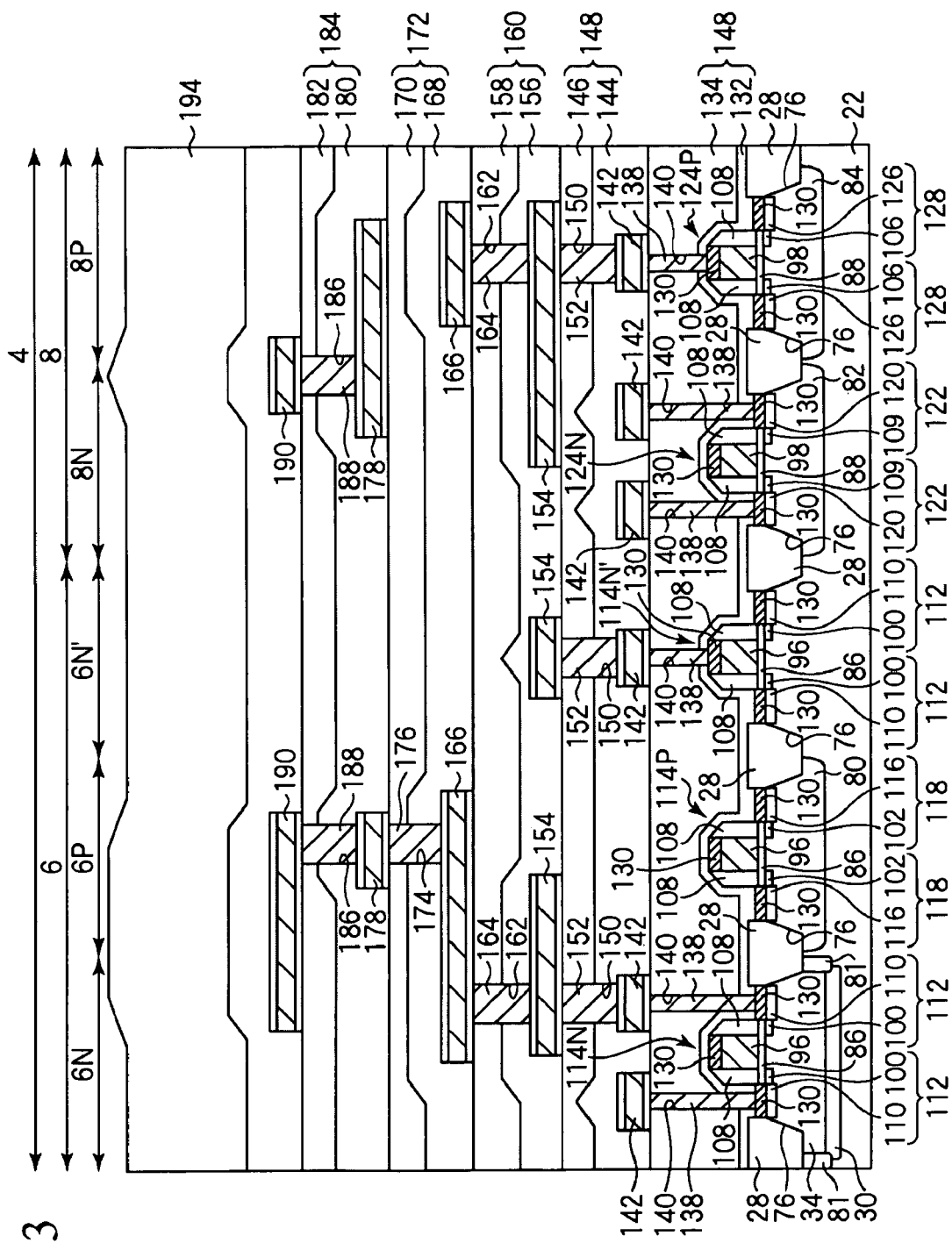

Then, as illustrated in FIGS. 32 and 33, on the inter-layer insulation film 136 with the first metal interconnection layer 142 formed on, a 720 nm-thickness silicon oxide film 144, for example, is formed by, e.g., high density plasma CVD.

Then, on the silicon oxide film 144, a 1100 nm-thickness silicon oxide film 146, for example, is formed by, e.g., CVD using TEOS as the raw material. The silicon oxide film 144 and the silicon oxide film 146 form an inter-layer insulation film 148.

Then, the surface of the inter-layer insulation film 148 is planarized by CMP.

Next, by photolithography and dry etching, contact holes 150 are formed in the inter-layer insulation film 148 down to the first metal interconnection layer 142.

Then, a 10 nm-thickness Ti film, for example, and a 7 nm-thickness TiN film, for example, are sequentially formed on the entire surface by sputtering, and a barrier film (not illustrated) is formed of the Ti film and the TiN film.

Then, a 300 nm-thickness tungsten film 152 is formed on the entire surface by, e.g., CVD.

Next, the tungsten film 152 and the barrier film are polished by CMP until the surface of the inter-layer insulation film 148 is exposed. Thus, in the contact holes 150, conductor plugs 152 of tungsten are buried.

Next, by, e.g., sputtering, on the inter-layer insulation film 148 with the conductor plugs 152 buried in, the identical layer film 154 as the layer film 142 is formed.

Next, by photolithography and dry etching, the layer film 154 is patterned. Thus, the second metal interconnection layer (the second interconnection layer) 154 of the layer film is formed. In the second metal layer 154, the bit lines BL, the ground line GL, etc. are formed (see FIG. 5).

Next, on the inter-layer insulation film 148 with the second metal interconnection layer 154 formed on, a silicon oxide film 156 is formed by, e.g., high density plasma CVD.

Then, on the silicon oxide film 156, a silicon oxide film 158 is formed by, e.g., CVD using TEOS as the raw material. The silicon oxide film 156 and the silicon oxide film 158 form an inter-layer insulation film 160.

Next, the surface of the inter-layer insulation film 160 is planarized by CMP.

Next, by photolithography and dry etching, contact holes 162 are formed in the inter-layer insulation film 160 down to the second metal interconnection layer 154.

Then, a Ti film and a TiN film are sequentially formed on the entire surface by sputtering to form a barrier film (not illustrated) of the Ti film and the TiN film.

Next, a tungsten film 164 is formed on the entire surface by, e.g., CVD.

Then, the tungsten film 164 and the barrier film are polished by CMP until the surface of the inter-layer insulation film 160 is exposed. Thus, conductor plugs 164 of tungsten are buried in the contact holes 162.

Then, by, e.g., sputtering, the identical layer film 166 as the layer film 142 is formed is formed on the inter-layer insulation film 160 with the conductor plugs 164 buried in.

Next, by photolithography and dry etching, the layer film 166 is patterned. Thus, the third metal interconnection layer 166 is formed of the layer film.

Next, on the inter-layer insulation film 160 with the third metal interconnection layer 166 formed on, a silicon oxide film 168 is formed by, e.g., high density plasma CVD.

Then, on the silicon oxide film 168, a silicon oxide film 170 is formed by, e.g., CVD using TEOS as the raw material. The silicon oxide film 168 and the silicon oxide film 170 form an inter-layer insulation film 172.

Next, the surface of the inter-layer insulation film 172 is planarized by CMP.

Next, by photolithography and dry etching, contact holes 174 are formed in the inter-layer insulation film 172 down to the third metal interconnection layer 166.

Next, on the entire surface, a Ti film and a TiN film are sequentially formed by sputtering to form a barrier film (not illustrated) of the Ti film and the TiN film.

Then, a tungsten film 176 is formed on the entire surface by, e.g., CVD.

Next, the tungsten film 176 and the barrier film are polished by CMP until the surface of the inter-layer insulation film 172 is exposed. Thus, conductor plugs 176 of tungsten are buried in the contact holes 174.

Next, on the inter-layer insulation film 172 with the conductor plugs 176 buried in, the identical layer film 178 as the layer film 142 is formed by, e.g., sputtering.

Next, by photolithography and dry etching, the layer film 178 is patterned. Thus, the fourth metal interconnection layer 178 of the layer film is formed.

Then, on the inter-layer insulation film 172 with the fourth metal interconnection layer 178 formed on, a silicon oxide film 180 is formed by, e.g., high density plasma CVD.

Next, on the silicon oxide film 180, a silicon oxide film 182 is formed by, e.g., CVD using TEOS as the raw material. The silicon oxide film 180 and the silicon oxide film 182 form an inter-layer insulation film 184.

Next, the surface of the inter-layer insulation film 184 is planarized by CMP.

Next, by photolithography and dry etching, contact holes 186 are formed in the inter-layer insulation film 184 down to the fourth metal interconnection layer 178.

Next, on the entire surface, a Ti film and a TiN film are sequentially formed by sputtering to form a barrier film (not illustrated) of the layer film of the Ti film and the Ni film.

Next, a tungsten film 188 is formed on the entire surface by, e.g., CVD.

Next, the tungsten film 188 and the barrier film are polished by CMP until the surface of the inter-layer insulation film 184 is exposed. Thus, conductor plugs 188 of tungsten are buried in the contact holes 186.

Next, on the inter-layer insulation film 184 with the conductor plugs 188 buried in, the identical layer film 190 as the layer film 142 is formed by, e.g., sputtering.

Then, the layer film 190 is patterned by photolithography and dry etching. Thus, the fifth metal interconnection layer 190 of the layer film is formed.

Next, on the inter-layer insulation film 184 with the fifth metal interconnection layer 190 formed on, a silicon oxide film 192 is formed by, e.g., high density plasma CVD.

Next, on the silicon oxide film 192, a 1000 nm-thickness silicon nitride film 194 is formed by, e.g., plasma CVD. A cover film is formed of the silicon nitride film 194.

Thus, the semiconductor memory device according to the present embodiment is manufactured.

[b] Second Embodiment

The method for driving the semiconductor memory device according to a second embodiment will be explained with reference to FIG. 34. FIG. 34 is a view of voltages of the respective parts of the semiconductor memory device in the method for driving the semiconductor memory device according to the present embodiment. In FIG. 34, the voltages in the parentheses are voltages of non-selected lines. The identical members of the present embodiment as those of the semiconductor memory device, etc. according to the first embodiment illustrated in FIGS. 1 to 33 are represented by the identical reference numbers not to repeat or to simplify their explanation.

The constitution of the semiconductor memory device according to the present embodiment is the identical as the constitution of the semiconductor memory device according to the first embodiment described above with reference to FIGS. 1 to 6B.

In the method for driving the semiconductor memory device according to the present embodiment, in the read operation, a positive voltage of, e.g., 0.5 V is constantly applied to all the bit lines BL by the bit line drive circuit 14 to set the voltage of all the bit lines BL on standby state at, e.g., 0.5 V.

The method for reading the semiconductor memory device according to the present embodiment will be explained with reference to FIG. 34.

When information stored in the memory cell transistors MT, the voltages of the respective parts are set depicted as FIG. 34.

To the control line CL, a positive voltage of, e.g., 5 V is constantly applied by the control circuit 20. Thus, the first transistors T1 are constantly on-state.

Respectively to the first P-type well 32 and the second P-type well 34, 0 V is applied.

Next, the address of a selected memory cell transistor MTs is decided.

The voltage of the word lines WL on standby state is 0 V. On the other hand, to all the bit line BL, a positive voltage of, e.g., 0.5 V is constantly applied by the bit line drive circuit 14. Accordingly, the voltage of the all the bit lines BL is, e.g., 0.5 V even on standby state.

As described above, in the present embodiment, the voltage of the bit lines BL on standby state is the voltage required for the read. Thus, according to the present embodiment, the time from deciding the address of the selected memory cell transistor MTs to raising the voltage of the bit line BL can be saved, and the read speed can be increased.

Next, the bit line BL connected to the selected memory cell transistor MTs is connected to the sense amplifier 16.

Next, to the selected word line WLs, a positive voltage of, e.g., 3 V is applied by the word line drive circuit 12. The application of the voltage to the selected word line WLs turns the second transistors T2 connected to the selected word line WLs from off-state to on-state. On the other hand, the voltage of the word lines WL other than the selected word line WLs remains 0 V. Accordingly, the second transistors T2 connected to the word lines WL other than the selected word line WLs remain off state. Thus, in the present embodiment as well as in the first embodiment, the column leak can be prevented.

Then, current flowing in the bit line BL the selected memory cell transistor MTs is connected to is detected by the sense amplifier 16, and in the identical way as in the first embodiment, information stored in the selected memory cell transistor MTs is read.

As in the present embodiment, it is possible to apply a voltage necessary to read to all the bit lines BL constantly by the bit line drive circuit 14 to thereby set the voltage of the bit lines BL on standby state at the voltage necessary for the read. Thus, the time from deciding the address of the selected memory cell transistor MTs to raising the voltage of the bit line BL can be saved, whereby the read speed can be increased.

The method for writing and reading the semiconductor memory device according to the present embodiment are the identical as those of the semiconductor memory device according to the first embodiment.

[c] Third Embodiment

Figure 35A:
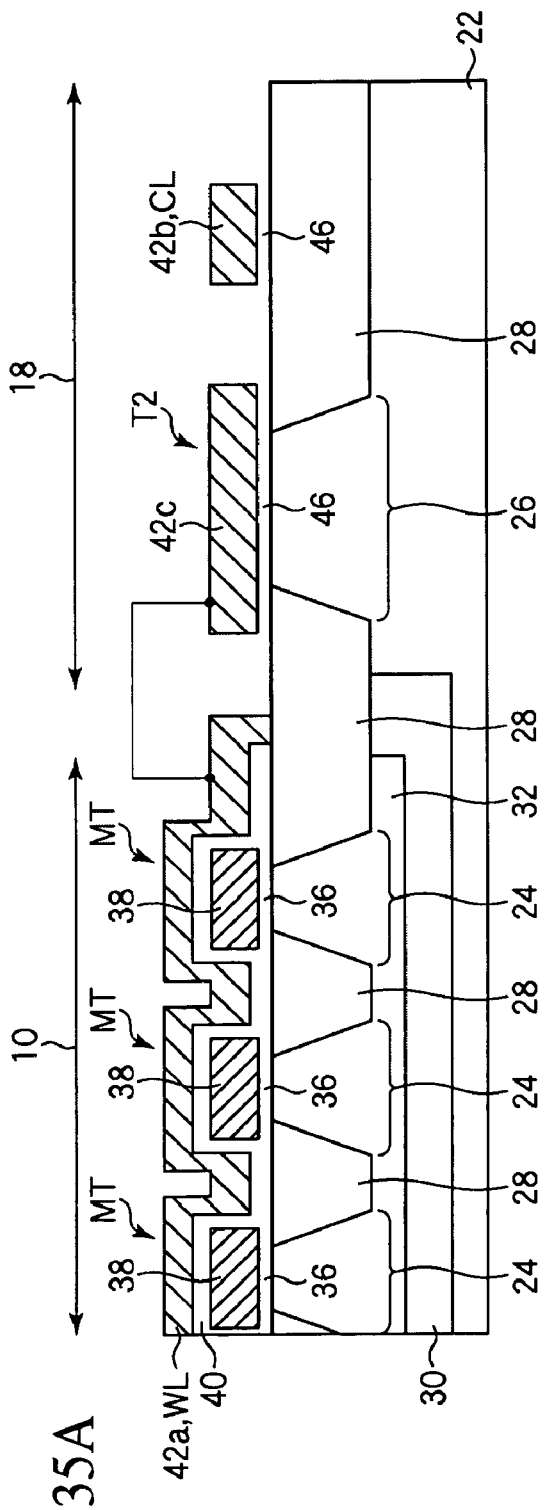
FIGS. 35A and 35B are sectional views of the memory cell array and the column leak prevention circuit of the semiconductor memory device according to a third embodiment.
Figure 35B:
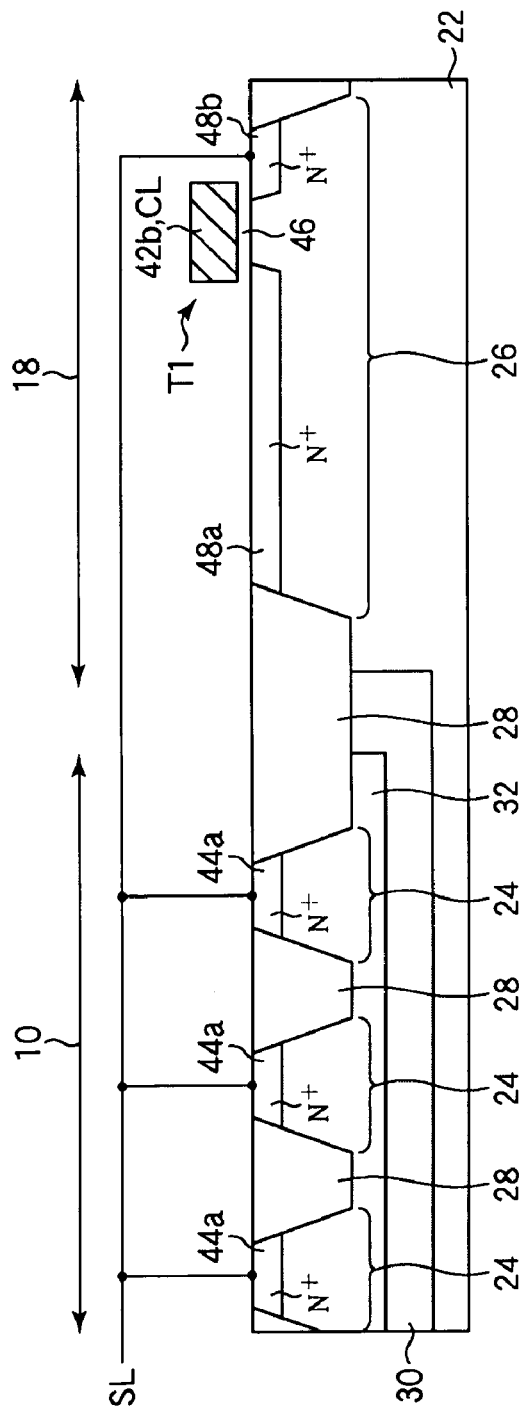

The semiconductor memory device according to a third embodiment will be explained with reference to FIG. 35A and 35B. FIGS. 35A and 35B are sectional views of the memory cell array and the column leak prevention circuit of the semiconductor memory device according to the present embodiment. The identical members of the present embodiment as those of the semiconductor memory device, etc. according to the first and the second embodiments illustrated in FIGS. 1 to 34 are represented by the identical reference numbers not to repeat or to simplify their explanation.

In the semiconductor memory device according to the present embodiment, the first transistors T1 and the second transistors T2 of the column leak prevention circuit 18 are not formed in the triple well and are formed on a P-type semiconductor substrate 22 in which no well is formed.

As illustrated in FIGS. 35A and 35B, in the P-type semiconductor substrate 22 in the region where a memory cell array 10 is to be formed, an N-type well 30 is formed. The N-type well 30 is not formed in the region where the column leak prevention circuit 18 is to be formed.

In the N-type well 30, the first P-type well 32 is formed. In the first P-type well 32, memory cell transistors MT are formed, as are in the semiconductor memory device according to the first embodiment.

However, no well is formed in the semiconductor substrate 22 in the region where the column leak prevention circuit 18 is to be formed.

The first transistors T1 and he second transistors T2 are formed on the semiconductor substrate 22 with no well formed in.

As in the present embodiment, the first transistors T1 and the second transistors T2 may not be formed in the triple well and formed on the semiconductor substrate 22 with no well formed in.

The structure of the semiconductor memory device according to the present embodiment is the identical as that of the semiconductor memory device according to the first embodiment except that in the former the first transistors T1 and the second transistors T2 are not formed in the triple well.

The method for reading, writing and erasing the semiconductor memory device according to the present embodiment are the identical as those of the reading, writing and erasing the semiconductor memory device according to the first embodiment.

[d] Fourth Embodiment

The semiconductor memory device according to a fourth embodiment and the method for driving the semiconductor memory device will be explained with reference to FIGS. 36 to 43. The identical members of the present embodiment as those of the semiconductor memory device according to the first to the third embodiments illustrated in FIGS. 1 to 35B are represented by the identical reference numbers not to repeat or to simplify their explanation.

(Semiconductor memory device)

Figure 36:
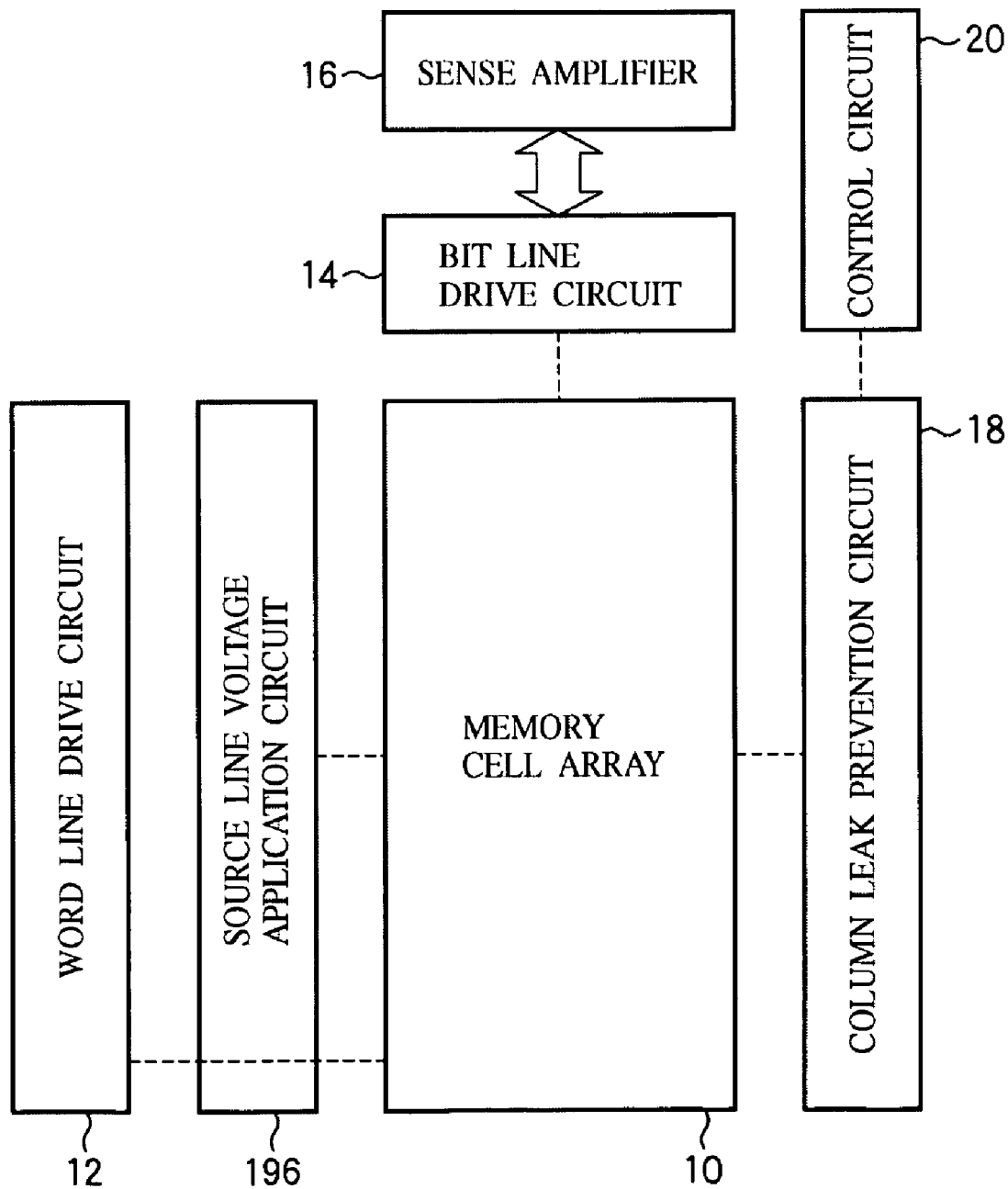
FIG. 36 is a diagrammatic view illustrating the circuit structure of the semiconductor memory device according to a fourth embodiment.
Figure 37:
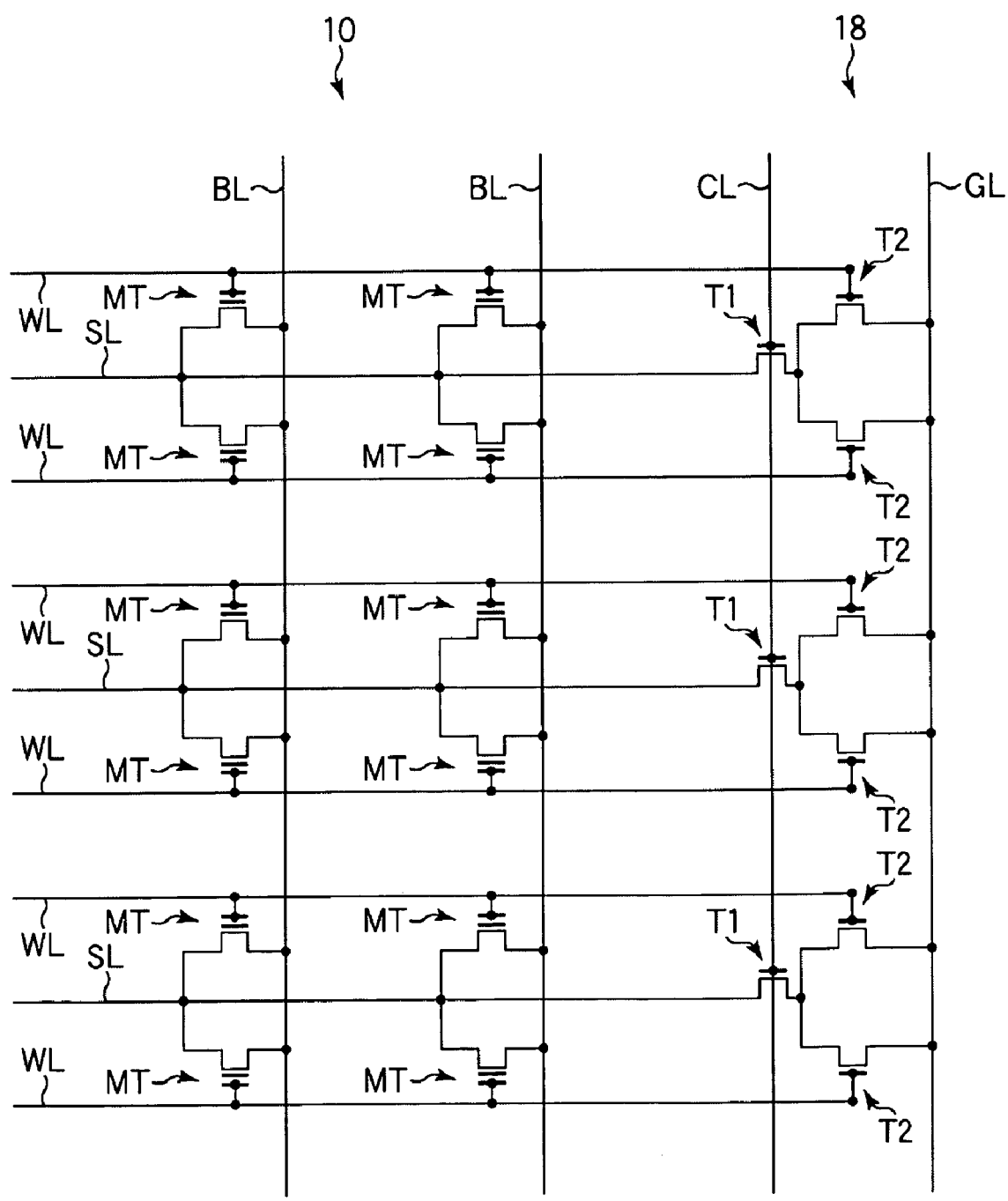
FIG. 37 is a circuit diagram of the memory cell array and the column leak prevention circuit of the semiconductor memory device according to the fourth embodiment.
Figure 38:
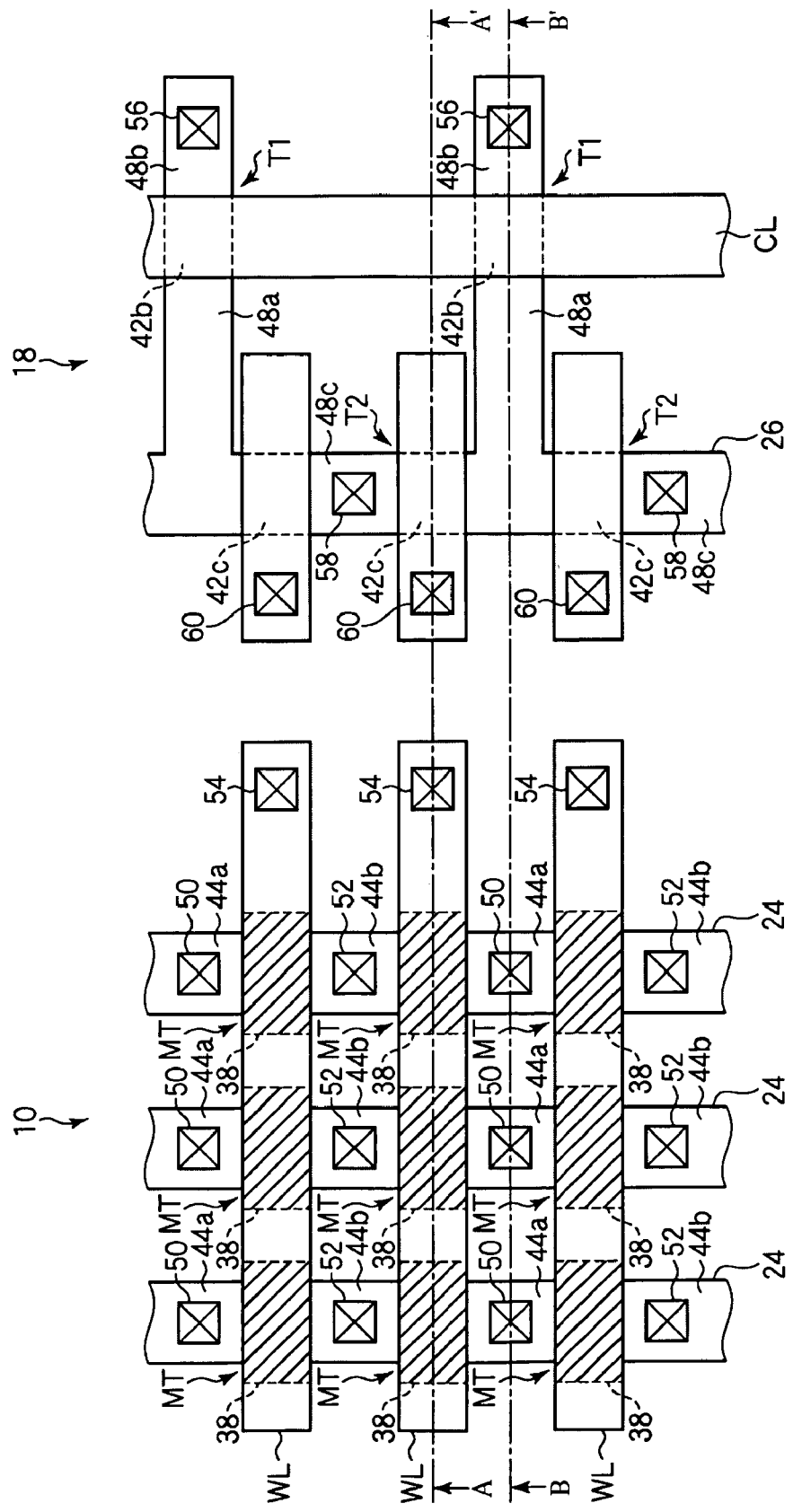
FIG. 38 is a plan view of the memory cell array and the column leak prevention circuit of the semiconductor memory device according to the fourth embodiment.

First, the semiconductor memory device according to the present embodiment will be explained with reference to FIGS. 36 to 39B. FIG. 36 is a diagrammatic view of the circuit structure of the semiconductor memory device according to the present embodiment. FIG. 37 is the circuit diagram of the memory cell array and the column leak prevention circuit of the semiconductor memory device according to the present embodiment. FIG. 38 is plan views of the memory cell array and the column leak prevention circuit of the semiconductor memory device according to the present embodiment. FIGS. 39A and 39B are sectional views of the memory cell array and the column leak prevention circuit of the semiconductor memory device according to the present embodiment. FIG. 38 illustrates the layout of the memory cell transistors MT, the first transistors T1 and the second transistors T2. FIG. 39A is the sectional view along the line A-A' in FIG. 38. FIG. 39B is the sectional view along the line B-B' in FIG. 38. In FIGS. 39A and 39B, the first interconnection layer, the second interconnection layer and the conductor plugs are omitted to simplify the electric connection relationships.

The basic structure of the semiconductor memory device according to the present embodiment is substantially the identical as that of the semiconductor memory device according to the first embodiment. In the semiconductor memory device according to the present embodiment, in place of applying a prescribed voltage to the P-type well formed in the semiconductor substrate 22, a prescribed voltage is applied of the source lines SL to thereby make the source erase of erasing information of the memory cell transistors MT.

As illustrated in FIG. 36, in the semiconductor memory device according to the present embodiment, a source line voltage application circuit 196 for applying a voltage to the source lines SL is further provided in the periphery of the memory cell array 10.

The source lines SL of the memory cell array 10 illustrated in FIG. 37 are connected to the source line voltage application circuit 196, so that a prescribed voltage can be applied to an arbitrary source line SL by the source line voltage application circuit 196.

As illustrated in FIGS. 38 to 39B, in the P-type semiconductor substrate 22, no well is formed either in the region where the memory cell array 10 is formed or in the region where the column leak prevention circuit 18 is formed.

The memory cell transistors MT are formed on the P-type semiconductor substrate 22 with no well formed in. The first transistors T1 and the second transistors T2 as well are formed on the P-type semiconductor substrate 22 with no well formed in. As the first transistors T1 and the second transistors T2, transistors having a gate breakdown voltage which is an erase voltage or below which is a voltage difference between a positive voltage to be applied, in the erase operation, to the source lines SL and a negative voltage to be applied to the word line WL are used.

As described above, in the present embodiment, the region of the semiconductor substrate 22 where the memory cell array 10 is formed and the region of the semiconductor substrate 22 where the column leak prevention circuit 18 is formed are not electrically isolated from each other. In the present embodiment, both regions are not electrically isolated from each other for the following reason. That is, in the present embodiment, in the erase operation, a voltage is applied to the sources of the memory cell transistors MT not from the P-type well but from the source lines SL as will be described below. Accordingly, both regions of the semiconductor substrate 22 being not electrically isolated from each other causes no special problem.

Except that the source line voltage application circuit 196 described above is provided, the structure of the semiconductor memory device according to the present embodiment is that identical as that of the semiconductor memory device according to the first embodiment.

In the present embodiment, the memory cell transistors MT, and the first transistors T1 and the second transistors T2 may be formed in one and the identical P-type well or, as in the first embodiment, may be formed in P-type wells electrically isolated from each other.

(Method for driving the Semiconductor memory device)

Then, the method for driving the semiconductor memory device according to the present embodiment will be explained with reference to FIGS. 40 and 43. FIG. 40 is a view depicting the voltages of the respective parts in the method for driving the semiconductor memory device according to the present embodiment. In FIG. 40, the voltages in the parentheses are the voltages of non-selected lines.

(Method for reading the semiconductor memory device)

Figure 41:
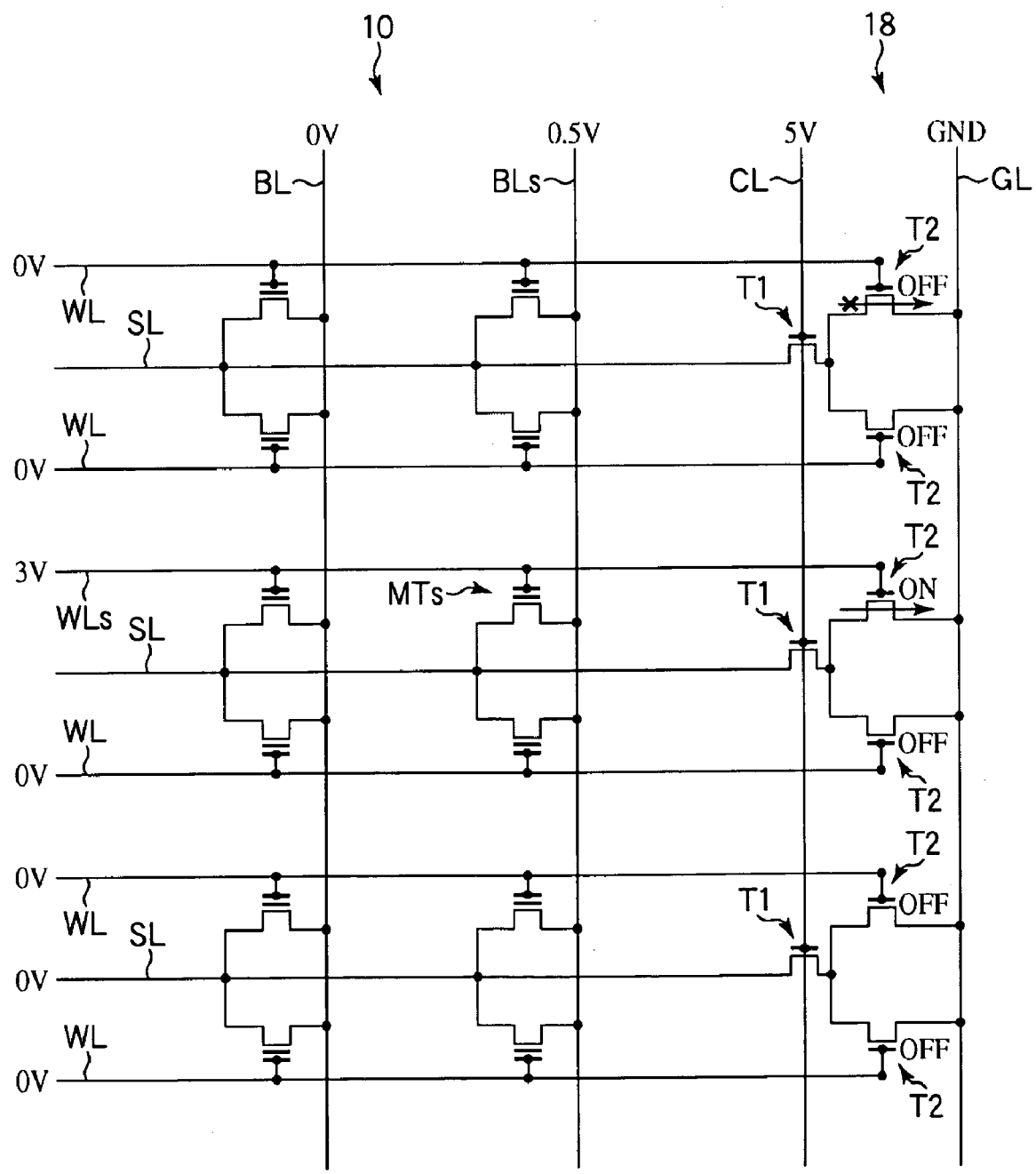
FIG. 41 is a circuit diagram illustrating the method for reading the semiconductor memory device according to the fourth embodiment.

First, the read method of the semiconductor memory device according to the present embodiment will be explained with reference to FIGS. 40 and 41. FIG. 41 is a circuit diagram illustrating the method for reading the semiconductor memory device according to the present embodiment.

When information stored in the memory cell transistors MT, voltages of the respective parts are set depicted as FIGS. 40 and 41.

To the control line CL, a positive voltage of, e.g., 5 V is constantly applied by the control circuit 20. Thus, the first transistors T1 are constantly on-state.

To all the source lines SL, 0 V is applied by the source line voltage application circuit 196.

Next, the address of a selected memory cell transistor MTs is decided.

The voltage of the bit lines BL and the word lines WL on standby state is 0 V. To the bit lines BL and the word lines WL on standby state, voltages are applied as follows.

First, to the selected bit line BLs, a positive voltage of, e.g., 0.5 V is applied by the bit line drive circuit 14. On the other hand, the voltage of the bit lines BL other than the selected bit line BLs remains 0 V.

Next, the selected bit line BLs is connected to the sense amplifier 16.

Next, to the selected word line WLs, a positive voltage of, e.g., 3 V is applied by the word line drive circuit 12. The application of the voltage to the selected word line WLs turns the second transistors T2 connected to the selected word line WLs from off-state to on-state. On the other hand, the voltage of the word lines WL other than the selected word line WLs remain 0 V. Accordingly, the second transistors T2 connected to the word lines WL other than the selected word line WLs remain off-state.

The source line SL connected to the selected memory cell transistor MTs is connected to the ground line GL because of the associated first transistors T1 and second transistor T2 being on-state. On the other hand, the soruce lines SL other than the source line SL the selected memory cell transistor MTs connected to is disconnected from the ground line GL because of the associated second transistor T2 being off-state. Thus, in the present embodiment, in the selected memory cell transistor MTs, in the erased state, current can flow from the selected bit line BLs to the source line SL. However, in the memory cell transistors MT other than the selected memory cell transistor MTs, even when the threshold voltage Vt has a value which can cause leak current, no current can flow from the bit line BL to the source line SL. Thus, according to the present embodiment, the column leak can be prevented.

Then, a current flowing in the selected bit line BLs is detected by the sense amplifier 16. Based on a value of the current detected by the sense amplifier 16, it is judged whether the selected memory cell transistor MTs is in the written state or the erased state. That is, when a current flows in the selected bit line BLs, it is judged that the selected memory cell transistor MTs is in the erased state. When no current flows in the selected bit line BLs, it is judged that the selected memory cell transistor Mts is in the written state. In the present embodiment, because the column leak is prevented, it can be correctly judged whether the selected memory cell transistor MTs is in the written state or the erased state.

(Method for writing the semiconductor memory device)

Figure 42:
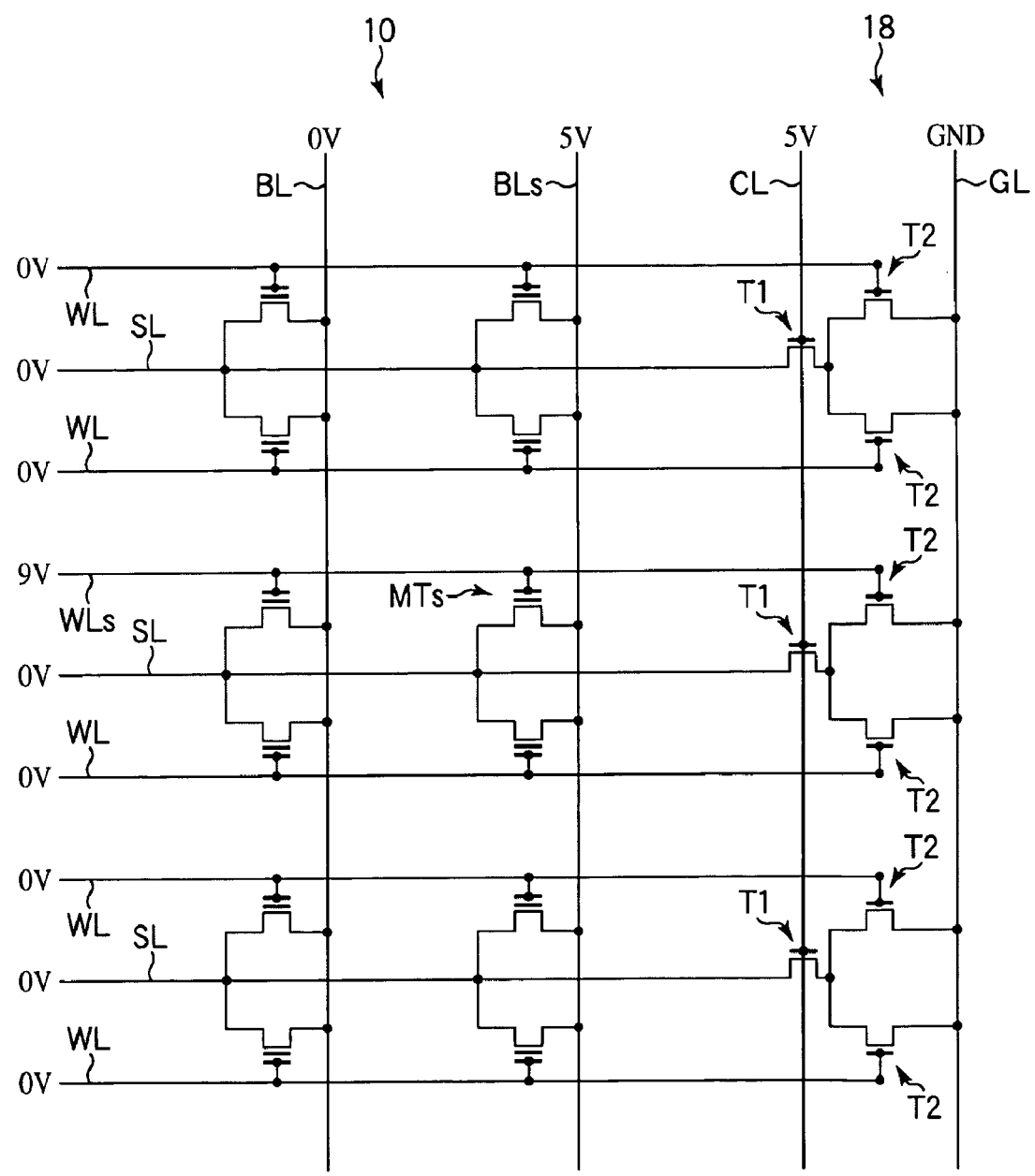
FIG. 42 is a circuit diagram illustrating the method for writing the semiconductor memory device according to the fourth embodiment.

Then, the method for writing the semiconductor memory device according to the present embodiment will be explained with reference to FIGS. 40 and 42. FIG. 42 is a circuit diagram illustrating the method for writing the semiconductor memory device according to the present embodiment.

When information is written in the memory cell transistors MT, voltages of the respective parts are set depicted as FIGS. 40 and 42.

To all the source lines SL, 0 V is applied by the source line voltage application circuit 196.

Then, the address of a selected memory cell transistor TMs is decided.

The voltages of the control line CL, the word lines WL and the bit lines BL on standby state are 0 V. To the control line CL, the bit lines BL and the word lines WL on standby state, the voltages are applied as follows.

To the control line CL, a positive voltage of, e.g., 5 V is applied by the control circuit 20. Thus, the first transistor T1 is turned on-state from off-state.

Next, to the selected bit line BLs, a positive voltage of, e.g., 5 V is applied by the bit line drive circuit 14. On the other hand, the voltage of the bit lines BL except the selected bit line BLs remains 0 V.

Then, to the selected word line WLs, a positive voltage of, e.g., 9 V is applied by the word line drive circuit 12. The application of the voltage to the selected word line WLs turn the second transistor T2 connected to the selected word line WLs on-state from off-state. On the other hand, the voltage of the word lines WL other than the selected word line WLs remains 0 V. Accordingly, the second transistors T2 connected to the word lines WL other than the selectted word line WLs remain off-state.

When the voltage of the respective parts are set as above, a current flows between the source diffused layer 44a and the drain diffused layer 44b of the selected memory cell transistor MTs, and a part of hot electrons generated, accompanying this are injected into the floating gate 38. The injection of a negative charge (electrons) into the floating gate 38 puts the threshold voltage Vt of the selected memory cell transistor MTs in the high state. Thus, the selected memory cell transistor MTs is put in the written state.

Thus, information is written in the selected memory cell transistor MTs. In the write operation as well as in the read operation described above, the source lines SL other than the source line SL connected to the selected memory cell transistor MTs are disconnected from the ground line GL because of the associated second transistors T2 being off-state. Thus, according to the present embodiment, the column leak can be prevented in the write operation as well, and erroneous write into the memory cell transistors MT can be prevented.

(Method for erasing the semiconductor memory device)

Next, the method for erasing the semiconductor memory device according to the present embodiment will be explained with reference to FIGS. 40 and 43. FIG. 43 is a circuit diagram illustrating the method for erasing the semiconductor memory device according to the present embodiment.

Figure 43:
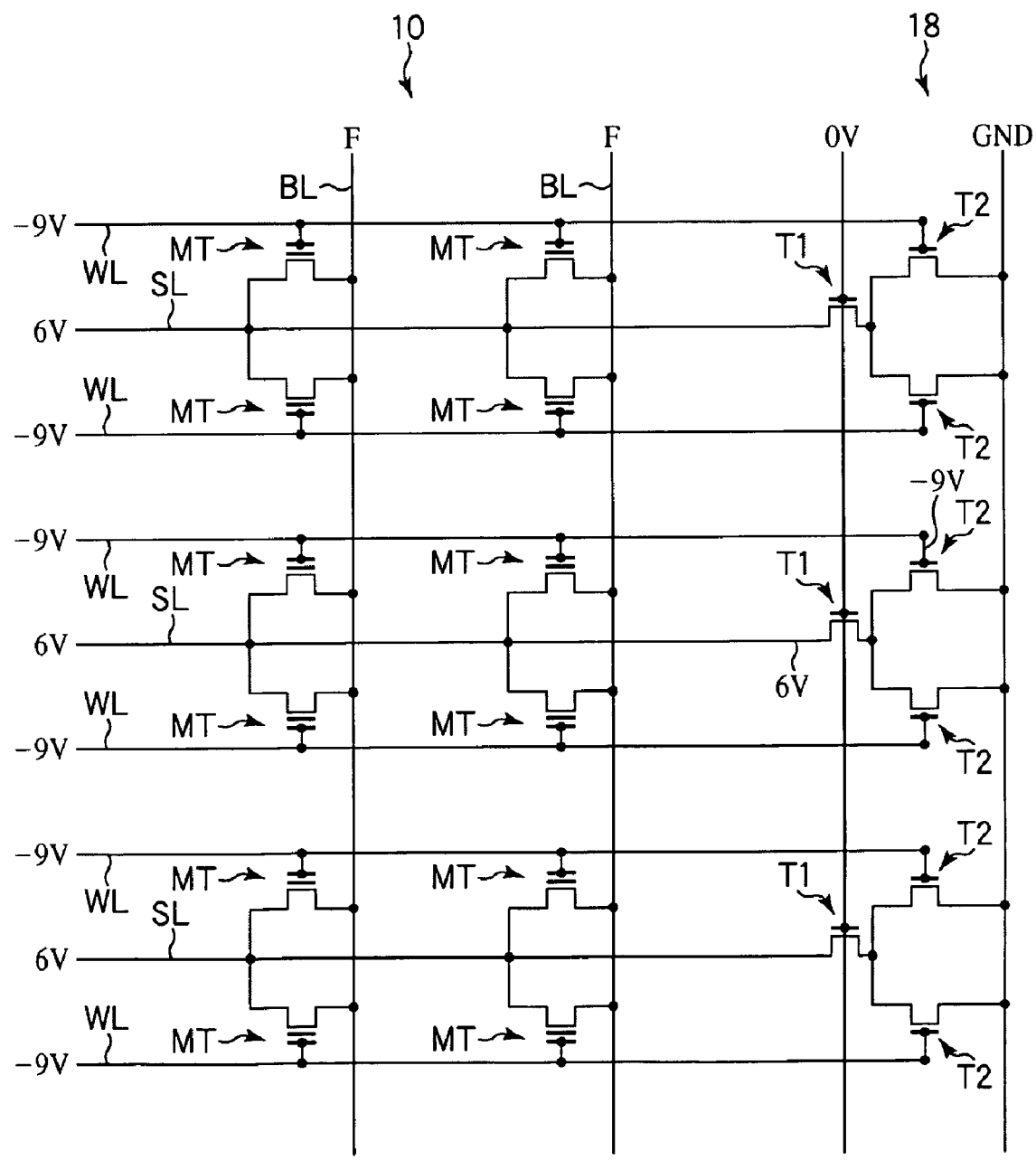
FIG. 43 is a circuit diagram illustrating the method for erasing the semiconductor memory device according to the fourth embodiment.

When information stored in the memory cell transistors MT is erased, the voltages of the respective parts are set depicted as FIGS. 40 and 43. In the present embodiment, the source erase of applying a prescribed voltage to the source lines SL to thereby erase information is made. The erase of information of the memory cell transistors MT is made in, e.g., the sector unit.

To the control line CL, 0 V is applied by the control circuit 20. Thus, the first transistors T1 are turned off-state.

All the bit lines BL in the sector to be erased are made floating (F) by the bit line drive circuit 14.

To all the word lines WL in the sector to be erased, a negative voltage of, e.g., −9 V is applied by the word line drive circuit 12.

To all the source lines SL in the sector to be erased, a positive voltage of, e.g., 6 V is applied.

When the voltages of the respective parts are set as above, a high voltage is applied to the tunnel insulation film 36 formed between the floating gates 38 and the semiconductor substrate 22, and electrons stored in the floating gates 38 are drawn out to the semiconductor substrate 22 due to the tunnel phenomenon. When the electrons stored in the floating gates 38 are drawn out, the threshold voltage Vt of the memory cell transistors MT is put in the low state. Thus, the memory cell transistors MT in the sector to be erased is put in the erased state.

Thus, the information stored in the memory cell transistors MT in the sector to be erased is erased.

When a 6 V positive voltage is applied to the source lines SL here, a 6 V positive voltage is applied also to the drain diffused layers 48b of the first transistors T1.

On the other hand, because a −9 V negative voltage is applied to the word lines WL, a −9 V negative voltage is applied to the gate electrodes 42c of the second transistors T2.

As described above, in the present embodiment, when information of the memory cell transistors MT is erased, the positive voltage of the source lines SL and the negative voltage of the word lines WL are separately applied respectively to the first transistors T1 and the second transistors T2. That is, both voltages are never applied concurrently to either of the first transistors T1 and the second transistors T2. Accordingly, in the present embodiment, as the first transistors T1 and the second transistors T2 for preventing the column leak, transistors whose gate insulation film is relatively thin and whose gate breakdown voltage is relatively low can be used. Specifically, in the present embodiment, as the first transistors T1 and the second transistors T2, transistors whose gate breakdown voltage is an erase voltage or below which is a voltage difference between a positive voltage applied to the source lines SL and a negative voltage applied to the word lines WL can be used.

[e] Fifth Embodiment

The method for driving the semiconductor memory device according to a fifth embodiment will be explained with reference to FIG. 44. FIG. 44 is a view illustrating the voltage of the respective parts of the semiconductor memory device in the method for driving the semiconductor memory device according to the present embodiment. In FIG. 34, the voltages in the parentheses are the voltages of the non-selected lines. The identical members of the present embodiment as those of the semiconductor memory device, etc. according to the first to the fourth embodiments illustrated in FIGS. 1 to 43 are represented by the identical reference numbers not to repeat or to simplify their explanation.

The structure of the semiconductor memory device according to the present embodiment is the identical as the structure of the semiconductor memory device according to the fourth embodiment described above with reference to FIGS. 36 to 39B.

In the method for driving the semiconductor memory device according to the present embodiment, in the read operation, a positive voltage of, e.g., 0.5 V is constantly applied to all the bit lines BL by the bit line drive circuit 14, and on standby state, the voltage of all the bit lines BL is set at, e.g., 0.5 V.

The method for reading the semiconductor memory device according to the present embodiment will be explained with reference to FIG. 44.

When information stored in the memory cell transistors MT, the voltages of the respective parts are set depicted as FIG. 44.

To the control line CL, a positive voltage of, e.g., 5 V is constantly applied by the control circuit 20, whereby the first transistors T1 are constantly on-state.

To all the source lines SL, 0 V is applied by the source line voltage application circuit 196.

Next, the address of a selected memory cell transistor MTs is decided.

The voltage of the word lines WL on standby state is 0 V. On the other hand, to all the bit lines BL, a positive voltage of, e.g., 0.5 V is constantly applied by the bit line drive circuit 14. Accordingly, the voltage of all the bit lines BL is, e.g., 0.5 V even on standby state.

As described above, in the present embodiment, the voltage of the bit lines BL on standby state is the voltage necessary for the read. Thus, according to the present embodiment, the time from deciding of the address of the selected memory cell transistor MTs to raising the voltage of the bit line BL can be saved, and the read speed can be increased.

Next, the bit line BL connected to the selected memory cell transistor MTs is connected to the sense amplifier 16.

Next, to the selected word line WLs, a positive voltage of, e.g., 3 V is applied by the word line drive circuit 12. The application of the voltage to the selected word line WLs turns the second transistor T2 connected to the selected word line WLs from off-state to on-state. On the other hand, the voltage of the word lines WL other than the selected word line WLs remain 0 V. Accordingly the second transistors T2 connected to the word lines WL other than the selected word line WLs remain off-state. Accordingly, in the present embodiment as well as in the fourth embodiment, the column leak can be prevented.

Next, a current flowing the bit line BL connected to the selected memory cell transistor MTs is detected by the sense amplifier 16, and in the identical way as in the fourth embodiment, the information stored in the selected memory cell transistor MTs is read.

As in the present embodiment, it is possible to apply a voltage necessary for the read to all the bit lines BL constantly to thereby set the voltage of the bit lines BL on standby state at a voltage necessary for the read. Thus, the time from deciding the address of the selected memory cell transistor MTs to raising the voltage of the bit line BL can be saved, and the read speed can be increased.

The method for writing and erasing the semiconductor memory device according to the present embodiment are the identical as the method for writing and erasing the semiconductor memory device according to the fourth embodiment.

[f] Sixth Embodiment

Figure 45:
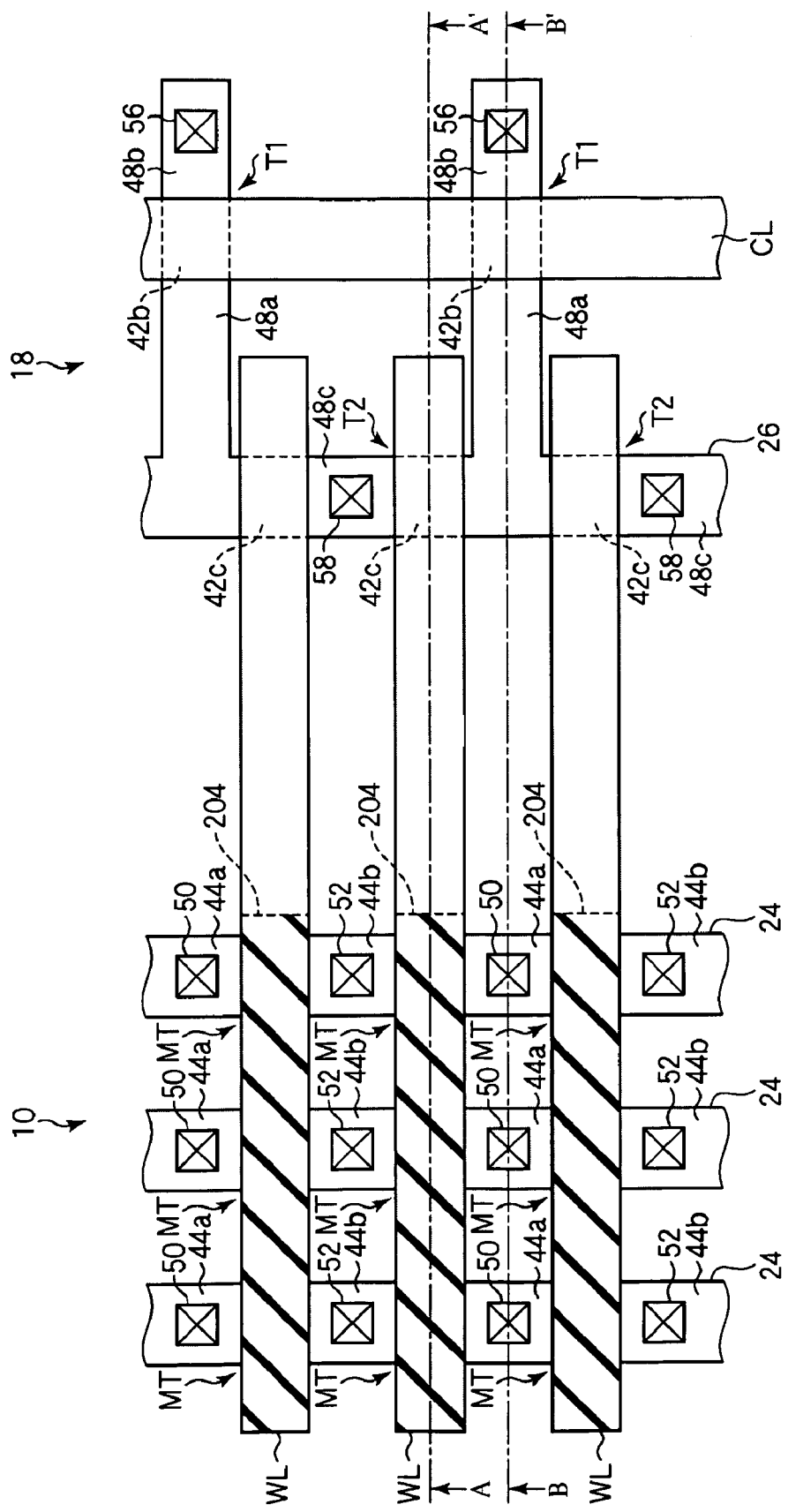
FIG. 45 is a plan view of the memory cell array and the column leak prevention circuit of the semiconductor memory device according to a sixth embodiment.

The semiconductor memory device according to a sixth embodiment will be explained with reference to FIGS. 45 to 46B. FIG. 45 is a plan view of the memory cell array and the column leak prevention circuit of the semiconductor memory device according to the present embodiment. FIGS. 46A and 46B are sectional views of the memory cell array and the column leak prevention circuit of the semiconductor memory device according to the present embodiment. FIG. 46A is the sectional view along the A-A' line in FIG. 45. FIG. 46B is the sectional view along the B-B' line in FIG. 45. The identical members of the present embodiment as those of the semiconductor memory device according to the first to the fifth embodiments illustrated in FIGS. 1 to 44 are represented by the identical reference numbers not to repeat or to simplify the explanation.

The semiconductor memory device according to the present embodiment comprises memory cell transistors MT using ONO film as the charge storage layer.

As illustrated in FIGS. 46A and 46B, on a semiconductor substrate 22, ONO film 204 of the silicon oxide film/silicon nitride film/silicon oxide film structure of a silicon oxide film 198, a silicon nitride film 200 and a silicon oxide film 202 sequentially stacked is formed. The ONO film 204 functions as the charge storage layers of the memory cell transistors MT. In place of the ONO film 204, the insulation film of the layer film of, e.g., silicon oxide film/alumina film/silicon oxide film structure, etc. may be used as the charge storage layers.

On the ONO film 204, control gates 42a are formed. The control gates 42a of a plurality of memory cell transistors MT present in the identical row are commonly connected. That is, on the ONO film 204, word lines WL commonly connected the control gate 42a are formed.

In the semiconductor substrate 22 on both sides of the control gates 42a, N-type impurity diffused layers 44a, 44b are formed. The impurity diffused layers 44a are the source diffused layers of the memory cell transistors MT. The impurity diffused layers 44b are the drain diffused layers of the memory cell transistors MT.

Thus, on the semiconductor substrate 22, N-type memory cell transistors MT each including the ONO film 204 as the charge storage layer, the control gate 42a and the source/drain diffused layers 44a, 44b are formed.

The word lines WL (control gates 42a) are formed of one and the identical conduction film integral with the gate electrodes 42c of the second transistors T2.

As in the present embodiment, the memory cell transistors MT including the ONO film 204 as the charge storage layer may be used in place of the memory cell transistors MT including the floating gates 38 as the charge storage layer.

The structure of the memory cell transistors MT of the semiconductor memory device according to the present embodiment except the memory cell transistors MT is substantially the identical as the structure of the semiconductor memory device according to any one of the first to the fifth embodiments described above. In the present embodiment, however, because the word lines WL and the gate electrodes 42c of the second transistors T2 are formed integral, it is not necessary to form the conductor plugs and the upper interconnections for connecting the word lines WL and gate electrodes 42c of the second transistors T2.

The method for driving the semiconductor memory device according to the present embodiment is the identical as the method for driving the semiconductor memory device according to any one of the first to the fifth embodiments described above.

[Modified Embodiments]

The present embodiment is not limited to the above-described embodiments and can cover other various modifications.

For example, in the above-described embodiments, the semiconductor memory device including N-channel memory cell transistors is described. The present invention is applicable also to semiconductor memory devices including P-channel memory cell transistors. In this case, the conduction types of the wells and the polarities of the applied voltages are respectively inversed.

In the above-described embodiments, as the first transistors T1 and the second transistors T2, N-type transistors are used, but P-type transistors may be used as the first transistors T1 and the second transistors T2. In this case, the conduction types of the wells and the polarities of the applied voltages are respectively inversed.

In the above-described embodiments, a plurality of memory cell transistors MT present in a couple of adjacent rows in the memory cell array 10 are commonly connected by the associated source line SL. However, a couple of adjacent rows in the memory cell array 10 may not have one source line SL in common. It is possible that row-wise extended source lines SL are provided, associated with the respective rows in the memory cell array 10, and the sources of a plurality of memory cell transistors MT present in the respective rows are commonly connected by the associated source lines SL.

In the above-described embodiments, the applied voltages necessary to drive the semiconductor memory device have the specific values. However, the applied voltages are not limited to the values described in the above-embodiments. The applied voltages necessary to drive the semiconductor memory device are set suitably depending on structures, generations, etc. of the semiconductor memory device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor memory device comprising:
a plurality of memory cell transistors arranged in a matrix;
a plurality of bit lines coupled to a bit line drive circuit controlling a first potential of the plurality of bit lines, the plurality of bit lines include:
(i) a bit line coupling to drains of a first set of the plurality of memory cell transistors arranged in a first column and (ii) a second bit line coupling to drains of a second set of the plurality of memory cell transistors arranged in a second column;
a plurality of word lines coupled to a word line driver circuit controlling a second potential of the plurality of word lines, the plurality of word lines include:
(i) a first word line coupling to gate electrodes of a first set of the plurality of memory cell transistors arranged in a first row and (ii) a second word line coupling to gate electrodes of a second set of the plurality of memory cell transistors arranged in a second row;
a plurality of source lines include: a source line coupling to sources of the plurality of memory cell transistors arranged in the first and second rows;
a first transistor having a drain coupled to at least one of the plurality of source lines;
a second transistor having a drain coupled to a source of the first transistor, and a source coupled to a third potential.

2. The semiconductor memory device according to claim 1, further comprising
a control circuit for controlling at least one of the plural first or second transistors.

3. The semiconductor memory device according to claim 1, wherein
the memory cell transistors are formed in a first well formed in a semiconductor substrate,
the first and second transistors are formed in a second well formed in the semiconductor substrate, and
the first well and the second well are electrically isolated from each other.

4. The semiconductor memory device according to claim 1, wherein the memory cell transistors are formed in a well formed in a semiconductor substrate, the first and second transistors are formed in the semiconductor substrate.

5. The semiconductor memory device according to claim 1, wherein the first and second transistors have a gate breakdown voltage which is less than or equal to an erase voltage to be applied to the memory cell transistors when information stored in the memory cell transistors is erased.

6. A semiconductor memory device comprising:
a plurality of memory cell transistors arranged in a matrix;
a plurality of bit lines coupled to a bit line drive circuit controlling a first potential of the plurality of bit lines, the plurality of bit lines include:

(i) a bit line coupling to drains of a first set of the plurality of memory cell transistors arranged in a first column and (ii) a second bit line coupling to drains of a second set of the plurality of memory cell transistors arranged in a second column;

a plurality of word lines coupled to a word line driver circuit controlling a second potential of the plurality of word lines, the plurality of word lines include:

(i) a first word line coupling to gate electrodes of a first set of the plurality of memory cell transistors arranged in a first row and (ii) a second word line coupling to gate electrodes of a second set of the plurality of memory cell transistors arranged in a second row;

a plurality of source lines include: a source line coupling to sources of the plurality of memory cell transistors arranged in the first and second rows;

a first transistor having a drain coupling to at least one of the plurality of source lines;

a second transistor having a drain coupling to a source of the first transistor and a source coupled to a third potential; and a power circuit controlling another potential of the plurality of source lines.

7. The semiconductor memory device according to claim 6, further comprising
a control circuit for controlling at least one of the plural first or second transistors.

8. The semiconductor memory device according to claim 6, wherein
the memory cell transistors, the first and second transistors are formed in a semiconductor substrate.

9. A semiconductor memory device comprising:
a plurality of memory cell transistors arranged in a matrix;
a plurality of bit lines coupled to a bit line drive circuit controlling a first potential of the plurality of bit lines, the plurality of bit lines include:

(i) a bit line coupling to drains of a first set of the plurality of memory cell transistors arranged in a first column and (ii) a second bit line coupling to drains of a second set of the plurality of memory cell transistors arranged in a second column;

a plurality of word lines coupled to a word line driver circuit controlling a second potential of the plurality of word lines, the plurality of word lines include:

(i) a first word line coupling to gate electrodes of a first set of the plurality of memory cell transistors arranged in a first row and (ii) a second word line coupling to gate electrodes of a second set of the plurality of memory cell transistors arranged in a second row;

a plurality of source lines include: a source line coupling to sources of the plurality of memory cell transistors arranged in the first and second rows;

a transistor having a drain coupling to at least one of the plurality of source lines and a source coupled to a third potential; and a control line coupling to at least one of gates of the plural transistors.

10. The semiconductor memory device according to claim 9, further comprising
a control circuit for controlling at least one of the plural transistors, coupled to the control line.

11. The semiconductor memory device according to claim 9, wherein
the memory cell transistors are formed in a first well formed in a semiconductor substrate,
the transistors, coupled to the control line, are formed in a second well formed in the semiconductor substrate, and
the first well and the second well are electrically isolated from each other.

12. The semiconductor memory device according to claim 9, wherein
the memory cell transistors are formed in a well formed in a semiconductor substrate, and
the transistors, coupled to the control line, are formed in the semiconductor substrate.

13. The semiconductor memory device according to claim 9, wherein
the transistors coupled to the control line have a gate breakdown voltage which is less than or equal to an erase voltage to be applied to the memory cell transistors when information stored in the memory cell transistors is erased.

14. A semiconductor memory device comprising:
a plurality of memory cell transistors arranged in a matrix;
a plurality of bit lines coupled to a bit line drive circuit controlling a first potential of the plurality of bit lines, the plurality of bit lines include:

(i) a bit line coupling to drains of a first set of the plurality of memory cell transistors arranged in a first column and (ii) a second bit line coupling to drains of a second set of the plurality of memory cell transistors arranged in a second column;

a plurality of word lines coupled to a word line driver circuit controlling a second potential of the plurality of word lines, the plurality of word lines include:

(i) a first word line coupling to gate electrodes of a first set of the plurality of memory cell transistors arranged in a first row and (ii) a second word line coupling to gate electrodes of a second set of the plurality of memory cell transistors arranged in a second row;

a plurality of source lines include: a source line coupling to sources of the plurality of memory cell transistors arranged in the first and second rows;

a transistor having a drain coupling to at least one of the plurality of source lines and a source coupled to a third potential;

a control line coupling to at least one of gates of the plural transistors; and a power circuit controlling another potential of the plurality of source lines.

15. The semiconductor memory device according to claim 14, further comprising
a control circuit for controlling at least one of the plural transistors, coupled to the control line.

16. The semiconductor memory device according to claim 14, wherein
the memory cell transistors, the transistors, coupled to the control line, are formed in a semiconductor substrate.

* * * * *